(12) United States Patent
Roberts et al.

(10) Patent No.: US 7,342,707 B2
(45) Date of Patent: *Mar. 11, 2008

(54) INDICATORS AND ILLUMINATORS USING A SEMICONDUCTOR RADIATION EMITTER PACKAGE

(75) Inventors: John K Roberts, East Grand Rapids, MI (US); Frederick T Bauer, Holland, MI (US); Joseph S Stam, Holland, MI (US); Timothy A Bonardi, Buchanan, MI (US); William L Tonar, Holland, MI (US); Robert R Turnbull, Holland, MI (US)

(73) Assignee: Gentex Corporation, Zeeland, MI (US)

( * ) Notice: Subject to any disclaimer, the term of this patent is extended or adjusted under 35 U.S.C. 154(b) by 803 days.

This patent is subject to a terminal disclaimer.

(21) Appl. No.: 10/228,525

(22) Filed: Aug. 27, 2002

(65) Prior Publication Data

US 2003/0002179 A1   Jan. 2, 2003

Related U.S. Application Data

(63) Continuation of application No. 09/425,792, filed on Oct. 22, 1999, now Pat. No. 6,441,943, and a continuation-in-part of application No. 09/175,984, filed on Oct. 20, 1998, now Pat. No. 6,111,683, which is a continuation-in-part of application No. 08/831,808, filed on Apr. 2, 1997, now Pat. No. 5,825,527, and a continuation-in-part of application No. 09/311,955, filed on May 14, 1999, now Pat. No. 6,356,376, which is a continuation-in-part of application No. 09/206,788, filed on Dec. 7, 1998, now Pat. No. 6,166,848, which is a continuation-in-part of application No. 09/197,400, filed on Nov. 20, 1998, now Pat. No. 6,111,684, which is a continuation-in-part of application No. 09/114,386, filed on Jul. 13, 1998, now Pat. No. 6,064,508, which is a continuation-in-part of application No. 08/832,587, filed on Apr. 2, 1997, now Pat. No. 5,818,625.

(60) Provisional application No. 60/124,493, filed on Mar. 15, 1999.

(51) Int. Cl.
G02F 1/153     (2006.01)
G02B 5/12      (2006.01)
G02B 5/124     (2006.01)
B60Q 1/26      (2006.01)

(52) U.S. Cl. .................. 359/267; 359/515; 359/533; 362/503; 362/494

(58) Field of Classification Search .............. 359/267, 359/515, 533, 537, 548, 838, 841, 843, 846; 362/503, 494, 498, 488, 499
See application file for complete search history.

(56) References Cited

U.S. PATENT DOCUMENTS 3,744,892 A * 7/1973 Shipsey ...................... 353/63

(Continued)

FOREIGN PATENT DOCUMENTS

| CA | 2028461 | | 11/1994 |
|---|---|---|---|
| GB | 2 073 483 A | * | 3/1980 |
| WO | 0030893 | | 6/2000 |

OTHER PUBLICATIONS

"Reliability Considerations for Super Flux LEDs," Application Note 1149-6, Hewlett Packard, Sep. 1998.

(Continued)

*Primary Examiner*—Ricky L. Mack
*Assistant Examiner*—Brandi Thomas
(74) *Attorney, Agent, or Firm*—Price, Heneveld, Cooper, DeWitt & Litton, LLP; James E. Shultz, Jr.

(57) ABSTRACT

A vehicle lamp assembly includes a housing and an LED lamp carried in the housing. A signal mirror includes a mirror and an LED lamp. The LED lamp includes a heat extraction member.

53 Claims, 25 Drawing Sheets

U.S. PATENT DOCUMENTS

| | | | |
|---|---|---|---|
| 3,789,209 A * | 1/1974 | Weber et al. | 362/253 |
| 4,267,559 A | 5/1981 | Johnson et al. | 257/99 |
| 4,394,600 A | 7/1983 | Flannagan | 313/500 |
| 4,729,076 A | 3/1988 | Masami et al. | 362/235 |
| 4,733,335 A * | 3/1988 | Serizawa et al. | 362/503 |
| 4,741,598 A | 5/1988 | Goedert | 359/522 |
| 4,821,019 A | 4/1989 | Taylor | |
| 4,911,519 A | 3/1990 | Burton et al. | 385/14 |
| 4,931,768 A | 6/1990 | Jincks et al. | 340/473 |
| 5,014,167 A | 5/1991 | Roberts | 362/494 |
| 5,032,898 A | 7/1991 | Bowen et al. | 257/433 |
| 5,038,255 A * | 8/1991 | Nishihashi et al. | 362/547 |
| 5,060,027 A | 10/1991 | Hart et al. | 257/88 |
| 5,113,232 A | 5/1992 | Itoh et al. | 257/91 |
| 5,173,839 A | 12/1992 | Metz, Jr. | 361/706 |
| 5,207,492 A | 5/1993 | Roberts | 362/30 |
| 5,235,347 A | 8/1993 | Lee | 347/238 |
| 5,291,039 A | 3/1994 | Ogata et al. | 257/99 |
| 5,303,130 A | 4/1994 | Wei et al. | 362/494 |
| 5,313,335 A | 5/1994 | Gray et al. | 359/839 |
| 5,355,284 A | 10/1994 | Roberts | 362/30 |
| 5,361,190 A * | 11/1994 | Roberts et al. | 362/464 |
| 5,434,750 A | 7/1995 | Rostoker et al. | 361/784 |
| D363,920 S | 11/1995 | Roberts et al. | D13/182 |
| 5,481,409 A | 1/1996 | Roberts | 359/839 |
| 5,490,049 A | 2/1996 | Montalan et al. | 362/240 |
| 5,497,306 A * | 3/1996 | Pastrick | 362/494 |
| 5,528,422 A | 6/1996 | Roberts | 359/583 |
| 5,528,474 A | 6/1996 | Roney et al. | 362/545 |
| 5,587,699 A | 12/1996 | Faloon et al. | 340/475 |
| 5,619,374 A | 4/1997 | Roberts | 359/584 |
| 5,619,375 A | 4/1997 | Roberts | 359/584 |
| 5,629,232 A | 5/1997 | Jiang | 438/40 |
| 5,632,551 A * | 5/1997 | Roney et al. | 362/485 |
| 5,656,823 A | 8/1997 | Kruangam | 257/59 |
| 5,660,461 A | 8/1997 | Ignatius et al. | |
| D394,833 S | 6/1998 | Muth | D12/187 |
| 5,774,283 A * | 6/1998 | Nagel et al. | 359/838 |
| 5,777,433 A | 7/1998 | Lester et al. | 313/512 |
| 5,785,418 A | 7/1998 | Hochstein | 362/373 |
| 5,788,357 A | 8/1998 | Muth et al. | 362/494 |
| 5,789,772 A | 8/1998 | Jiang | 257/96 |
| 5,818,625 A | 10/1998 | Forgette et al. | 359/267 |
| 5,823,654 A | 10/1998 | Pastrick et al. | 362/494 |
| 5,825,527 A | 10/1998 | Forgette et al. | 359/267 |
| 5,841,177 A | 11/1998 | Komoto et al. | 257/431 |
| 5,857,767 A | 1/1999 | Hochstein | |
| 5,863,116 A | 1/1999 | Pastrick et al. | 362/494 |
| 5,869,883 A | 2/1999 | Mehringer et al. | 257/667 |
| 5,870,215 A * | 2/1999 | Milano et al. | 398/108 |
| 5,879,074 A | 3/1999 | Pastrick | 362/494 |
| 5,885,475 A | 3/1999 | Salyer | 252/70 |
| D409,540 S | 5/1999 | Muth | D12/187 |
| 5,940,683 A | 8/1999 | Holm et al. | 438/23 |
| 5,945,217 A | 8/1999 | Hanrahan | 220/62.13 |
| 5,958,100 A | 9/1999 | Farnworth et al. | 65/47 |
| 5,959,316 A | 9/1999 | Lowery | 257/98 |
| 5,959,367 A | 9/1999 | O'Farrell et al. | 307/10.1 |
| 5,984,496 A | 11/1999 | Malcomson | |
| 6,005,724 A | 12/1999 | Todd | 359/884 |
| 6,007,222 A | 12/1999 | Thau | 362/494 |
| 6,045,243 A | 4/2000 | Muth et al. | 362/494 |
| 6,046,837 A | 4/2000 | Yamamoto | 359/245 |
| 6,049,271 A | 4/2000 | Chu | 340/463 |
| D425,466 S | 5/2000 | Todd et al. | D12/188 |
| D426,506 S | 6/2000 | Todd et al. | D12/188 |
| D426,507 S | 6/2000 | Todd et al. | D12/188 |
| D427,128 S | 6/2000 | Mathieu | D12/189 |
| 6,076,948 A | 6/2000 | Bukosky et al. | 355/41 |
| D428,372 S | 7/2000 | Todd et al. | D12/188 |
| D428,373 S | 7/2000 | Todd et al. | D12/188 |
| 6,086,229 A | 7/2000 | Pastrick | 362/494 |
| 6,093,976 A | 7/2000 | Kramer et al. | 307/10.1 |
| D428,842 S | 8/2000 | Todd et al. | D12/188 |
| D429,202 S | 8/2000 | Todd et al. | D12/189 |
| D430,088 S | 8/2000 | Todd et al. | D12/188 |
| 6,111,684 A | 8/2000 | Forgette et al. | 359/267 |
| 6,119,031 A | 9/2000 | Crowley | 600/407 |
| 6,142,656 A | 11/2000 | Kurth | 362/494 |
| 6,152,590 A | 11/2000 | Fürst et al. | 362/545 |
| 6,163,083 A | 12/2000 | Kramer et al. | 307/10.1 |
| 6,166,848 A | 12/2000 | Cammenga et al. | 359/267 |
| 6,175,164 B1 | 1/2001 | O'Farrell et al. | 307/10.1 |
| 6,176,602 B1 | 1/2001 | Pastrick et al. | 362/494 |
| 6,441,943 B1 * | 8/2002 | Roberts et al. | 359/267 |
| 6,494,602 B2 * | 12/2002 | Pastrick et al. | 362/494 |
| 6,550,949 B1 * | 4/2003 | Bauer et al. | 362/545 |
| 6,611,610 B1 * | 8/2003 | Stam et al. | 382/104 |
| 6,645,758 B1 * | 11/2003 | Schnipelsky et al. | 435/287.2 |
| 2003/0138132 A1 * | 7/2003 | Stam et al. | 382/104 |

OTHER PUBLICATIONS

"LED Solid State Reliability," Application Note 1017, Hewlett Packard, Oct. 1982.

"SnapLED 150 LEDs," Technical Data, Hewlett Packard, Jul. 1999.

"Advantage of SnapLED 150 LED Product, Compared to Other Lighting Technologies in Automotive Signal Lamps," Application Note 1176, Hewlett Packard, Jul. 1999.

CREE Research, Inc., Spec. Sheet, "G-SiC® Technology Super Bright LEDs CXXX-CB290-E1000," revised May 1999, pp. 1-4.

Opto Technology, Inc., "New Products—High Output Blue, Green, and Red LED Illuminators," www.optotech.com website, Copyright 1998.

Opto Technology, Inc. Spec. Sheet, "High Power Red Illuminator," OTL680A-9-4-66-E, revised Jun. 1998.

Opto Technology, Inc. Spec. Sheet, "High Power White Illuminator-Preliminary," OTLWHTA-9-4-66E, revised Aug. 1999.

Opto Technology, Inc. Spec. Sheet, "Very High Power IR Illuminator," OTL880B-9-4-66E, revised May 1998.

DIEMAT Product Data Sheet, "DM6030HK Ag EPOXY Adhesive Paste," May 11, 1999.

Roberts, John K. (Gentex Corporation), "Binary Complementary Synthetic-White LED Illuminators," SAE Technical Paper Series, International Congress and Exposition, Detroit, Michigan Mar. 1-4, 1999, pp. 1-17.

Hewlett Packard, Inc., "LED Stop Lamps Help the Number and Severity of Automotive Accidents," Application Note 1155-3, Copyright 1998.

Hewlett Packard, Inc., Differences Between the SnapLED 150 and Super Flux/Snap LED Products, Application Note 1177, Copyright 1999.

Hewlett Packard, Inc., "High-Flux LED," Technical Data, Copyright 1999.

Hewlett Packard, Inc., "SnapLED 70 LEDs," Preliminary Technical Data, Copyright 1999.

Hewlett Packard, Inc., "Super Flux LEDs," Technical Data, Copyright 1998.

Hewlett Packard, Inc., "Using Super Flux LEDs in Automotive Signal Lamps," Application Note 1149-1, 1999.

Advanced Thermoelectric Products, www.electracool.com/moduleworking.htm website—"The Basics," 1999.

* cited by examiner

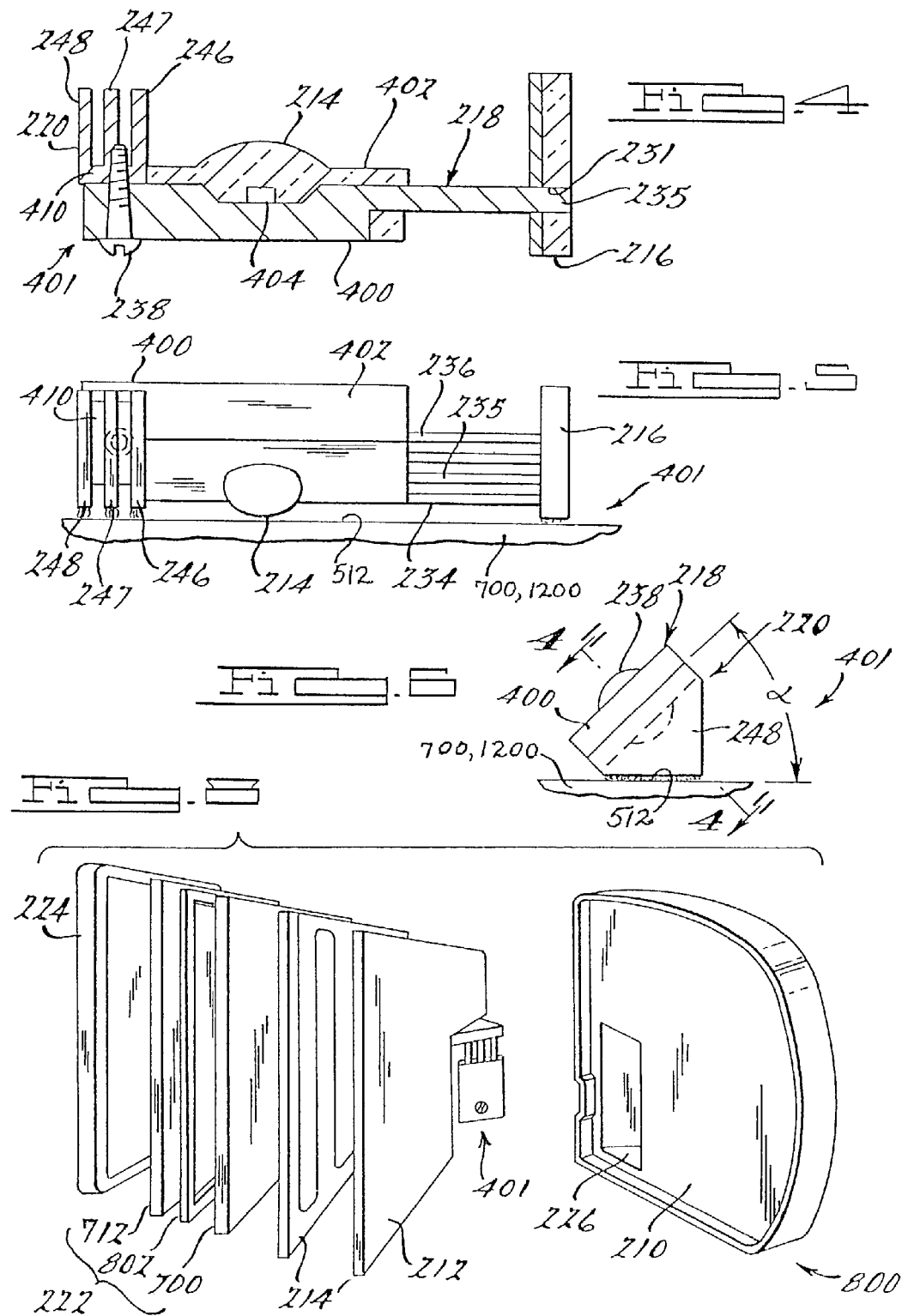

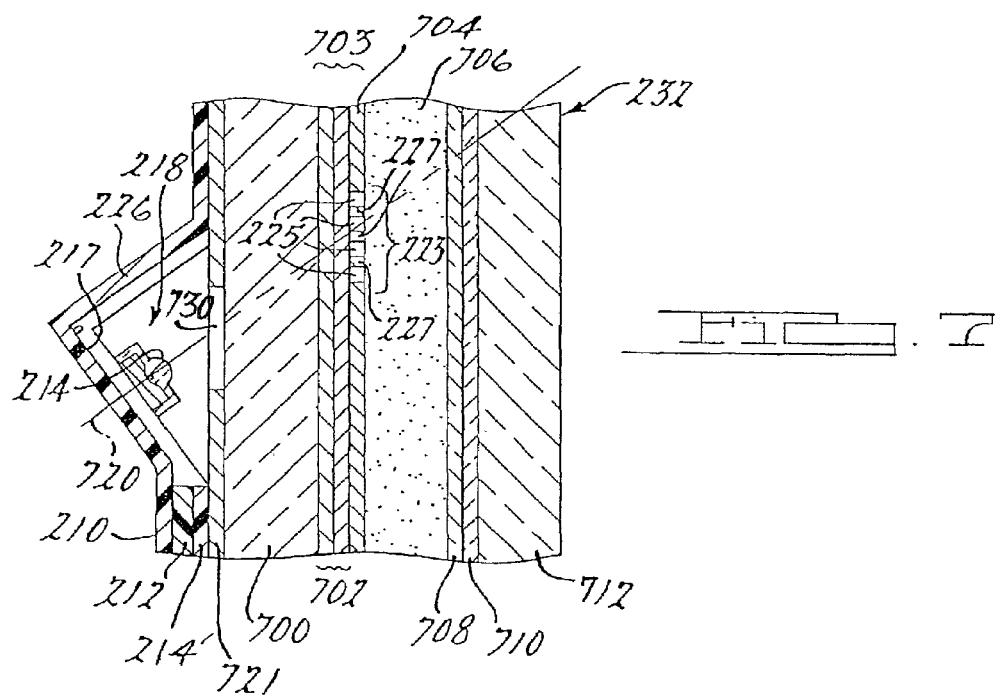
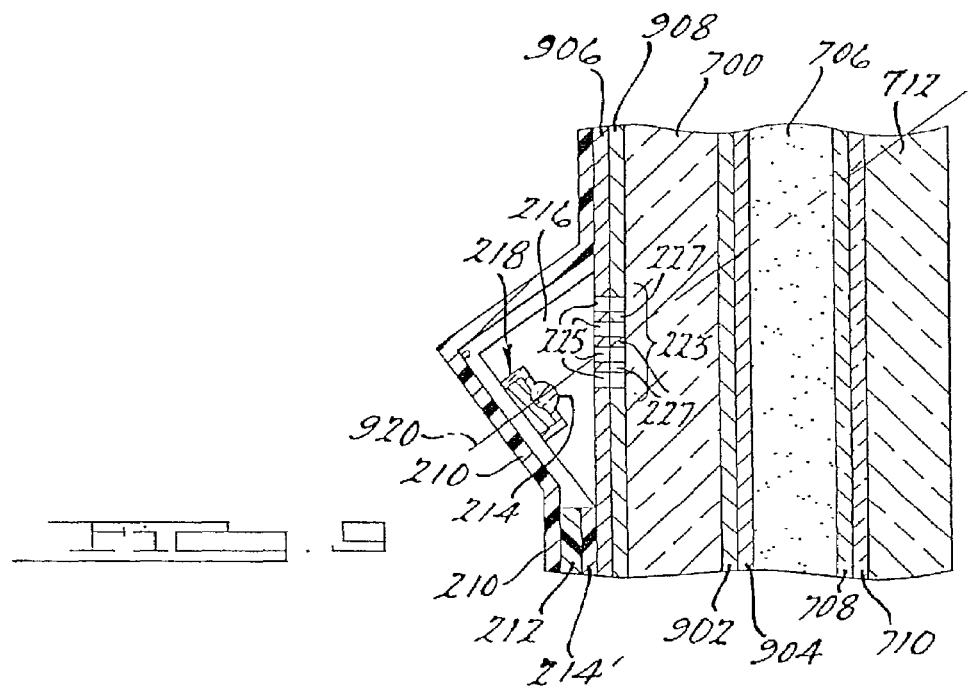

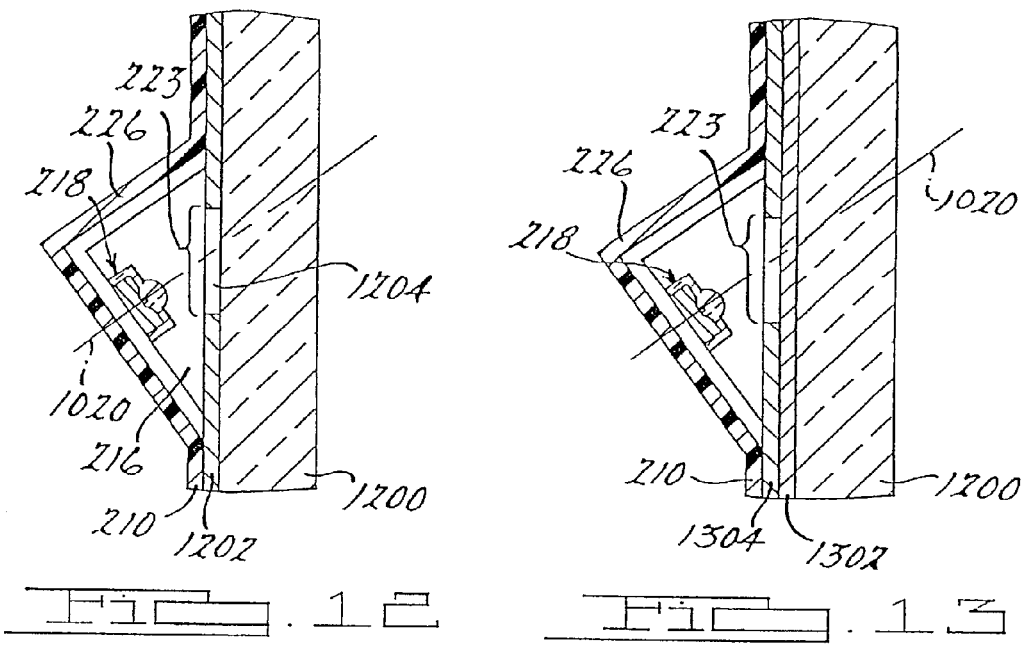
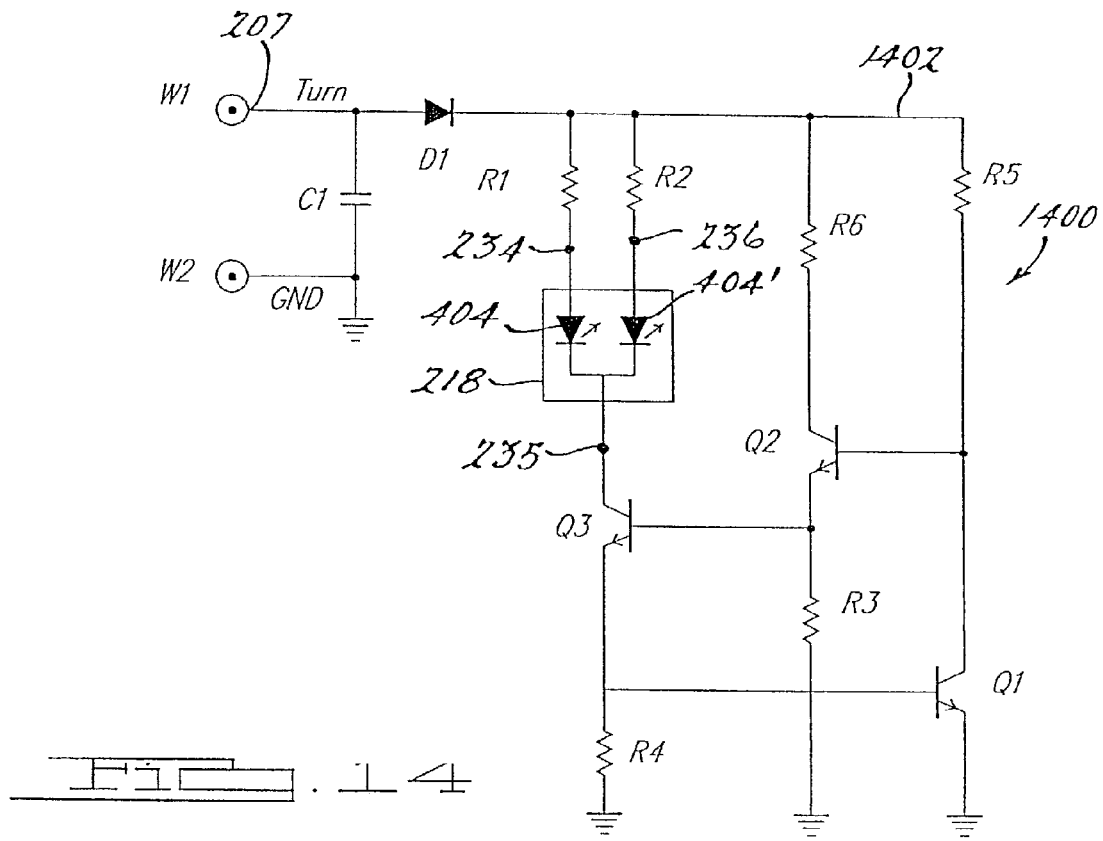

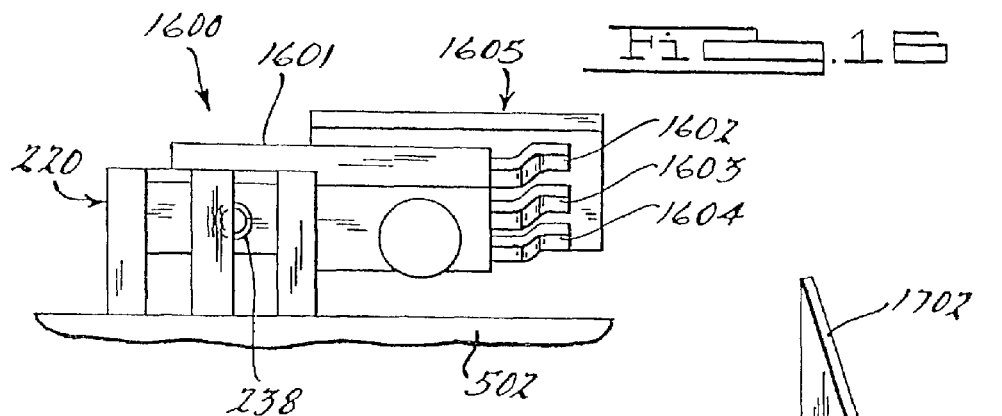
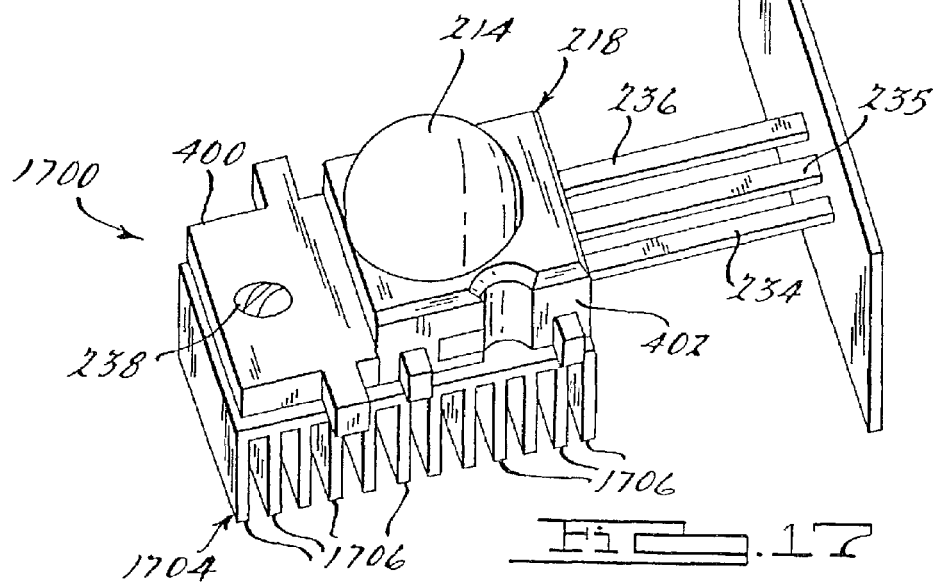
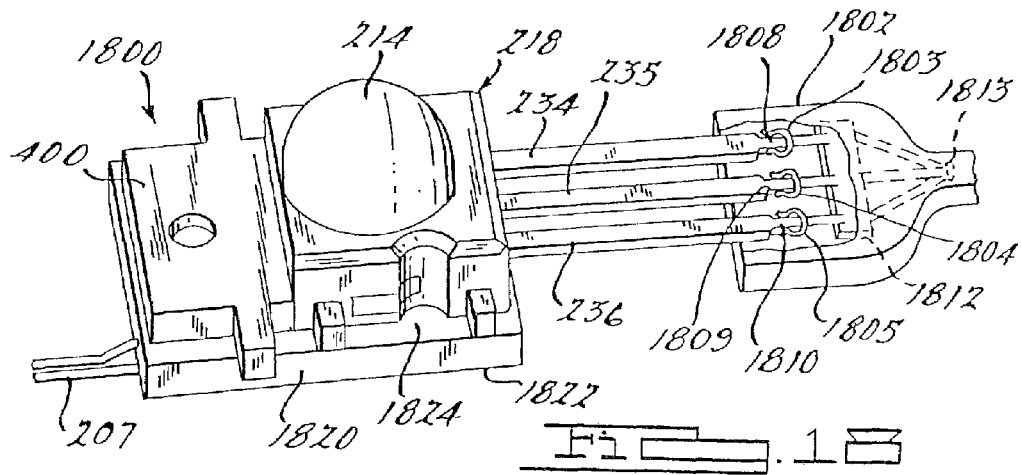

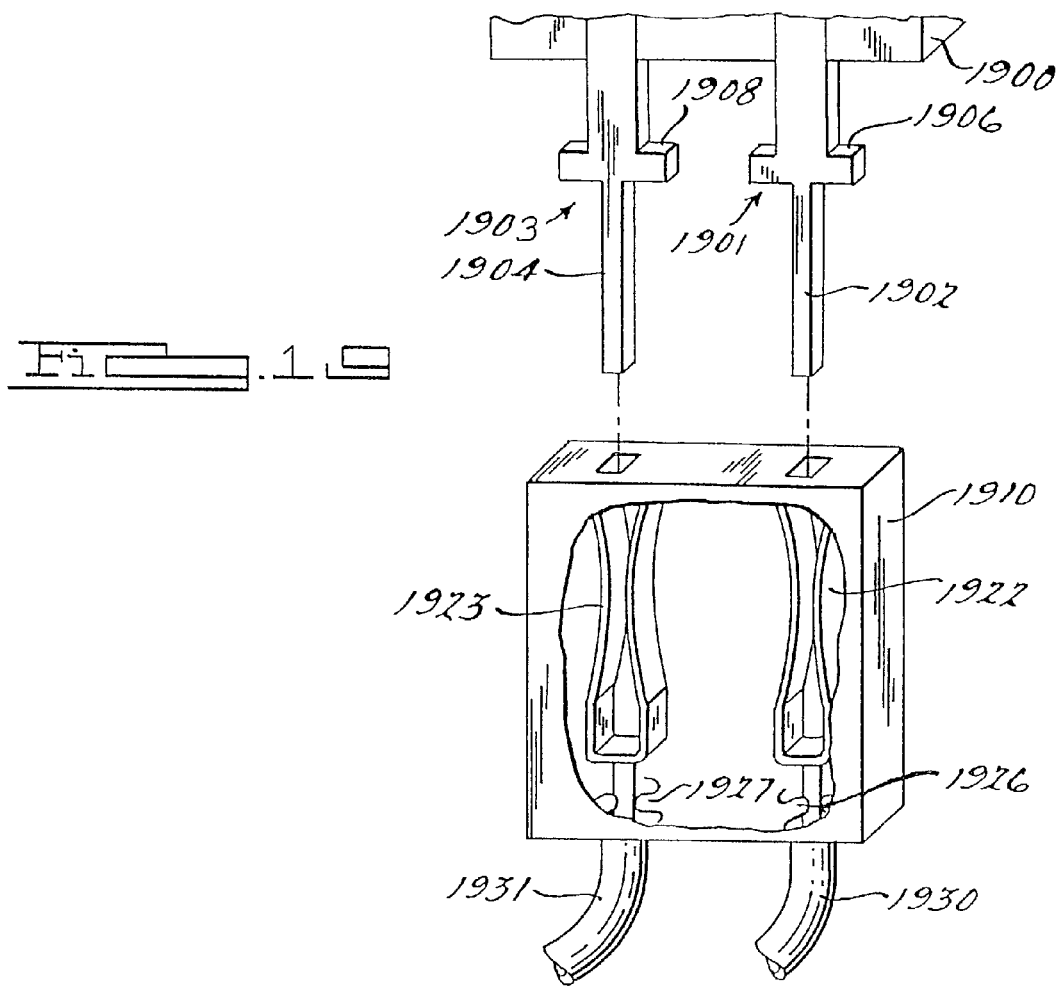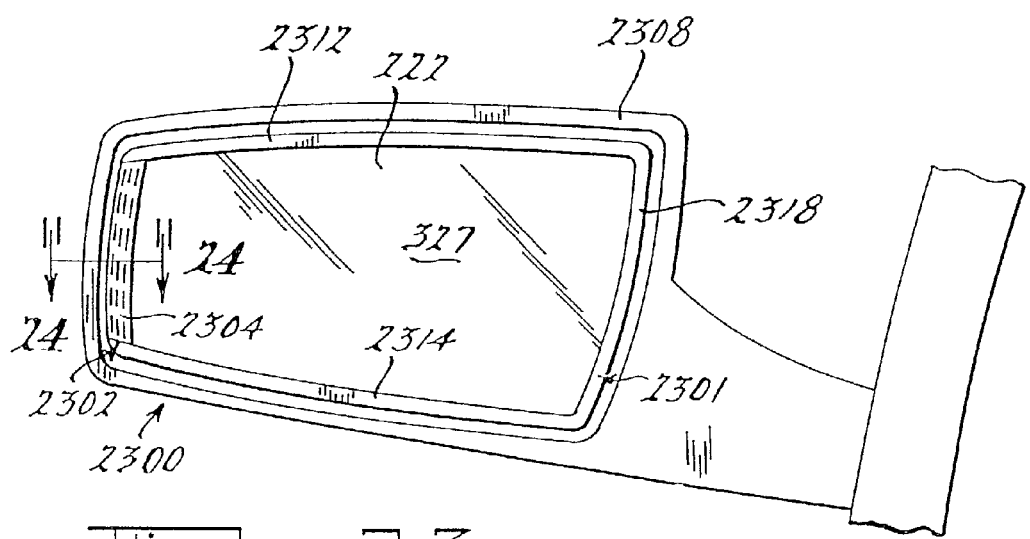

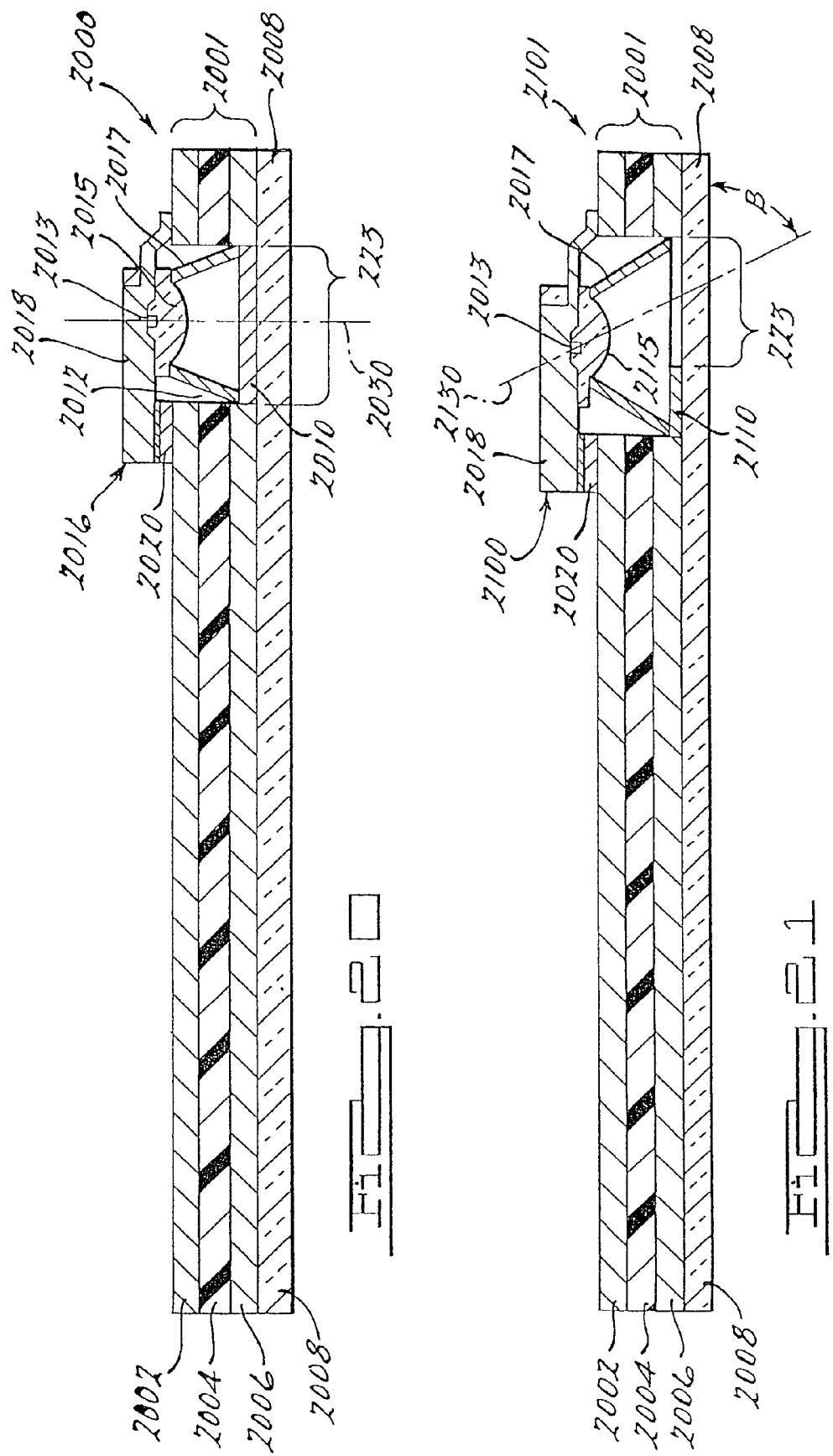

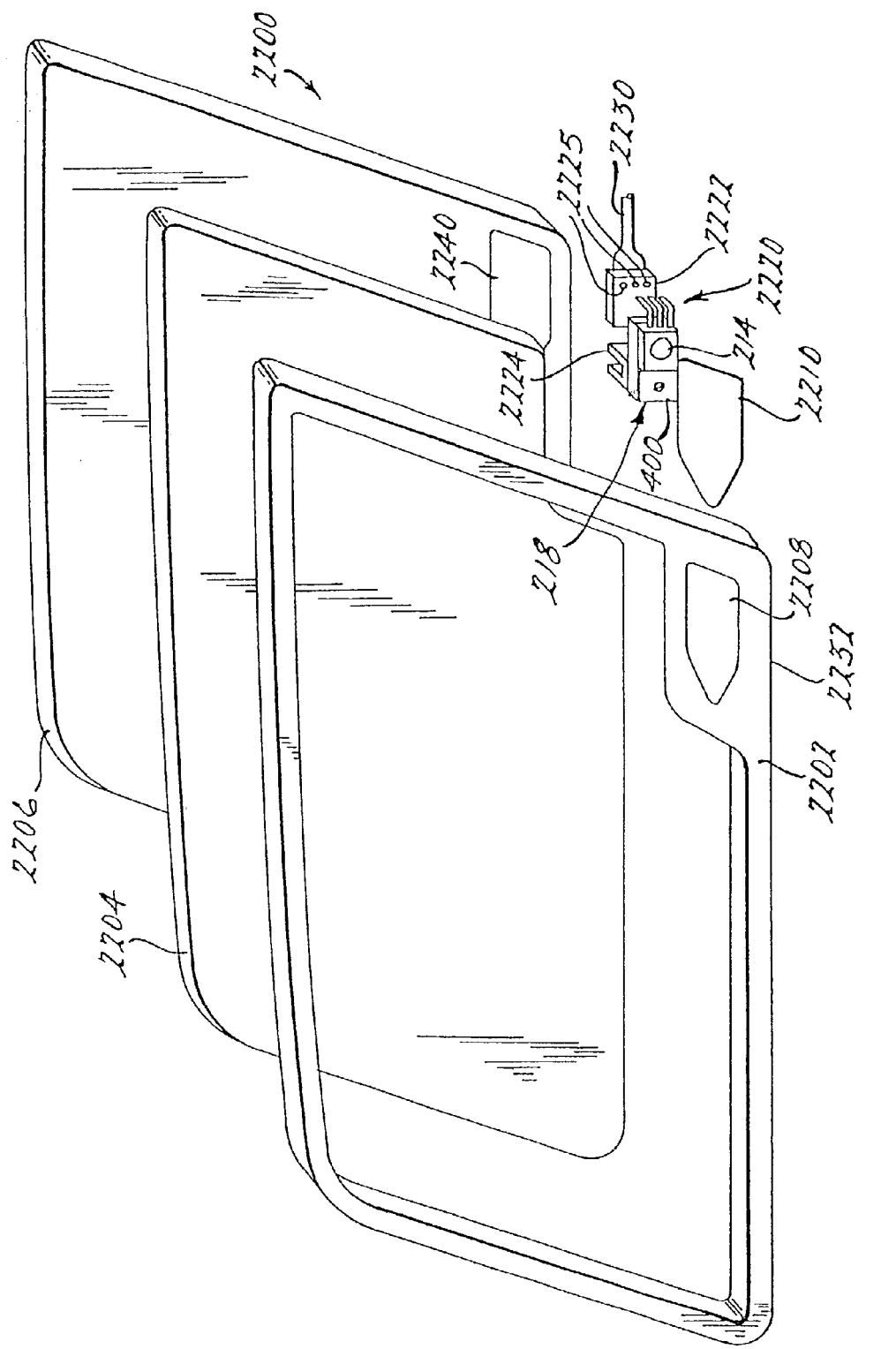

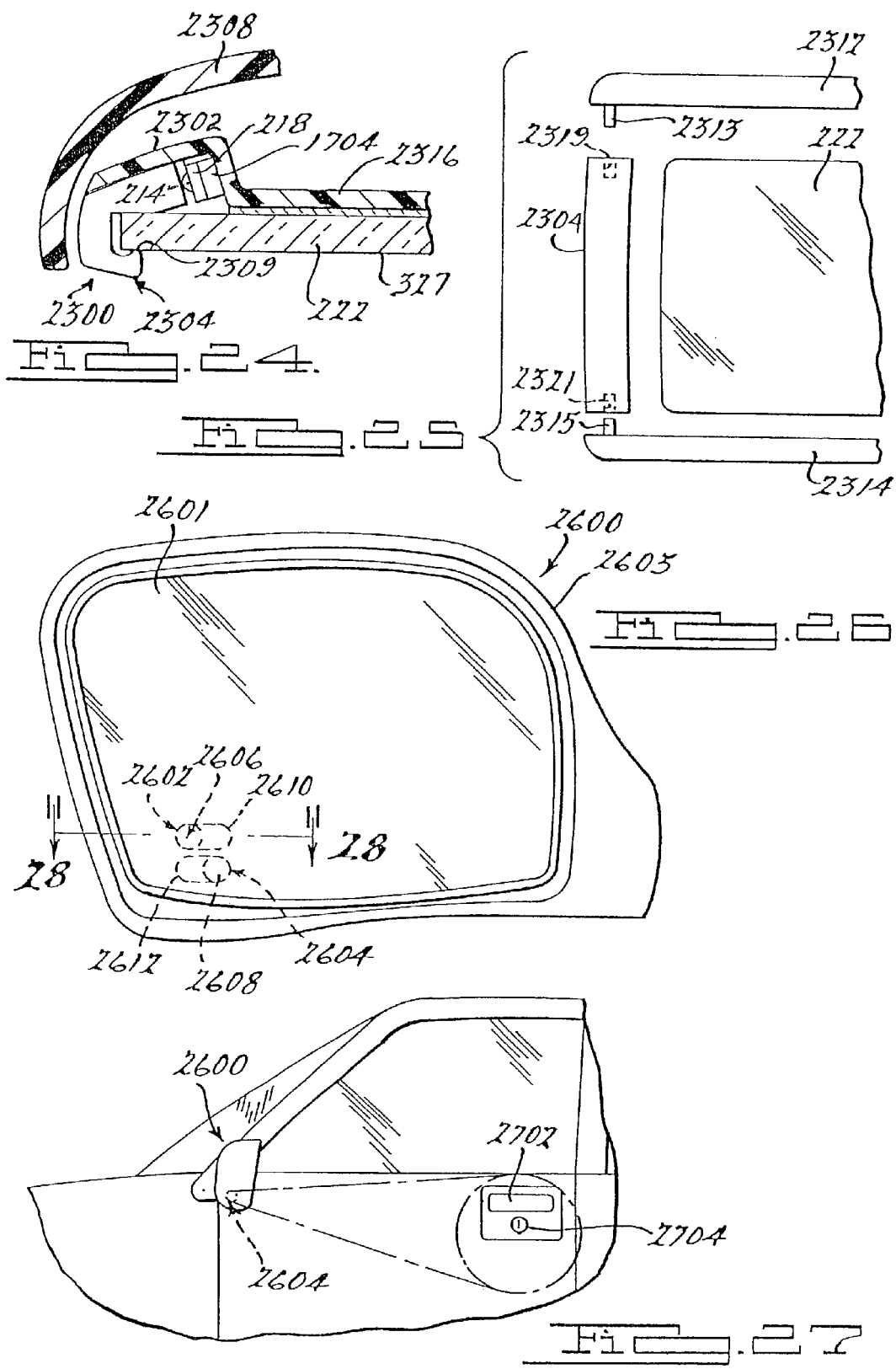

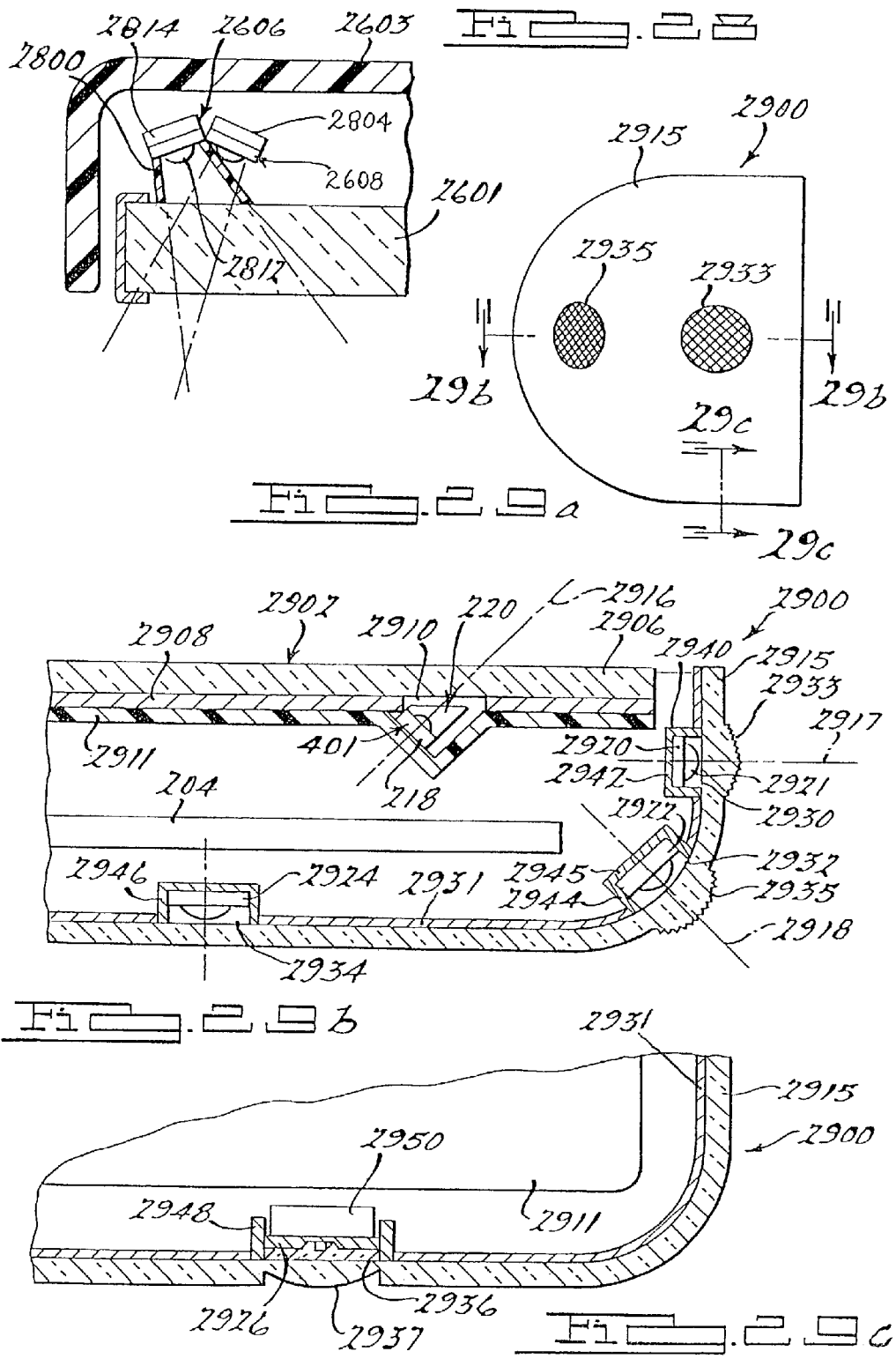

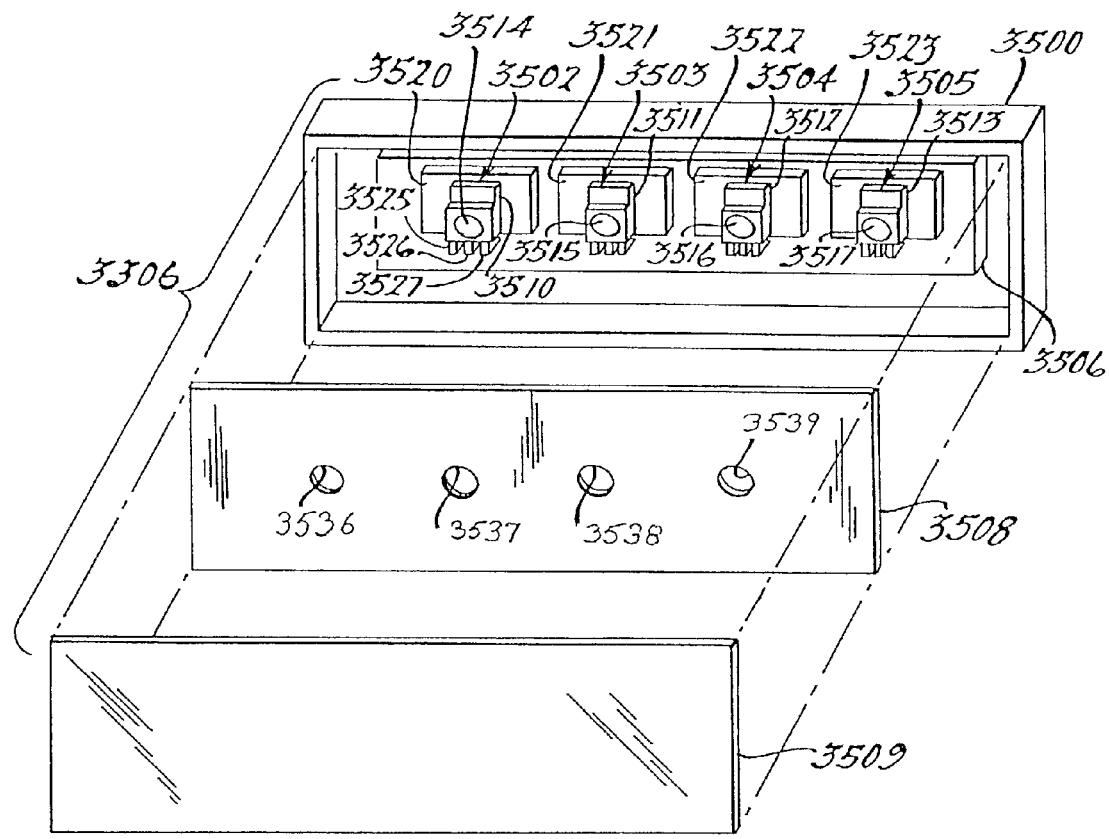

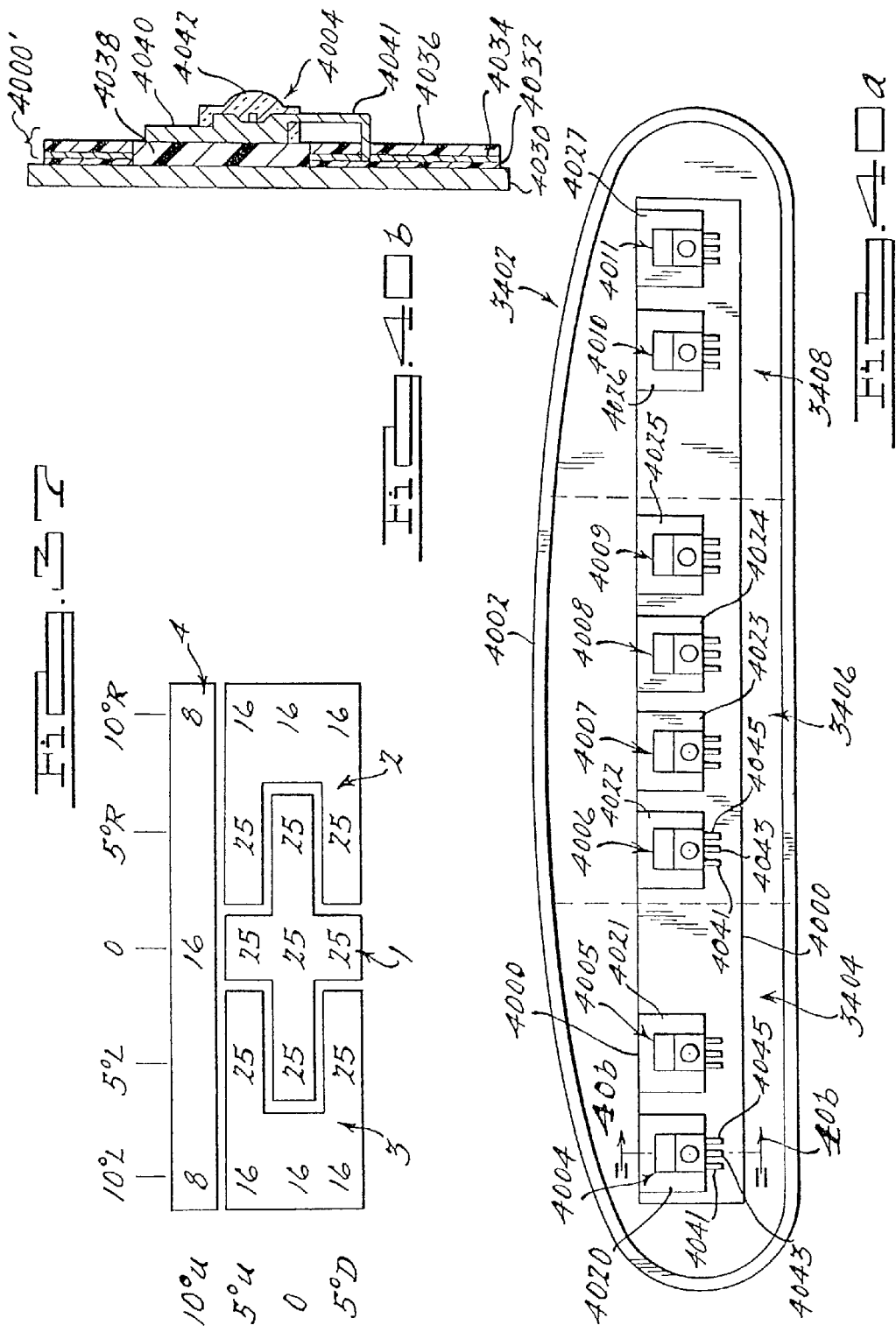

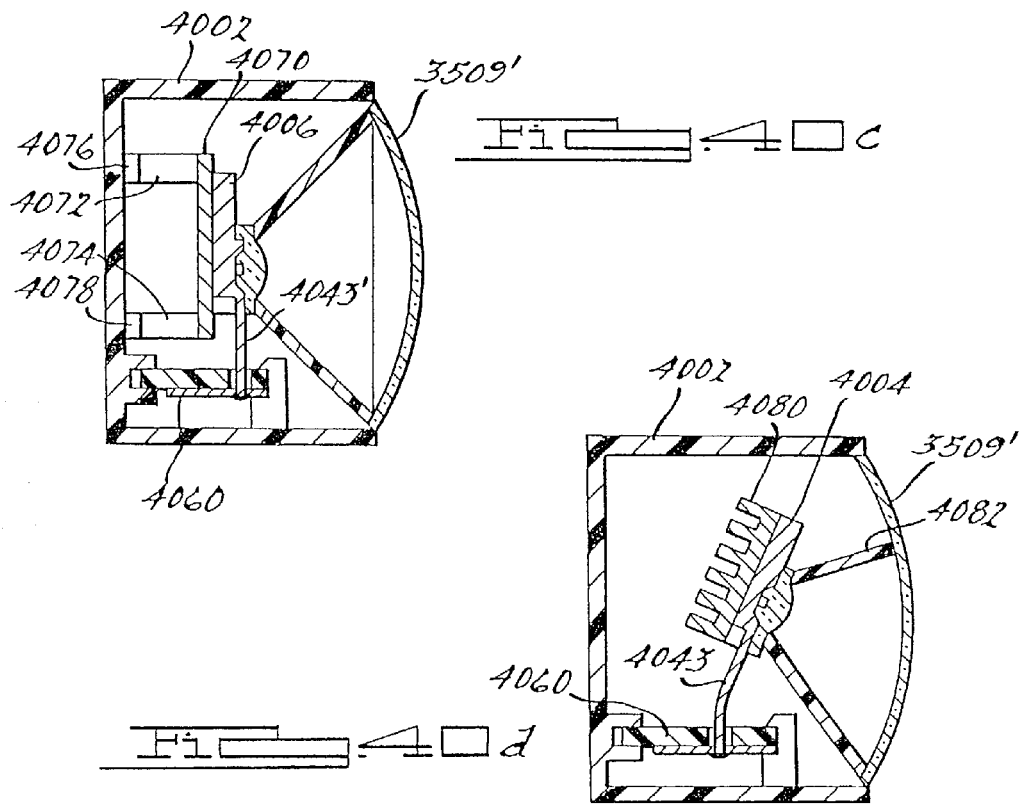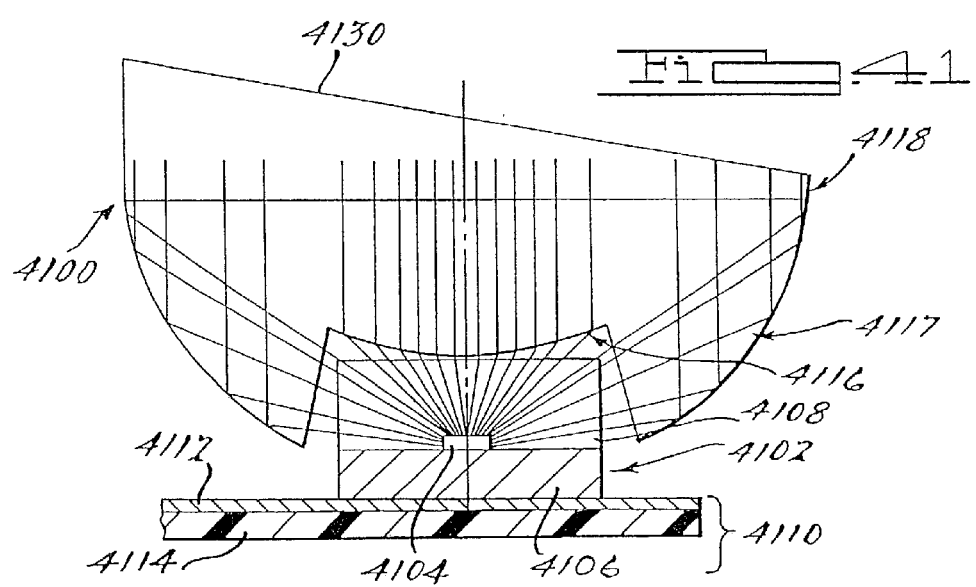

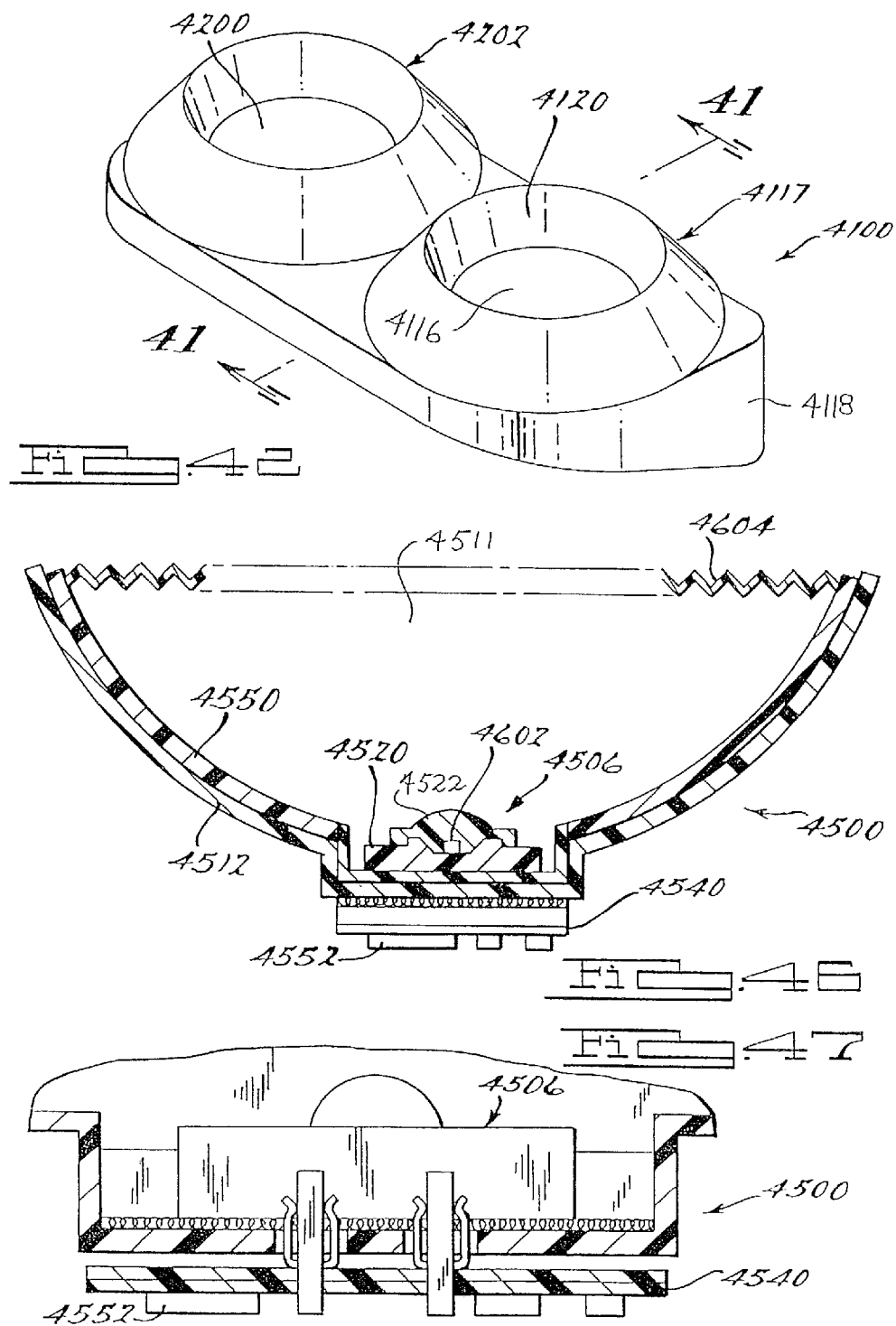

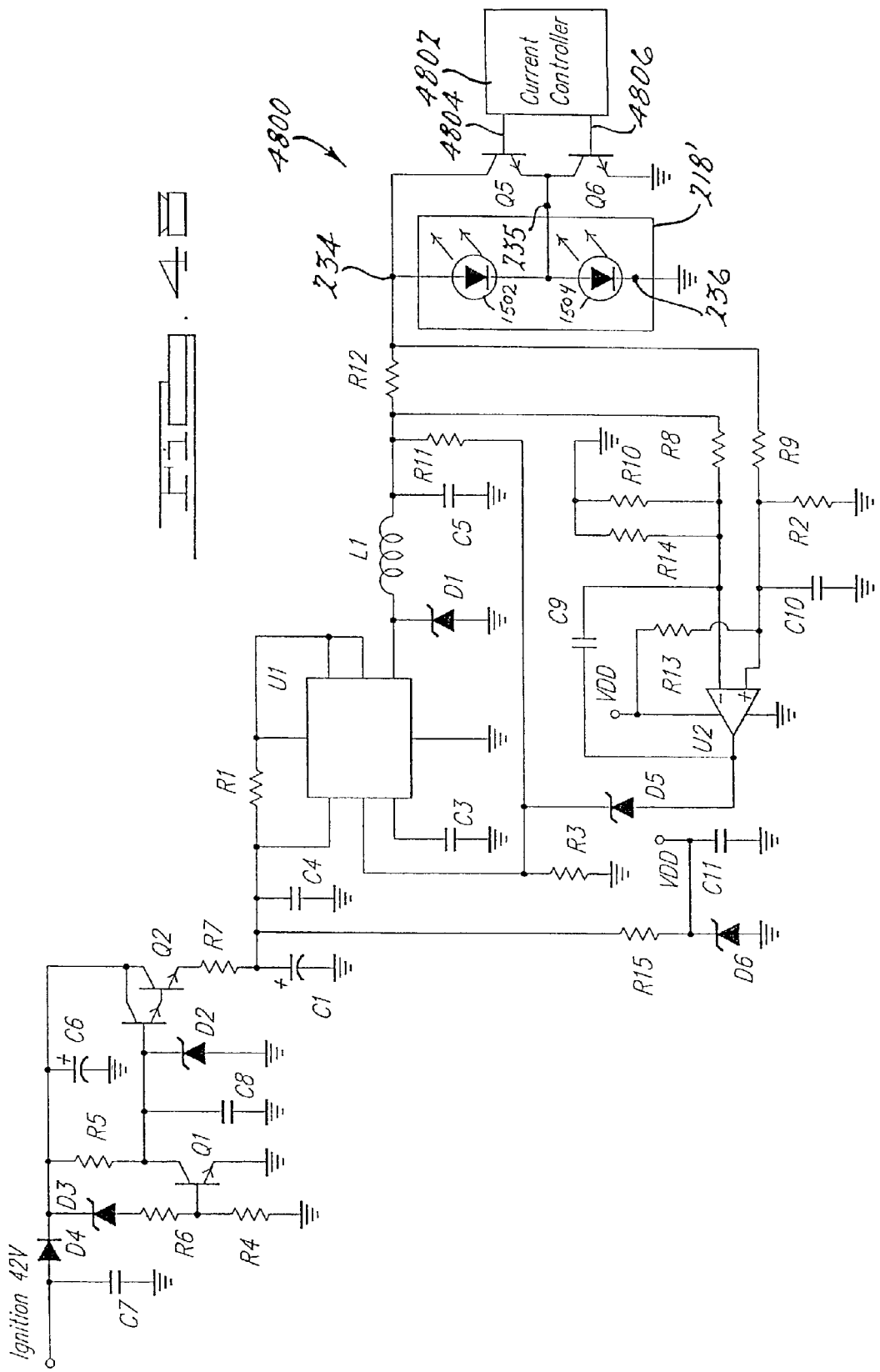

INDICATORS AND ILLUMINATORS USING A SEMICONDUCTOR RADIATION EMITTER PACKAGE

CROSS-REFERENCE TO RELATED APPLICATIONS

This application is a continuation of U.S. patent application Ser. No. 09/425,792, entitled "INDICATORS AND ILLUMINATORS USING A SEMICONDUCTOR RADIATION EMITTER PACKAGE," filed on Oct. 22, 1999, by John K. Roberts et al., now U.S. Pat. No. 6,441,943, which claims priority to U.S. Provisional Application No. 60/124,493, entitled "SEMICONDUCTOR RADIATION EMITTER PACKAGE," filed Mar. 15, 1999, by John K. Roberts et al., which is incorporated herein by reference. This application is also a continuation-in-part of U.S. patent application Ser. No. 09/175,984, entitled "ELECTROCHROMIC MIRRORS HAVING A SIGNAL LIGHT," filed on Oct. 20, 1998, by David Canimenga et al., now U.S. Pat. No. 6,111,683; which is a continuation-in-part of U.S. patent application Ser. No. 08/831,808, entitled "AN INFORMATION DISPLAY AREA ON ELECTROCHROMIC MIRRORS HAVING A THIRD SURFACE METAL REFLECTOR," filed on Apr. 2, 1997, by Jeffrey A. Forgette et al., now U.S. Pat. No. 5,825,527, the entire disclosures of which are incorporated herein by reference. This application is also a continuation-in-part of U.S. patent application Ser. No. 09/311,955, entitled "ELECTROCHROMIC REARVIEW MIRROR INCORPORATING A THIRD SURFACE METAL REFLECTOR AND A DISPLAY/SIGNAL LIGHT," filed on May 14, 1999, by William L. Tonar et al., now U.S. Pat. No. 6,356,376, which is a continuation-in-part of U.S. patent application Ser. No. 09/206,788, entitled "ELECTROCHROMIC REARVIEW MIRROR INCORPORATING A THIRD SURFACE METAL REFLECTOR AND A DISPLAY/SIGNAL LIGHT," filed on Dec. 7, 1998, by William L. Tonar et al., now U.S. Pat. No. 6,166,848, which is a continuation-in-part of U.S. patent application Ser. No. 09/197,400, entitled "ELECTROCHROMIC REARVIEW MIRROR INCORPORATING A THIRD SURFACE METAL REFLECTOR AND A DISPLAY/SIGNAL LIGHT," filed on Nov. 20, 1998, by William L. Tonar et al., now U.S. Pat. No. 6,111,684, which is a continuation-in-part of U.S. patent application Ser. No. 09/114,386, entitled "ELECTROCHROMIC REARVIEW MIRROR INCORPORATING A THIRD SURFACE METAL REFLECTOR," filed on Jul. 13, 1998, by Jeffrey A Forgette et al., now U.S. Pat. No. 6,064,508, which is a continuation-in-part of U.S. patent application Ser. No. 08/832,587, filed on Apr. 2, 1997, entitled "ELECTROCHROMIC REARVIEW MIRROR INCORPORATING A THIRD SURFACE METAL REFLECTOR", by Jeffrey A. Forgette et al., now U.S. Pat. No. 5,818,625, the entire disclosures of which are incorporated herein by reference.

FIELD OF THE INVENTION

The present invention relates to illuminators and indicators, and to improved vehicle components and assemblies incorporating a semiconductor radiation emitter package.

BACKGROUND OF THE INVENTION

Vehicles include a number of different components and assemblies that have an illuminator and/or a signal lamp associated therewith. Great interest has been shown in the use of electroluminescent semiconductor devices, such as light emitting diodes (LEDs), as illuminators and signal indicators because they offer many potential advantages as compared to other conventional low voltage light sources. Other light sources suffer from many deficiencies, including: they are relatively inefficient, such as conventional tungsten incandescent lamps; require high voltages to operate, such as fluorescent and gas discharge lamps; or are susceptible to damage, such as incandescent lamps. Accordingly, these alternate light sources are not optimal for vehicular applications where only limited power or low voltage is available, or where high voltage is unacceptable for safety reasons, or in applications where there is significant shock or vibration. LEDs, on the other hand, are highly shock resistant, and therefore provide significant advantages over incandescent and fluorescent bulbs, which can shatter when subjected to mechanical or thermal shock. LEDs also possess operating lifetimes from 200,000 hours to 1,000,000 hours, as compared to the typical 1,000 to 2,000 hours for incandescent lamps or 5,000 to 10,000 hours for fluorescent lamps.

Because of these and other advantages, LEDs have become common in a wide variety of opto-electronic applications. Visible LEDs of all colors, including white, are used as status indicators within instrument panels and consoles in cars, trucks, buses, minivans, sport utility vehicles, aircraft, and the like. In each of these applications, the low intensity luminous flux emitted by the LEDs limits the relative visibility of the indicator, particularly in high ambient lighting conditions.

High intensity amber, red, and red-orange emitting visible LEDs are used in integrated arrays of visual signaling systems such as vehicle CHMSLs (center high mounted stop lamps), brake lamps, exterior turn signals and hazard flashers, exterior signaling mirrors, and the like. In each of these applications, the limited luminous flux emitted by the individual discrete LEDs within the array requires the simultaneous operation of eight or more discrete LEDs in order to achieve the desired beam intensity and distribution.

Multi-color combinations of pluralities of high intensity visible colored LEDs are being used as the source of projected white light for illumination purposes. Such illuminators are useful as vehicle or aircraft map lights, for example, or as vehicle or aircraft reading or courtesy lights, cargo lights, license plate illuminators, back-up lights, and exterior mirror puddle lights. Phosphor-enhanced "white" LEDs may also be used in some of these instances as illuminators. In these illuminator applications, where high beam intensity is critical to production of effective projected illumination, the limited luminous flux emitted by the individual discrete LEDs requires the simultaneous operation of many discrete LEDs in order to achieve desired beam intensity, color, and distribution.

Infrared (IR) emitting LEDs are being used for remote control and communication in such devices as VCRs, TVs, DVD players, CD players, and other audio-visual remote control units. Similarly, high intensity IR emitting LEDs are being used for communication between IRDA devices such as desktop, laptop, and palmtop computers, personal digital assistants (PDAs), and peripherals such as printers, network adaptors, pointing devices ("mice," "trackballs", etc.), keyboards, and the like. Signal range and quality are dependent on the magnitude of flux generated by the LED emitter, and the limited flux has had a detrimental impact on performance of these existing IR transmitters, let alone designing IR LEDs into other systems.

In all of the applications discussed herein above, the limited magnitude of flux generated by the semiconductor emitter package has had a detrimental impact on the performance, design, size, weight, flexibility, cost, and other aspects of the devices in which they are employed. Consequently, much effort has been expended to develop higher intensity LEDs. Despite increases in luminous output that have been achieved as a result of these efforts, and despite all of the efforts expended to develop products that improve the performance of LEDs incorporated therein, high luminescent LEDs and the products that employ them suffer from high cost, high complexity, limited current capacity, and/or incompatibility with common manufacturing processes.

An exemplary application in an automotive environment wherein LEDs have imparted serious limitations on design and performance is a vehicle signal mirror. Signal mirrors generally employ one or more lamps in a mirror assembly to generate an information signal. In general, outside signal mirrors have employed a lamp assembly positioned either behind a dichroic mirror, such that the signal light passes through the mirror, or on the rearview mirror body housing, such that the signal lamp is independent of the mirror. Examples of such signal mirrors can be found in U.S. Pat. Nos. 5,361,190; 5,788,357; and 5,497,306. Even though signal mirrors incorporating LED signal lamps are gaining popularity, these mirrors have not yet received widespread acceptance. This limited acceptance may be due at least in part to the large volume, complexity, significant weight, and the high cost of implementing outside signal mirrors.

Outside rearview mirrors typically include a body housing mounted to the vehicle, a mirror assembly, and an adjustable support mechanism carrying the mirror assembly such that the driver can adjust the mirror angle. It is also common to provide other components in the mirror body housing such as one or more antennas (for accessories such as remote keyless entry), a motor for adjusting the mirror angle, and in some instances electronic circuitry. In direct conflict with this desire to provide a multitude of components in the outside rearview mirror body housing is the desire of vehicle designers to make the rearview mirrors as small and as aerodynamic as possible to minimize the mirror's impact on wind noise and vehicle styling. Consequently there is not a significant volume available within the mirror housing for additional components to be placed. In addition, it is desirable to make the weight of the mirror as light as possible to reduce vibration and its associated detrimental impact on rear vision. For these reasons, designers are presented with a significant challenge when attempting to design a signal mirror.

U.S. Pat. No. 5,361,190, entitled "MIRROR ASSEMBLY," issued on Nov. 1, 1994, to John K. Roberts et al. illustrates an LED signal mirror. The 5,361,190 patent discloses a through-the-mirror signal indicator wherein a light source is positioned behind a dichroic mirror. The dichroic mirror passes light within a spectral band and attenuates light outside that spectral band. The light source positioned behind the dichroic mirror emits light in the spectral pass band of the dichroic mirror, such that a visual signal from the light source can be seen from the front of the mirror. However, the mirror will attenuate light which is not within the narrow pass band of the dichroic mirror. Although the ability to pass light through the entire area of the mirror is a significant advantage, there are several disadvantages to the dichroic signal mirrors that have restricted its commercial exploitation. These signal mirrors employ a large array of LEDs to generate the light signal. Such an LED array is heavy, necessitating substantial support structure for the rearview mirror, and costly. In addition, the LED array is large, requiring a large mirror body to accommodate the array, let alone the other mirror components of the mirror. Another significant disadvantage to dichroic mirrors is that they are expensive to manufacture, difficult to mass produce, and subject to performance variations as they age.

U.S. Pat. No. 5,788,357, entitled "MIRROR ASSEMBLY," and issued to Muth et al. on Aug. 4, 1998, discloses a semitransparent mirror signal light assembly. The U.S. Pat. No. 5,788,357 describes efforts to overcome the inherent physical characteristics of earlier dichroic mirrors, such as the signal mirror disclosed in the U.S. Pat. No. 5,361,190. In particular, the U.S. Pat. No. 5,788,357 points out that the cost of producing dichroic mirrors is too high. Additionally, the U.S. Pat. No. 5,788,357 attempts to address the difficulties of providing a dichroic mirror with acceptable reflectivity and heat dissipation while maintaining adequate luminescence and a neutral chromatic appearance. In particular, the U.S. Pat. No. 5,788,357 employs a through-the-mirror arrangement using a semitransparent, non-dichroic mirror having a light source positioned behind it. The semitransparent mirror transmits about 1 percent to about 8 percent of a broad band of visible light. Like the U.S. Pat. No. 5,361,190, for LED signal lamps, the patent discloses a large bank of LEDs mounted on a substrate of relatively large dimension. Thus, the lamp array is heavy, requiring substantial structural support for the mirror, which will limit the types of applications in which the mirror can be used. In order to avoid the large LED array, the U.S. Pat. No. 5,788,357 teaches use of lamps other than LEDs.

U.S. Pat. No. 5,497,306, entitled "EXTERIOR VEHICLE SECURITY LIGHT," issued on Mar. 5, 1996, to Todd Pastrick, discloses a signal mirror assembly including a lamp module mounted on the body housing of the exterior rearview mirror. The principle embodiment illustrates the difficulties encountered when attempting to accommodate an incandescent lamp. In particular the U.S. Pat. No. 5,497,306 shows a lamp housing assembly, which is removably attached to the exterior mirror body housing to facilitate replacement and maintenance of the signal lamp. Such an arrangement is costly, large, and restricts the designer's design flexibility. In addition, this design necessitates a redesign of the mirror housing to provide enough volume to accommodate the mirror, the removable light module, and any associated electronics. Enlarging the mirror housing is exactly what the auto manufacturers are trying to avoid.

These difficulties encountered when designing a signal mirror are representative of the types of problems encountered in many other components and assemblies employing LEDs. What is needed are components and assemblies producing brighter, stronger, and/or more easily discernible illumination and/or signals, and in many applications, such producing better illumination and/or signals in a compact volume.

BRIEF DESCRIPTION OF THE DRAWINGS

The subject matter that is regarded as the invention is particularly pointed out and distinctly claimed in the claim portion that concludes the specification. The invention, together with further objects and advantages thereof, may best be understood by reference to the following description taken in conjunction with the accompanying drawings, where like numerals represent like components, and in which:

FIG. 4 is a cross-sectional view of a lamp module taken along plane 4-4 in FIG. 6 which lamp module can be used in the signal mirrors of FIGS. 1-3;

FIG. 5 is a side elevation view of the lamp module according to FIG. 4 positioned adjacent the back surface of a mirror;

FIG. 6 is an end view of the lamp module of FIGS. 4 and 5 positioned adjacent the back surface of a mirror;

FIG. 7 is a cross-sectional view taken along plane 7-7 in FIG. 3 illustrating the mirror subassembly;

FIG. 8 is an exploded side isometric view illustrating the mirror subassembly according to FIG. 7;

FIG. 9 is a cross-sectional view taken along plane 7-7 in FIG. 3 illustrating an alternate mirror sub-assembly;

FIG. 12 is a cross-sectional view taken along plane 7-7 in FIG. 3 illustrating an alternate mirror sub-assembly;

FIG. 13 is a cross-sectional view taken along plane 7-7 in FIG. 3 illustrating an alternate mirror sub-assembly;

FIG. 14 is a circuit schematic illustrating a lamp circuit that can be used with the module according FIGS. 4-6;

FIG. 16 is a side elevation view of an alternate embodiment of the lamp module according to FIGS. 4-6;

FIG. 17 is a top isometric view of another alternate embodiment of the lamp module;

FIG. 18 is a top isometric view of another alternate embodiment of the lamp module;

FIG. 19 is a top view of another alternate embodiment of the lamp module;

FIG. 20 is a cross-sectional view taken along plane 7-7 in FIG. 3 illustrating an alternate embodiment of a signal mirror subassembly;

FIG. 21 is a cross-sectional view taken along plane 7-7 in FIG. 3 illustrating an alternate embodiment of a signal mirror subassembly;

FIG. 22 is an exploded perspective view illustrating an alternate embodiment of the signal mirror and including a bezel signal lamp;

FIG. 23 is a rear elevation view illustrating another alternate embodiment of a signal mirror and including a light pipe, bezel signal lamp;

FIG. 24 is a cross-sectional view taken along plane 24-24 in FIG. 23 and illustrating another alternate embodiment of the signal mirror and including a light pipe bezel signal lamp;

FIG. 25 is an exploded view of the bezel and mirror of a mirror assembly according to FIGS. 23 and 24;

FIG. 26 is a rear elevation view illustrating another alternate embodiment of a mirror and including two lamps;

FIG. 27 is a fragmentary side view illustrating the vehicle according to FIG. 26;

FIG. 28 is a cross-sectional view taken along plane 28-28 in FIG. 26 and illustrating the mirror according to FIG. 26;

FIG. 29a side elevation view illustrating another alternate embodiment of the signal mirror;

FIG. 29b is a fragmentary cross-sectional view taken along plane 29b-29b in FIG. 29a and illustrating the signal mirror according to FIG. 29a;

FIG. 29c is a fragmentary cross-sectional view taken along plane 29c-29c in FIG. 29a and illustrating the signal mirror according to FIG. 29a;

FIG. 35 is an exploded perspective view of a CHMSL lamp assembly for the vehicle according to FIG. 33;

FIG. 36 is a cross-sectional view of the CHMSL according to FIG. 35 taken along plane 36-36 in FIG. 33;

FIG. 37 illustrates CHMSL candela output requirement at different angles;

FIG. 40a is a rear elevation view of a CHMSL and cargo lamp assembly in the vehicle according to FIG. 34 with the lens removed;

FIG. 40b is a cross-sectional view of an alternate circuit board assembly taken along the plane 40b-40b in FIG. 40a;

FIG. 40c is a cross-sectional view showing an alternate embodiment of the CHMSL lamp assembly taken along plane 40c-40c in FIG. 34;

FIG. 40d is a cross-sectional view showing an alternate embodiment of the cargo lamp taken along plane 40d-40d in FIG. 34;

FIG. 41 is a cross-sectional view taken along the same plane 40b-40b in FIG. 40a, but showing an optical assembly for the cargo lamps in FIG. 40a and the map lamps of FIG. 30;

FIG. 42 is a bottom perspective view illustrating the optical assembly according to FIG. 41;

FIG. 46 is a cross sectional view of the lamp assembly according to FIG. 45 taken along plane 46-46 in FIG. 33;

FIG. 47 is a fragmentary elevation view of the lamp assembly according to FIGS. 45 and 46 and showing the lamp connected in the socket; and FIG. 48 is a circuit schematic illustrating a step down power converter.

DETAILED DESCRIPTION OF THE DRAWINGS

Improved components and assemblies incorporate a semiconductor radiation emission package, such as an LED, and produce a strong readily visible signal indicator, a strong communication signal, and/or bright illumination. Additionally, means are provided in some of the components and assemblies to increase the output of the semiconductor radiation emission package or otherwise improve the performance of the device.

A signal mirror 100 (FIG. 1) is mounted on a vehicle A. "Signal mirror," as used herein, refers to a mirror associated with a signal lamp to generate a signal visible to an observer. An example of one significant advantage that can be achieved by such a signaling device is evident from FIG. 1, wherein vehicle A includes an outside signal mirror 100. The driver of vehicle B is positioned in what is commonly referred to as the blind spot for the driver of vehicle A. Additionally, the driver of vehicle B is unlikely to see the rear turn signal lamp 102 being well outside of the optimum viewing area D for that signal lamp. A signal indicator that generates a signal discernable in viewing area C is therefore advantageous as the driver of vehicle B can be alerted to vehicle A's driver's intent to change lanes, and can take appropriate action to avoid an accident responsive thereto.

Figure 2:
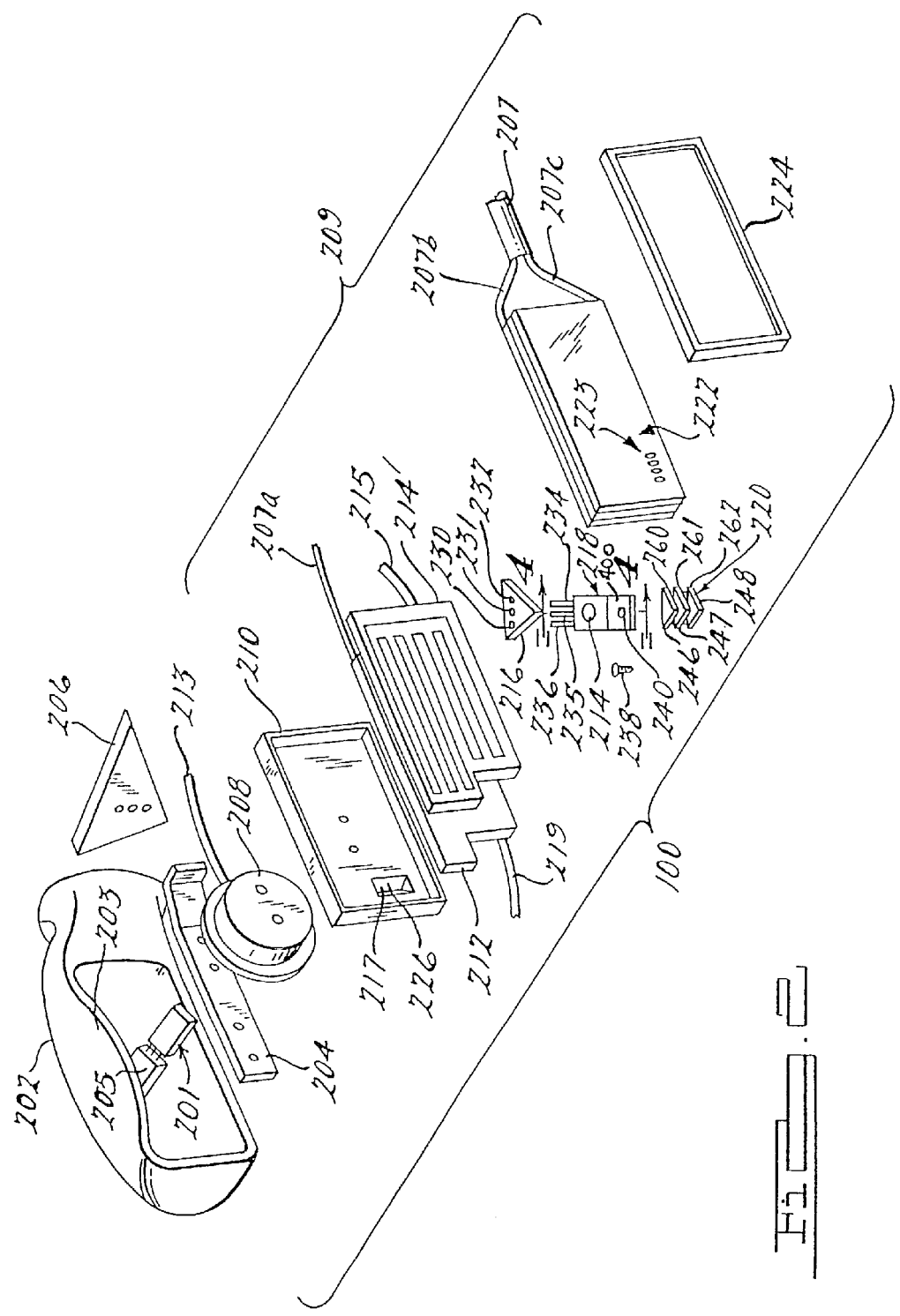
FIG. 2 is an exploded top perspective view illustrating a signal mirror on a vehicle in FIG. 1.
Figure 3:
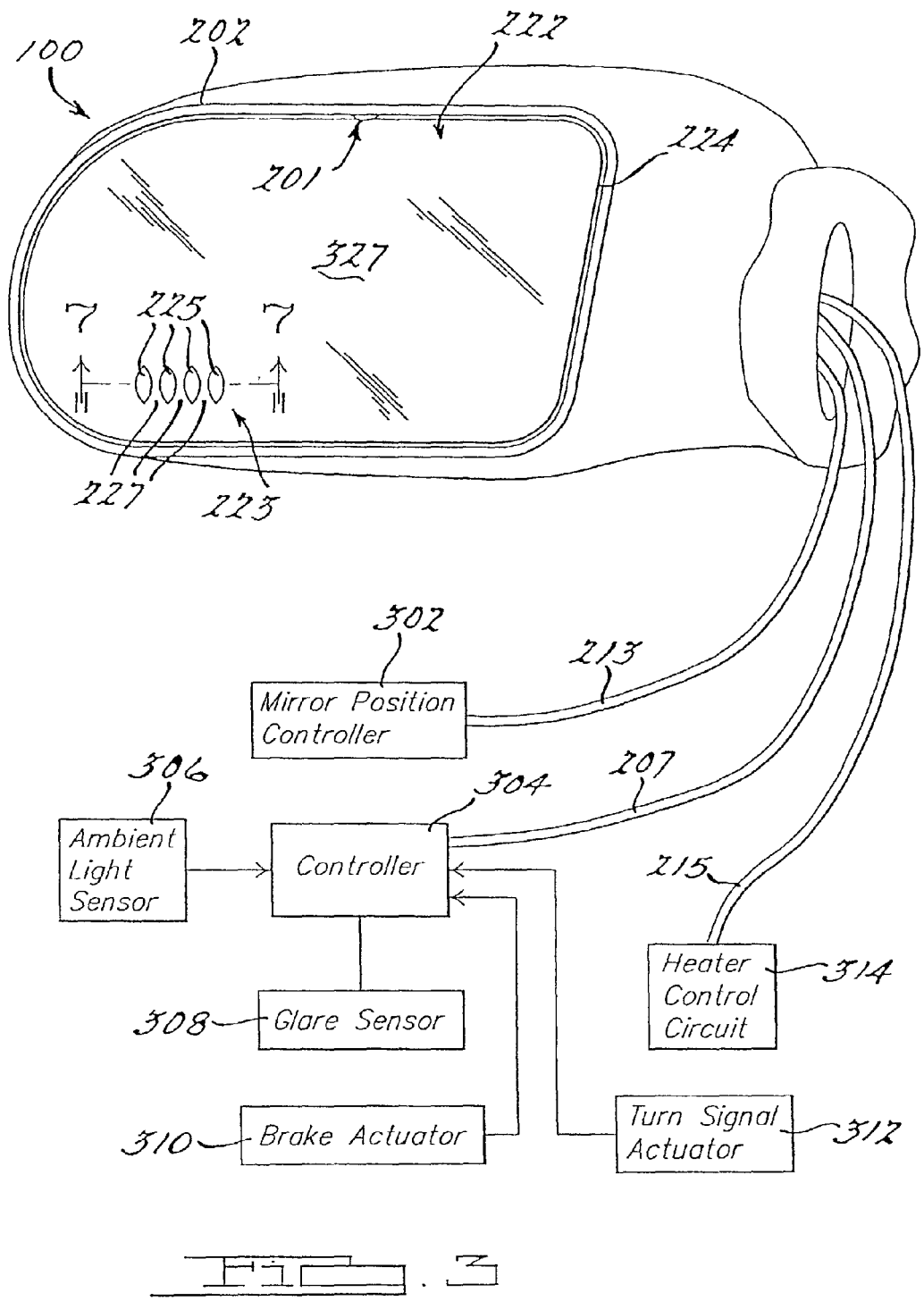
FIG. 3 is a schematic representation of the mirror according to FIGS. 1 and 2 and showing circuitry used therewith in block diagram form.

With reference to FIGS. 2 and 3, wherein elements first shown in FIG. 2 are numbered 2XX and elements first shown in FIG. 3 are numbered 3XX (this numbering method is used with all of the figures), the signal mirror 100 will now be generally described. The illustrated signal mirror 100 includes, from left to right in FIG. 2: a rearview mirror body housing 202; a puddle LED lamp 201 positioned under an overhang 203 in the mirror body housing 202; a female connector 205; a support bracket 204 for the mirror; a vehicle body mounting bracket 206; a motor 208 for adjusting the angle of the mirror; a carrier 210 on which the mirror is supported; an optional mirror circuit board 212; a heater 214'; an illuminator circuit board 216; a signal indicator LED lamp 218; a heat sink 220; a mirror 222; and a bezel 224. With reference to FIG. 3, the vehicle includes: a mirror position controller 302; a controller 304 coupled to receive inputs from an ambient light sensor 306, a glare sensor 308, a brake actuator 310 and a turn signal actuator 312; and a heater control circuit 314. It will be recognized by those skilled in the art that although the illustrated signal mirror is outside of the vehicle adjacent the driver's seat, a signal mirror can be inside the vehicle or mounted at any location on the exterior of the vehicle, and it will be further recognized that the signal mirror can include additional elements and functionality, or consist only of a mirror and lamp, and as used herein, signal mirror will refer to any signal indicator in combination with a mirror or a mirror housing.

Somewhat more particularly, the rearview mirror body housing 202 is typically an enclosure which is shaped taking into consideration the style of vehicle A (FIG. 1) to which it is attached as well as general aerodynamic principles, serving the primary functions of providing functional and aesthetic styling, and protecting the mirror components from flying objects, such as stones. The rearview mirror body housing 202 (FIG. 2) can be molded from a polymer, stamped from a metal or metal alloy, or of any other suitable conventional manufacture. The exterior of the rearview mirror body housing 202 is typically painted to match the color of vehicle A and covered with a clear coat finish.

The rearview mirror body housing 202 includes an overhang 203. Although the illustrated overhang is at the top front of the housing, the housing 202 can extend in other directions, or include other projections, to which the LED lamp 201 can be attached. It will be recognized that because of the LED lamp's small profile, it can be accommodated at virtually any location on the mirror with minimal modification of the mirror body housing 202 and the mirror 222. An LED lamp 201 is positioned under the overhang to project light downwardly and forwardly so as to illuminate the area behind the mirror and adjacent to the door of vehicle A. The puddle LED lamp 201 is connected to a female connector 205, which is in turn electrically connected to optional printed circuit board 212 via cable 219, or if the optional printed circuit board 212 is omitted, the cable 219 can extend from the connector 205 directly to the controller 304 to receive control signals therefrom. The connector 205 can contain therein a circuit to protect the LED lamp 201 from potentially damaging voltages. The LED lamp 201 is a high power LED lamp. In particular, the LED lamp 201 can be implemented using a phosphor emitter, red-green-blue emitters, or binary complimentary colored emitters, which when combined produce white light.

A variety of components and assemblies are described herein that improve the performance of LED lamps. Although these components and assemblies can enhance the performance of any LED lamp, the LED lamps used are preferably high power LED lamps. "High power LED lamp" as used herein is an LED package, without auxiliary components, wherein 90 percent of the LED power at peak light intensity is at least approximately 0.1 Watt. Additionally, any of the components and assemblies described herein can advantageously be implemented using an LED lamp having a heat extraction member. Particularly advantageous LED lamps, according to which the LED lamps herein are preferably manufactured, designed to optimize heat extraction and manufacturability into a component or assembly, are described in copending U.S. patent application No. 09/426, 795 entitled "SEMICONDUCTOR RADIATION EMITTER PACKAGE," and filed on Oct. 22, 1999, now U.S. Pat. No. 6,335,548, the disclosure of which is incorporated herein by reference. These LED lamps can be implemented using a semiconductor optical radiation emitter, such as an organic light emitter or a polymer light emitter, and in particular can include one, or more than one, emitter, and "LED lamp" as used herein includes any semiconductor optical radiation emitter package.

The rearview mirror body housing 202 partially encloses a support bracket 204, which is attached to the vehicle A (FIG. 1) using mounting bracket 206 (FIG. 2). The support bracket 204 and the mounting bracket 206 are constructed and attached through conventional means.

Motor 208 is mounted on support bracket 204. Motor 208 is optional, and can be provided by any suitable conventional mechanism of the type commercially available to adjust the position of the mirror subassembly responsive to control signals received from a conventional mirror position controller 302 (FIG. 3). The control signals are input to the motor from the position control controller 302 via cable 213. The control signals are typically generated using switches located in the door or center console of vehicle A, which switches are positioned to be accessible to the driver. Alternatively, the motor and mirror position controller can be replaced by a ball and socket support, which permits the mirror angle to be adjusted by manual manipulation.

The mirror subassembly 209 includes, from left to right: the carrier 210; an optional mirror circuit board 212; a heater 214; an LED lamp 218; an optional lamp circuit board 216; an optional heat sink 220; a mirror 222; and a bezel 224. The carrier plate is preferably formed of a molded polymer, although it can be of any suitable conventional manufacture such as stamped from a metal or metal alloy.

The mirror circuit board 212 is optional, and can be omitted, for example, where the signal mirror 100 does not include a significant amount of circuitry. If included, the circuit board 212 can be either a flexible circuit board or a rigid circuit board. The circuit board 212 can have one or more integrated circuit (IC) components mounted thereto by conventional means, such as surface mounted, or mounted to through-holes, also known as vias, using soldering or other techniques, and is preferably a thin printed circuit board to reduce the thickness and weight of the mirror subassembly 209. A mirror subassembly including a circuit board is disclosed in U.S. patent application Ser. No. 09/312,682, entitled "EXTERIOR MIRROR SUBASSMEBLY WITH COMBINED ELECTRONIC CIRCUITRY AND MIRROR ELEMENT," filed on May 17, 1999, by Timothy E. Steenwyk, now U.S. Pat. No. 6,244,716, which is incorporated herein in its entirety by reference.

The optional heater 214' can be of any suitable construction. More particularly, the heater 214' can be a resistive conductor having an adhesive on one surface, or opposite surfaces, thereof. The resistive conductor generates heat when a current is applied thereto. The resistive conductor implementation of heater 214' can be applied to the back surface of mirror 222, applied to two-sided tape, mounted on optional mirror printed circuit board 212, or etched in a conductive surface of mirror circuit board 212.

The LED lamp 218 is a high power LED, and preferably an LED lamp using one or more red-orange emitter chip. In the illustrated embodiment of FIG. 2, circuit board 216 and heat sink 220 are provided for the LED lamp 218. As described in greater detail below, the LED lamp 218 and heat sink 220 are connected to increase heat dissipation from the LED lamp, the LED lamp is mounted to circuit board 216, and the circuit board is mounted to the carrier plate 210 using a mechanical attachment mechanism such as snap connectors, an adhesive, or other conventional means. The circuit board 216 is used to electrically connect the LED lamp to controller 304 via circuit board 212 and cable 207*a*. Alternatively, the cable 207*a* can be connected directly to circuit board 216 if circuit board 212 is not used. The controller 304 generates control signals for the LED lamp 218 responsive to the brake actuator 310 and/or the turn signal actuator 312, and in particular, flashing signals when the left turn signal is ON and a continuous signal when the driver presses the brake actuator while the turn signal is not on. It will be recognized that the right turn signal will be repeated in a signal lamp on the passenger side of the vehicle A. It will also be recognized that the signal lamp circuit board 216 may be directly connected to the vehicle electrical system to receive the turn signal and stop lamp signals, and circuits for providing such a connection are described in greater detail below with reference to FIGS. 14 and 15.

The mirror 222 can be flat, aspheric, or convex. The mirror 222 can be a non-electrochromic, single element mirror having a reflector on the first or second surface. Such mirrors are often constructed of a transparent element, such as glass or a polymeric material, with a reflective coating such as chrome, silver, or the like serving as the reflector. Alternatively, the mirror 222 can be an electrochromic mirror, which offers the significant advantage of being able to automatically adjust its reflectivity to reduce glare at night and to provide a high level of reflectivity during the day, when glare is not a significant problem. Electrochromic mirrors amplify the difficulty of providing a signal mirror as the LED lamp has to transmit through two pieces of glass, at least one transparent conductive material, and an electrochromic medium, in addition to the reflector or dichroic coatings, as described in greater detail hereinbelow. Electrochromic devices are generally known, and examples of electrochromic devices and associated circuitry, some of which are commercially available, are disclosed in Byker U.S. Pat. No. 4,902,108; Bechtel et al. Canadian Patent No. 1,300,945; Bechtel U.S. Pat. No. 5,204,778; Byker U.S. Pat. No. 5,280,380; Byker U.S. Pat. No. 5,336,448; Bauer et al. U.S. Pat. No. 5,434,407; Tonar U.S. Pat. No. 5,448,397; Knapp U.S. Pat. No. 5,504,478; Tonar et al. U.S. Pat. No. 5,679,283; Tonar et al. U.S. Pat. No. 5,682,267; Tonar et al. U.S. Pat. No. 5,689,370; Tonar et al. U.S. Pat. No. 5,888,431; and Bechtel et al. U.S. Pat. No. 5,451,822. Each of these patents is commonly assigned with the present invention and the disclosures of each, including the references contained therein, are hereby incorporated herein in their entirety by reference. Such electrochromic devices may be utilized in a fully integrated inside/outside rearview mirror system or as separate inside or outside rearview mirror systems. Alternatively, the mirror can be a dichroic mirror, examples of which are also referenced above.

Controller 304 controls the reflectance of the electrochromic mirror 222, and optionally provides control signals to control LED lamp 218. The controller 304 can advantageously be implemented using one or more microcontrollers and associated circuitry, and may, for example, be an interior rearview mirror controller of the type associated with an electrochromic rearview mirror commonly mounted to the vehicle windshield, and the external mirror can receive control signals therefrom. The controller 304 is coupled to an ambient light sensor 306, which typically faces forwardly of the vehicle, and a glare sensor 308, which typically faces rearwardly to sense the light coming from the rear of the vehicle. The controller 304 can generate control signals for both the interior electrochromic mirror (such as mirror 3000 in FIG. 30) and the exterior electrochromic mirror 222. Electrochromic mirror controllers are disclosed in: Canadian Patent No. 1,300,945, entitled "AUTOMATIC REARVIEW MIRROR SYSTEM FOR AUTOMOTIVE VEHICLES", issued May 19, 1992, to Jon H. Bechtel et al.; U.S. patent application Ser. No. 08/825,768, entitled "SERIES DRIVE CIRCUIT," filed by Robert R. Turnbull et al. on Sep. 16, 1997, now U.S. Pat. No. 5,956,012; and PCT Application No. PCT/US97/16946, entitled "INDIVIDUAL MIRROR CONTROL SYSTEM," filed by Robert C. Knapp et al. on Sep. 16, 1997; and U.S. patent application Ser. No. 09/236,969, entitled "AUTOMATIC DIMMING MIRROR USING SEMICONDUCTOR LIGHT SENSOR WITH INTEGRAL CHARGE COLLECTION", filed May 7, 1999, by Jon H. Bechtel et al, now abandoned, the disclosures of which are incorporated by herein by reference. Regardless of the type of mirror 222, the bezel 224 is dimensioned to fit over and circumscribe the perimeter edge of the mirror 222. The bezel can be of any suitable construction, such as molded of an organic polymer, stamped from a metal or metal alloy, or the like. When assembled to the carrier 210, the bezel 224 and carrier 210 support, frame, and protect the mirror 222, as well as the components associated therewith.

Those skilled in the art will recognize that the electrical conductors 207, 207*a*-207*c* (FIG. 2), and 215, can be provided by conventional conductors, such as copper wires having individual insulated sleeves and bundled together in a wire harness (not shown) running from the vehicle through the mirror mounting structure.

The signal mirror 100 is exemplified having a large number of components to illustrate the small volume that mirror designers have available for a signal lamp. It is desirable to provide a large number of components within the mirror for utility, safety and convenience reasons, even though a large volume is required to accommodate a large number of components. In particular: the motor 208 permits driver adjustment of the mirror position for improved visibility without having to open the window and stretch to physically contact the mirror while operating the vehicle; the electrochromic mirror improves the drivers visibility by attenuating headlight glare from other vehicles at night and providing a substantially unattenuated reflection during daylight hours thereby improving rearward visibility; the heater 214' improves visibility through the rearview mirror by clearing the mirror of moisture such as ice and condensation; and the signal lamp 218 increases the likelihood that drivers of other vehicles will be alerted by the signaling system of vehicle A.

A substantial volume must also be provided in the mirror body housing 202 if the mirror is to have significant freedom of movement for adjusting the mirror angle to reflect the driver's desired field of vision. In direct conflict with this need for more volume in the mirror body housing is the desire to make mirror assemblies as small as possible. Two principle reasons for making the mirror as small as possible include improved aerodynamics, and reduced wind noise. Accordingly there is a need to reduce the volume of signal mirror 100 required by the components in the mirror without reducing the features in the mirror.

More particularly, the LED lamp 201 effects a low profile, very bright puddle light illuminator, and LED lamp 218 effects a small volume, very bright signal lamp in mirror 222. The LED lamp 218 includes a heat extraction member 400 (FIG. 4) operative to reduce the temperature of the LED lamp by providing a low thermal resistance between the junction and the ambient as described in U.S. Pat. No. 6,335,548 incorporated herein by reference. The heat extraction member is partially covered by an encapsulant 402, which encapsulant is transparent and includes a lens 214. One or more emitter 404 is mounted to the heat extraction member 400 under the lens, such attachment being by bonding, for example, and in particular a thermally conductive bonding material can be used. The LED lamp 218 further includes high thermal resistance electrical leads 234-236. The electrical leads 234-236 are connected to the emitter, or emitters, 404 and, in particular, the illustrated three lead LED lamp 218 has multiple emitters. Those skilled in the art will recognize that the LED lamp 218 can have two leads, or more than three leads, and that the three lead LED lamp is merely illustrative. In the illustrated example, where the LED lamp 218 has two emitters, electrical lead 234 can be connected to the anode of one emitter and electrical lead 236 can be connected to the anode of the other emitter. The electrical lead 235 can be coupled to the cathode of both emitters through the heat extraction member as shown in FIG. 4. Such an arrangement permits application of respective control signals for the emitters. Each of the electrical leads 234-236 has a high thermal resistance relative to the heat extraction member, such that the leads can be assembled in a device using known production techniques, such as surface mounting, radial insertion, axial insertion, wave soldering, hand soldering, and/or other conventional manufacturing processes, even if substantial amounts of heat are applied to the leads during the process, without harming the LED lamp. LED lamp 201 is of a similar construction, except as mentioned above and has an emitter to produce white light instead of red-orange light.

Each of the LED lamps 201 and 218 can be used with or without a heat sink. The puddle LED lamp 201 is illustrated mounted directly to the lower surface of the overhang 203, and may be mounted using an adhesive, two-sided tape, an integral connector such as a snap connector, or any other suitable connector. The housing itself can provide a heat sink for heat generated by the lamp during illumination. The LED lamp 218 is mounted on a heat sink to significantly increase its power handling capabilities, and thus the amount of light that it is capable of emitting.

With reference to FIGS. 2 and 4-7, it is advantageous for the LED lamp 218 to be packaged as a small module 401 including a circuit board 216 and a heat sink 220. The circuit board 216 can be of any suitable conventional type, although it is preferably a rigid circuit board. The circuit board 216 includes vias 230-232 for receipt of leads 234-236. The leads 234-236 are inserted into the vias by automated equipment, such as radial insertion equipment, and then soldered, by methods such as wave soldering. Those skilled in the art will recognize that other manufacturing techniques can be used, and that the described manufacturing techniques are merely exemplary.

The circuit 1400, 1500 on circuit board 216 has components for an LED driver that protects the LED and controls the magnitude of the current input thereto. The circuit 1400, 1500 mounted on circuit board 216 will be described in greater detail hereinbelow with reference to FIGS. 14 and 15. It will be recognized that the circuit could be mounted elsewhere, such as on circuit board 212, or elsewhere on the vehicle.

The heat sink 220 is illustrated as a passive heat sink including a back wall 410 spacing a plurality of fins 246-248. The back wall spaces the fins for easier assembly and provides a thermal conduit from the heat extraction member of the LED lamp to the fins. The fins 246-248 have a large surface area to dissipate heat, which increases dissipation of heat from the LED lamp 218, thereby increasing the amount of power that can be applied to the LED lamp 218 without damaging the LED lamp, which in turn increases the amount of light that the LED lamp can produce. The heat sink can be of any suitable construction, and as will be described in greater detail hereinbelow, the heat sink can be active or passive. A passive heat sink 220, such as that illustrated in FIGS. 4-7, can be stamped from a metal or metal alloy, and preferably a metal alloy having a low thermal resistance and being light in weight. The heat sink can be manufactured from copper, brass, BeCu, aluminum, an aluminum alloy, or other metals or ceramics having good thermal conduction properties. Alternatively, active heat sinks can be employed, such as the Peltier cooler described below. The heat sink can be implemented using a phase change heat sink. It is also envisioned that in some applications, a fan could be provided to significantly increase heat dissipation.

The fastener 238, which is illustrated as a conventional screw of the type manufactured from nylon, metal or a metal alloy, physically secures the heat extraction member 400 of the lamp 218 against the heat sink 220. Alternatively, the LED lamp 218 can be attached to the heat sink 220 using a thermally conductive adhesive, an adhesive tape, or any other suitable conventional coupling means providing a thermal path from the heat extraction member of the LED lamp 218 to the heat sink 220.

As described in greater detail in the above-referenced co-pending U.S. Pat. No. 6,335,548, by providing improved thermal dissipation, the heat characteristics of the emitter, or emitters, 404 producing the radiation emitted from the LED lamp 218, are significantly improved. This is particularly advantageous in a signal mirror, as the ability to use a high power LED 218 instead of incandescent lamps or a large array of LEDs, enables implementation of a lighter signal indicator that does not consume a large volume within the mirror. High power LEDs are also advantageous in electrochromic mirrors even if there is room for a large signal indicator because brighter LED lamps permit a thicker transflective coating to be used, giving the window area of the mirror improved reflectance and sheet resistance, which can improve the performance of the mirror.

The puddle LED lamp 201 is mounted directly to the mirror housing without a heat sink in the illustrated embodiment for two reasons: the puddle light will produce enough light in low ambient light conditions without a heat sink, and the profile of the LED lamp is lower without the heat sink, allowing the mirror 222 to move freely under the lamp even without a large gap between the mirror and the mirror body housing 202. If the mirror body housing is 202 is metal, the housing itself will operate as a passive heat sink. The LED lamp 201 is connected to the connector 205, as indicated above. The connector 205 can be implemented as described in greater detail with respect to FIG. 19.

The LED lamp 218 is assembled into the mirror assembly 209 as follows. The LED lamp 218 and the circuit board 216 are mounted on the carrier 210 using an adhesive, an adhesive tape, mechanical fasteners such as integral snap connectors or screws, or the like. The surface 217 in recess 226 of carrier 210 is preferably oriented such that the LED lamp module mounted in parallel therewith will be at the desired angle with respect to the surface of mirror 222 after the mirror assembly 209 is fully assembled.

Figure 1:
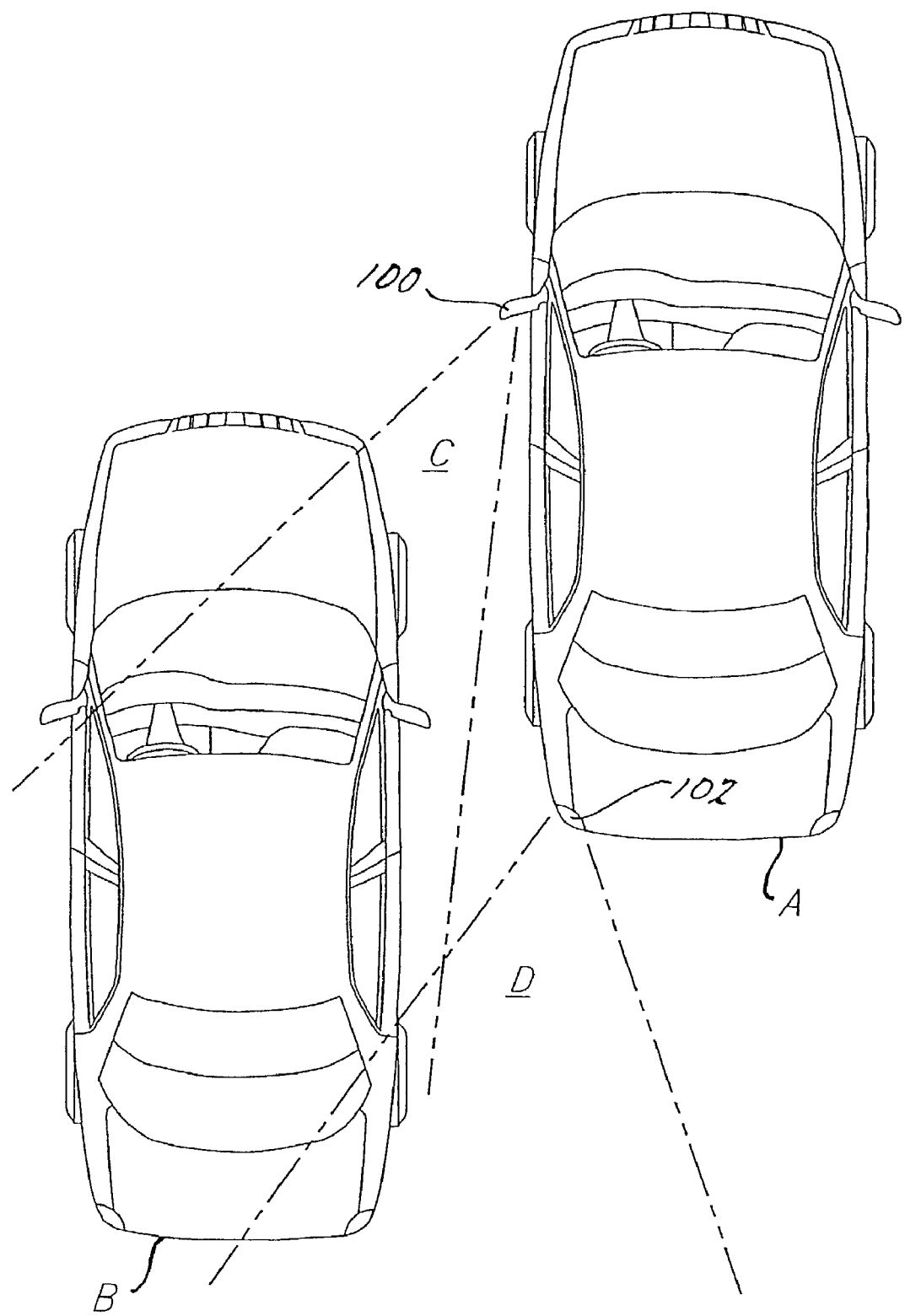
FIG. 1 illustrates two vehicles traveling in adjacent traffic lanes.

In the alternative, the heat sink 220 and circuit board 216 can be mounted to the rear surface 512 of a rear element 700, 1200 of mirror 222 using an adhesive, an adhesive tape or the like. In this alternative structure, the heat sink 220 is used as a mounting structure for supporting the LED lamp 218 on the mirror 222, and as illustrated in FIG. 5, orients the LED lamp 218 at a desired angle with respect to the back surface of mirror 222. The desired angle, α, is generally known in the art to be 0-70°, and preferably approximately 20-50° for the signal indicator to be visible in field C (FIG. 1). Because glass is a reasonably good thermal conductor, it will help dissipate heat from the heat sink. If more thermal conductivity is desired, polished stainless steel or a metal heat sink made of copper, aluminum, or the like, could be laminated to a large surface area of the glass to help dissipate heat.

The mirror subassembly 209, and in particular mirror 222, and its relationship with LED 218 to provide a signal mirror or an illuminator, will now be described in greater detail with reference to FIGS. 7-15. Because some of the layers of the mirror 222 are very thin, the scale of the mirror 222 in the figures is distorted for pictorial clarity. In addition, for clarity of description of such a structure, the front surface of the front glass element (right-most surface in FIG. 7) is sometimes referred to as the first surface, and the inside surface of the front glass element is sometimes referred to as the second surface. The inside surface of the rear glass element is sometimes referred to as the third surface, and the back surface of the rear glass element is sometimes referred to as the fourth surface.

There are two general types of electrochromic mirrors: third and fourth surface reflectors. The structure of the third surface reflector can have a wide variety of structures depending on the specific characteristics desired both for the electrochromic mirror as a whole and for the window 223 in particular. FIGS. 7 and 9-13 illustrate some of these various constructions. FIGS. 9, 12, and 13 illustrate some of the various constructions of fourth surface reflectors.

Referring initially to FIG. 7, the illustrated mirror subassembly 222 includes, from left to right: the carrier 210; optional circuit board 212; heater 214'; LED lamp 218; a rear transparent mirror element 700; a reflector/electrode 703; an electrochromic medium 706; a front transparent conductive material 708; an optional color suppression material 710; and a front transparent element 712. Preferably, the reflector/electrode material of layer 703 comprises one or more layers which may be a wide variety of metals, oxides and metal oxides, such as chromium, chromium-molybdenum-nickel alloys, nickel-iron-chromium alloys, silicon, tantalum, stainless steel, titanium nickel, rhodium, molybdenum, silver, silver alloys, platinum, palladium, gold, or combinations thereof. Further useful materials are discussed below. Reflector/electrode may have one or more underlayers 702 to improve certain characteristics, such as the bond strength to the transparent substrate 700. Mirror 222 further includes an electrochromic medium 706 disposed in a chamber defined by the reflector/electrode 703, the layer of transparent conductive material 708, and a seal material (not shown) disposed around an inner perimeter of the coatings on the transparent elements. The mirror 222 includes a layer 708 of transparent conductive material deposited on the rear surface of front element 712 (second surface) optionally having one or more color suppression under-layers 710. The transparent elements of mirror 222 are generally glass, but may be made using materials and techniques as described in U.S. patent application Ser. No. 09/311,955, entitled "ELECTRO-CHROMIC REARVIEW MIRROR INCORPORATING A THIRD SURFACE METAL REFLECTOR AND A DISPLAY/SIGNAL LIGHT," filed on May 14, 1999, by William L. Tonar et al., now U.S. Pat. No. 6,356,376, the disclosure of which is incorporated herein by reference.

As can be seen in FIG. 7, the window 223 formed in a reflective layer 704 of reflector/electrode 703 is aligned with the peak intensity optical axis 720 of lens 214 such that light emitted by LED lamp 218 will pass through window 223 and generate the indicator signal. The window 223 can be formed by any conventional means, such as laser etched using a 50 Watt Nd: YAG laser, such as that made by XCEL Control Laser, located in Orlando, Fla.; or by mechanical scraping, chemical etching, sandblasting, masking during coating, etc. The overall shape of the window can be: round; elliptical; square; directional such as an arrow, arrowhead or an array of openings together forming a directional arrow; or the like.

With reference to FIGS. 2, 3, and 7, it can be seen that the window 223 may include interleaved openings 225 and reflective strips 227. Even though FIG. 7 only shows the interleaved openings through layer 704, it will be understood that these openings may extend though one or more of the intermediate layers 703 and may extend all the way through to the transparent substrate 700. Although it is contemplated that all of the reflector/electrode may be removed from window 223 (thereby leaving no interleaved openings), such a design will cause difficulties in that there will be coloration variations in the electrochromic medium between the window areas 223 and the remaining portion of the mirror where the reflector/electrode is not removed. In portions of the electrochromic mirror away from the window 223 there is one electrochromic material oxidized at one electrode for every corresponding electrochromic material reduced at the other electrode, such that the mirror has a uniform color. However, if the window area is devoid of any reflector/electrode, the oxidation or reduction (depending on the polarity of the electrodes) that occurs on the second surface electrode 708 directly across from window 223 will occur uniformly distributed, but the reduction or oxidation on the third surface will not be uniform due to the missing electrode region. Rather than being uniform, the generation of light-absorbing species will be concentrated at the edges of the window 223 region thereby creating aesthetically unappealing color discrepancies visible to the driver. By providing reflector/electrode strips 227 in the window 223 area of the mirror, the generation of light absorbing species (at the second and third surfaces) in the window 223 area will be much closer to the uniformity seen in the other regions of the mirror having completely balanced electrodes. It is therefore preferred that there be either portions of the window that have the reflector/electrode present and other portions that do not, or that the reflector/electrode be designed in such a manner that it provides adequate conductivity for the electrochromic reactions to proceed in a uniform manner while still allowing sufficient transmission to operate as a signal mirror with LED 218.

Preferably, the window regions 225 devoid of reflective material constitute more than 50 percent of the opening along the center axis of the window 223, whereas the area 227 occupied by the reflective material can exceed 50 percent along the perimeter. The illustrated openings are elliptical (FIG. 3), but alternatively, the sides of the reflective strip edges may be straight, or have a larger radius in the center than at the ends, or the strips may not extend across the entire height of the window 223, such that the strips 227 alternately extend into the opening from the top edge and the bottom edge of the window 223. By providing reflective strips 227 that are narrower at the center of the window than at the edge, the conductive field necessary for the electrochromic function that will minimize discoloration can be provided while minimizing the obstruction of the signal beam from LED lamp 218 in the most vital zone, namely the center of the window. Optimized transmittance of the LED lamp 218 emissions can thus be achieved without detrimentally impacting the coloring of electrochromic mirror 222 in the region of window 223.

The reflectance of the mirror 222 in the window 223 may be further controlled by varying the percentage of the areas that are devoid of reflective material, e.g., varying the width of the reflective strips 227, or by varying the thickness of the reflector/electrode (discussed in more detail below). Further, the reflector electrode material used to form the reflective strips 227 in the signal light area 223 may be different from the reflector electrode material used for the remainder of the mirror. For example, a reflector electrode material having a higher reflectance may be used in the signal lamp area 223.

Figure 10:
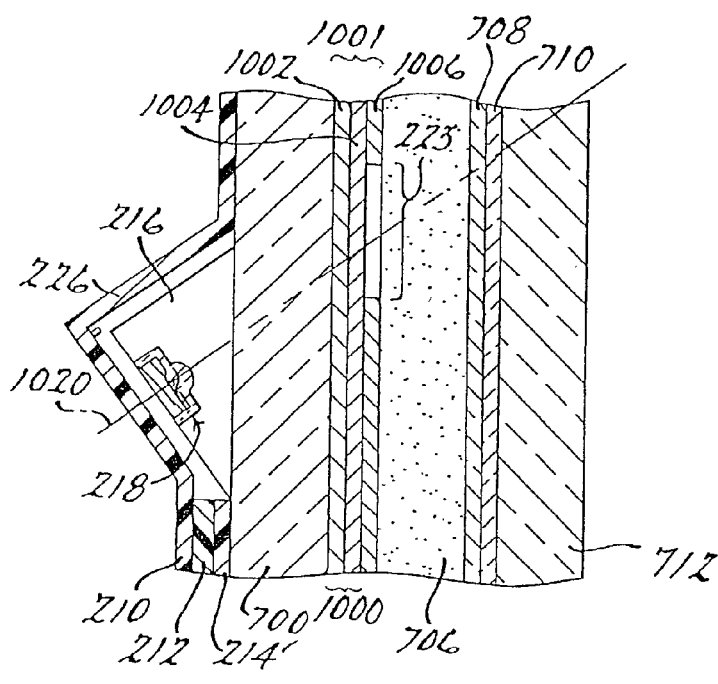
FIG. 10 is a cross-sectional view taken along plane 7-7 in FIG. 3 illustrating an alternate mirror sub-assembly.

Referring to FIG. 10, reflector/electrode 1001 need not have reflective strips, but rather can have a window 223 with a continuous layer of conductive material. For example, reflector/electrode 1001 may include a coating 1000 of a first base layer 1002 applied directly to the front surface of rear transparent element 700, and an intermediate second layer 1004 deposited on first layer 1002. First layer 1002 and second layer 1004 are preferably made of materials having relatively low sheet resistivity, and that are at least partially transmissive. The materials forming layers 1002 and 1004 may also be partially reflective. If the LED lamp 218 behind the partially transmissive window 223 must be viewed often in bright ambient conditions or direct sunlight, it may be desirable to keep the reflectivity of the window 223 area to a minimum by using metals with low reflectivity, or other dark, black or transparent coatings that are electrically conductive.

The material forming layer 1002 should exhibit adequate binding characteristics to glass or other materials of which transparent element 700 may be formed, while the material forming layer 1004 should exhibit adequate properties to bond to the material of layer 1002 and provide a good bond between an applied layer 1006 and the peripheral seal 802 (FIG. 8). Thus, the material used for layer 1002 is preferably a material selected from the group consisting essentially of: chromium, chromium-molybdenum-nickel alloys, nickel-iron-chromium alloys, silicon, tantalum, stainless steel, and titanium. In the most preferred embodiment, layer 1002 is made of chromium. The material used to form second layer 1004 is preferably a material selected from the group consisting essentially of, but not limited to: molybdenum, rhodium, nickel, tungsten, tantalum, stainless-steel, gold, titanium, and alloys thereof. In the most preferred embodiment, second layer 1004 is formed of nickel, rhodium, and molybdenum. If first layer 1002 is formed of chromium, layer 1002 preferably has a thickness between 5 angstroms and 15 angstroms. In particular, it is envisioned that the thickness of layer 1004 is selected based upon the material used so as to allow between 10 to 50 percent light transmittance through both of layers 1002 and 1004. Thus, for a second layer 1004 formed of rhodium, nickel, or molybdenum, or a combination thereof, layer 1004 is preferably between 50 and 150 angstroms. While the thickness of layers 1002 and 1004 is preferably selected to be thin enough to provide adequate transmittance, it must also be thick enough to provide for adequate electrical conductivity so as to sufficiently clear or darken electrochromic media 706 in the proximity of window 223. The layer 1006 should thus have a sheet resistivity of less than 100 Ohms/square, and preferably less than 60 Ohms/square. Layer 1002 could also be a transparent conductor, such as ITO, in which case a reflective layer can be applied over the transparent conductor layer except for the window area.

The metals used in forming coating 1000 contribute to the total reflectance of reflector/electrode 1001. Accordingly, the layer of the reflective material 1006 need not be made as thick as would be required if layers 1002 and 1004 are replaced by a single coating layer. For example, for silver or silver alloys used to form layer 1006 in the multiple electrode mirror, the thickness is between 50 angstroms and 150 angstroms, whereas the thickness of reflective layer 1006 would need to be between 30 angstroms and 800 angstroms if layers 1002 and 1004 are replaced by a single layer. By including layers 1004 and 1002, some of the costs associated with providing the reflective layer 1006 can be reduced. Further, the use of reflective metals in forming coating 1001 provides for a degree of reflectance within window 223, thereby providing a much more aesthetically pleasing appearance than if window 223 were devoid of any reflective material whatsoever. Ideally, coating 1001 provides between 30 and 40 percent reflectivity in window 223. If the reflectance in window 223 is too high, bright light will tend to wash out the signal from the lamp 218, in the sense that the sun might eliminate the contrast between the light of the signal lamp and the light reflecting outwardly from coating 1001.

It will be recognized from the above discussion that there is a trade-off between reflectance and transmittance, such that a window 223 with higher transmittance will pass more light, but will not reflect as well. Additionally, there is a trade-off between transmittance and sheet resistance, as thicker electrode layers provide lower sheet resistance. Lower sheet resistance improves electrochromic media performance both in terms of fast transition times and uniformity of color and clearing. Providing thicker electrodes thus improves sheet resistance at the expense of transmittance. Using the high power LED lamp 218, which is disclosed in detail in U.S. Pat. No. 6,335,548, a mass producible signal mirror can be achieved having a thicker reflector/electrode layer in the window area, producing better reflectance and sheet resistance, while the signal indicator still produces bright light levels visible both at night and during the day.

In addition, by utilizing the preferred lamp 218 one can, for a desired light output use thicker layers for the reflector/electrode and provide improved coloring and clearing speed and uniformity, or one can keep the reflector/electrode layer dimensions the same and provide enhanced light for signaling or illumination. By utilizing heat sinks to increase the light output, a single LED lamp 218 and window 223 can be effectively used to provide a signal mirror even in an electrochromic mirror using a transflective coating.

Figure 11:
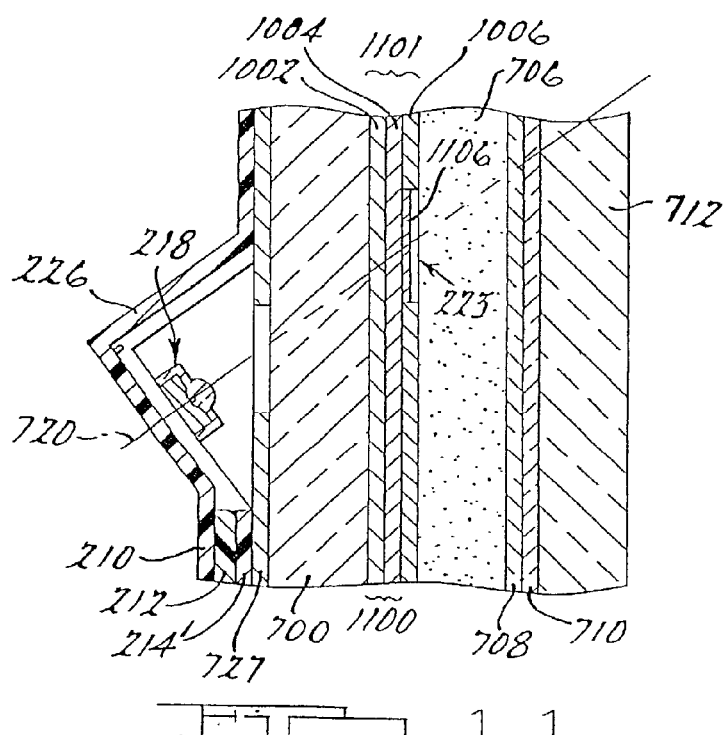
FIG. 11 is a cross-sectional view taken along plane 7-7 in FIG. 3 illustrating an alternate mirror sub-assembly.

Another alternative arrangement for the electrochromic mirror is shown in FIG. 11. The construction shown in FIG. 11 is essentially the same as that shown in FIG. 10, except that a thin silver or silver alloy layer 1106 is formed on conductive coating 1100 within window 223. By providing only a thin layer 1106 of reflective material in window 223, adequate transmittance may still be provided through window 223, while increasing the reflectivity and electrical conductivity in that area. Layer 1106 may have a thickness between 40 and 150 angstroms, whereas the layer of reflective material 1006 in the other areas of the mirror may have a thickness on the order of between 200 and 1000 angstroms. The thin layer 1106 of reflective material may be formed by initially masking the area of window 223 while applying a portion of reflective layer 1106 and then removing the mask during deposition of the remainder of layer 1106. Conversely, a thin layer of reflective material may first be deposited and then a mask may be applied over window 223 while the remainder of reflective layer 1006 is deposited. As will be apparent to those skilled in the art, the window may be formed in layer 1106 without masking by depositing reflective layer 1006 to its full thickness and subsequently removing a portion of layer 1006 in the region of window 223.

A modification of the configuration shown in FIG. 11 may be made simply by making layers 1102 and 1104 constituting conductive coating 1100 thinner in the region behind window 223. As such, thin layer 1102 may have a thickness of between 5 and 50 angstroms, whereas layer 1102 otherwise would have a thickness anywhere between 100 and 1000 angstrom. Similarly, layer 1104 may be made of the same material, but with a thickness of between 50 and 150 angstroms, while layer 1104 would otherwise have a thickness on the order of 100 to 1000 angstroms. Thus, with this alternative construction, the sheet resistance, reflectance, and transmittance within the window 223 may be optimized while enabling the sheet resistance and reflectance in the other regions to be optimized without concern as to the transmittance in the region of window 223.

Referring again to FIG. 7, a coating 721 may be any one or a combination of a light control film, a layer of black or dark paint, and a heater. A light control film, such as that available from the 3M Company under the trade designation LCF-P, may be used, which is a thin plastic film enclosing a plurality of closely spaced, black-colored micro louvers. Such a light control film is disclosed for use in a conventional signal mirror in U.S. Pat. Nos. 5,361,190 and 5,788,357, the disclosures of which are hereby incorporated by reference. As disclosed in those patents, such a light control film may have a thickness of 0.030 inch, with microlouvers spaced approximately 0.005 inch apart. The microlouvers are typically black, and are at various angular positions to provide a suitable viewing angle. Such a light control film permits light from LED 218 to be transmitted at the appropriate viewing angle to be visible in region C (FIG. 1) even if the lamp 218 is mounted parallel to the mirror surface such that the peak intensity optical axis of the lamp is orthogonal to the mirror before the light emitted thereby strikes the light control film. The light control film also serves to block the light projected from LED 218 against traveling outside the appropriate viewing angle C into the line of sight of the driver of vehicle A. The light control film may thus be placed completely over and in front of the surface of the mirror in the illumination line of LED 218. Further, such a light control film can be made using other forms of optical elements, such as holograms and the like. Alternatively, the element 721 can be a reflective grating, a prism, a holographic optical element, or the like.

If element 721 is a coating of an opaque paint, such coating would preferably not extend so far in front of the LED 218 that it blocks the transmission of light from lamp 218 through mirror 222 into viewing angle C (FIG. 1). Alternatively, such a coating of paint could extend completely in front of LED lamp 218, provided it is configured to have some form of louver or equivalent structure formed in its surface in the window 730 area, which is in the intended transmission path of LED lamp 218. For example, the thickness of such a paint coating could be controlled to create effective louvers using screen-printing, molding, stamping, or laser ablation. Further, if reflector/electrode 703 is configured in the manner described above with respect to FIG. 7, element 721 can be a coating of black paint with similar bars or stripes in the areas overlying LED 218, being oriented relative to LED 218 and reflective strips 227 of reflector/electrode 703, so as to provide a transmission path at the appropriate angle for vehicle B to view the lamp 218 emissions when in viewing angle C, while at the same time blocking light from reaching the field of view of the driver of vehicle A. Further, the bars 227 of reflector/electrode 703 may be configured to have varying minimum widths, such that the minimum width decreases with increasing distance from the driver, so as to reduce peripheral transmittance through window 223 in the direction of the driver, or may have a less pronounced edge coloration definition, as discussed above.

If element 721 is a mirror heating element, that heating element will be provided in place of the separate heater 214' described previously. By removing the heater 214' and the circuit board 212, a significant amount of weight can be removed from the mirror, which is helpful in reducing the total weight of the mirror. If heating element 721 is used, the heating element 721 can be provided on an adhesive material such as two-sided tape, and mounted extending across the entire fourth surface of the mirror except for the window 730 regions. The window regions can be provided by apertures cut at appropriate locations to pass light emitted from LED 218 and transmitted at the appropriate angle to be visible within viewing angle C.

FIG. 9 shows an alternative electrochromic mirror, having a fourth surface reflector 906, 908. In this arrangement, the electrode 904 on the third surface is preferably made of a transparent material similar to that of electrode 708 and deposited on an optional color suppression material 902, which is similar to color suppression material 710. The layer 906 is a protective paint well known in the art, which is deposited on the reflector coating 908, which, in turn, is deposited on the fourth surface of the mirror. The reflector layer can be aluminum nickel, chrome, rhodium, stainless steel, silver, silver alloy, platinum, palladium, gold, or combinations thereof. The window 223 in reflector 908 is aligned with the peak intensity optical axis of the emitter 404 and lens 214 such that the peak intensity optical axis passes through the center of the window 223. FIG. 9 shows interleaved openings 225, but it should be understood that the window 223 may be completely devoid of reflective material or may have a transflective or dichroic coating in accordance with the teachings herein.

FIG. 12 illustrates a mirror having a transparent element 1200 and a reflector coating 1202. Although the reflector coating is illustrated on the back surface of the transparent element, the coating can be on the front surface. The transparent element 1200 can be the second element of a two-element mirror, such as an electrochromic mirror, or it can be the only transparent element of a standard single element mirror. It will be recognized that in the case of an electrochromic mirror, the illustrated reflective coating is applied to the fourth surface, whereas in the case of a single element mirror, the illustrated reflective coating is applied to the second surface of the mirror. The reflective coating 1202 includes an opening 1204 through which light generated by lamp 218 passes to provide a signal indication. In either case, it is envisioned that the opening 1204 will have a maximum transmittance and no reflectance, such that the light produced by lamp 218 will pass substantially unattenuated through the reflective layer.

FIG. 13 illustrates a mirror having a dichroic layer 1302 disposed on a surface of transparent element 1200. Although the reflector coating is illustrated on the back surface of the transparent element, the coating can be on the front surface. The dichroic layer 1302 passes light within a predetermined pass band and attenuates light outside of that pass band. The advantage of using a dichroic layer 1302 in a signal mirror is that red is the preferred lamp color for signal mirrors and commercially viable dichroic layers pass only red and infrared light. There are several disadvantages to dichroic materials, not least of which is that they are expensive, difficult to manufacture, and subject to degradation over time. An opaque coating 1304, having window 223 therein, is provided in the mirror on the back surface of the mirror. The opaque coating may a paint coating, such as a black paint, and provides a baffle to block direct light emitted in the direction of the driver, which light if not blocked could be objectionable to the driver.

With reference now to FIG. 8, the mirror subassembly 800 is shown in an exploded view. It is envisioned that the mirror 222, which is illustrated to be an electrochromic mirror, but can be a dichroic or non-electrochromic mirror, will be assembled such that front transparent element 712 and rear transparent element 700 are held in a spaced-apart relationship such that the electrochromic medium is disposed there between. To assemble the other components of the mirror subassembly, an adhesive, and preferably an adhesive tape or film, or a double-sided foam adhesive tape, is provided between the circuit board 212 and the carrier plate 210, and attached over the circuit board 212. A recess 226 in the carrier plate 210 is aligned with lamp module 401 to receive the lamp module upon adhesion of the circuit board 212 to the carrier 210. The circuit board 212, as noted above, is an optional element and can be omitted. In the event that the circuit board 212 is omitted, the mirror including the heater 214' is attached to the carrier plate 210 using an adhesive, adhesive tape or film, or double-sided foam adhesive tape. The bezel 224 can be potted to the rear of carrier 210, or the bezel and rear of carrier 210 can be snap connected, attached by fasteners such as screws or clips, heat staked, or attached by other suitable conventional means. Once assembled, the mirror assembly 209 is assembled into the mirror body housing 202 by attachment to motor 208 (FIG. 2).

The LED lamp 218 is controlled either from the controller 304 or directly from the turn signal in the vehicle's electrical system. A circuit 1400 for energizing the LED lamp 218 is disclosed in FIG. 14. The circuit is mounted on circuit board 212 or circuit board 216. Circuit 1400 includes an input 207 for connection to controller 304 or the turn signal wire in the vehicle electrical system. The capacitor C1 provides a path to ground for high frequency energy, such as power spikes, to protect the circuit. Diode D1 is reverse biased to isolate input 207 if the voltage on input 207 drops below the voltage on terminal 1402. The NPN transistors Q1-Q3 and the associated resistors effect a cascode current source for the LED lamp 218. The LED lamp 218 includes two emitters 404, 404' having a common cathode connection at lead 235, and anode leads 234, 236 connected via respective resistors to terminal 1402. Although two emitters are disclosed, a single emitter, or more than two emitters, could be included in the LED lamp. The cascode current source generates a substantially constant current at the collector of transistor Q3, approximately half of which will flow through each of the emitters 404, 404'. Additionally, the circuit provides additional protection against excessive current. In particular, if the collector current of transistor Q3 is high enough for transistor Q1 to saturate, the resulting low collector voltage on transistor Q1 will turn transistors Q2 and Q3 OFF, thus cutting off current through the LED lamp 218 emitters 404, 404'. Although the circuit is disclosed including NPN transistors, it will be recognized that other transistor elements can be used, such as PNP, MOSFET or combinations of different transistors.

Figure 15:
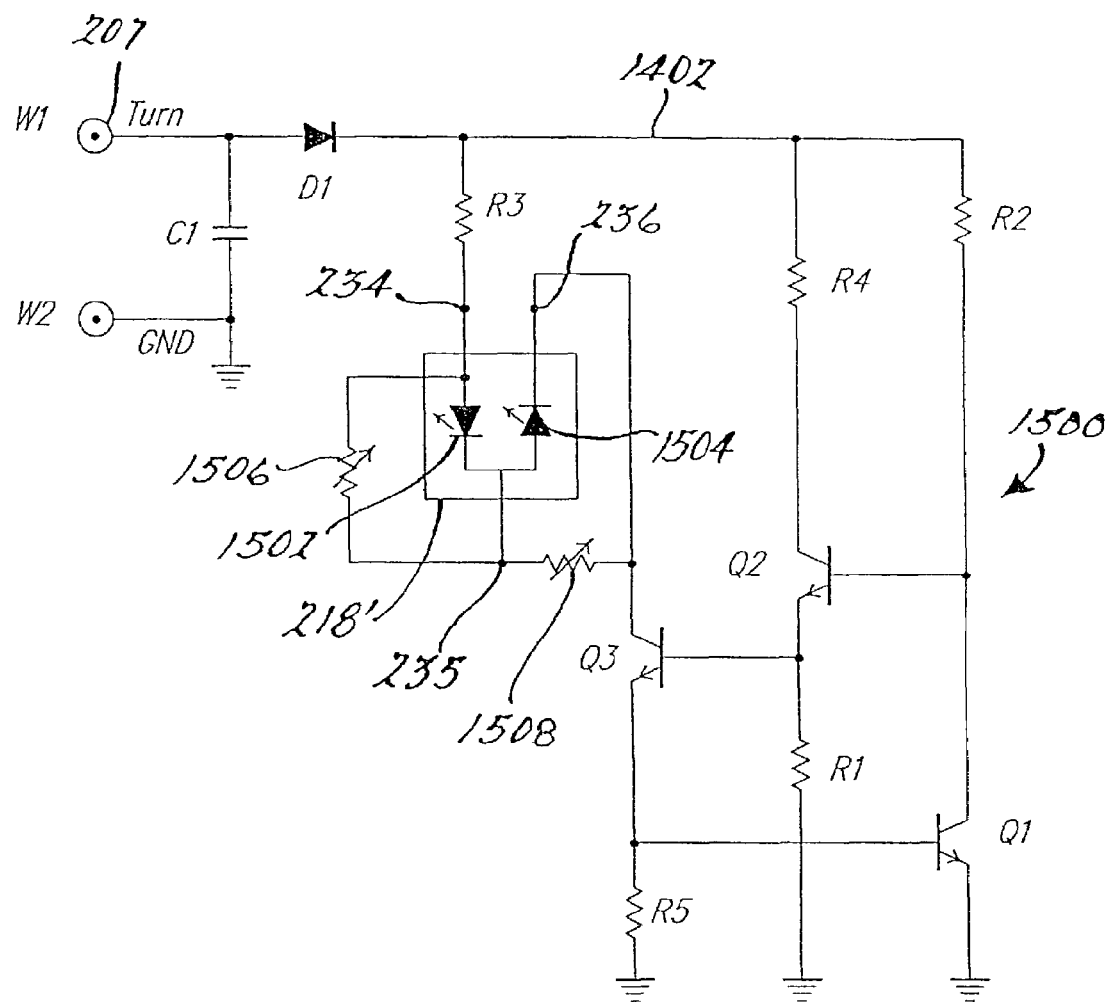
FIG. 15 is a circuit schematic illustrating an alternate lamp circuit that can be used with the lamp module according to FIGS. 4-6.

Circuit 1500 in FIG. 15 is an alternative to circuit 1400. Circuit 1500 differs from circuit 1400 in that the emitters 404, 404' of LED lamp 218' are connected in series. The anode lead 234 of emitter 1502 is connected to terminal 1402 through resistor R3, and the cathode lead 236 of emitter 1504 is connected to the collector of transistor Q3. The heat extraction member collector 235, connected to the cathode of emitter 1502 and the anode of emitter 1504, is connected to the junction terminal of the optional resistors 1506, 1508, which terminal floats. The series connection of the LED emitters 1502, 1504 in LED lamp 218' (FIG. 15) is advantageous as it uses less power than the common cathode, or parallel, arrangement of emitters 404, 404' in LED lamp 218 (FIG. 14). For example, circuit 1500 operates at 1.75 Watts, for a flashing signal having a 75 percent duty cycle and a period of less than one second, whereas circuit 1400 operates at 3.9 Watts with the same signal input.

The series emitter LED lamp 218' can include optional resistors 1506 and 1508, each connected in parallel with a respective one of the emitters 1502, 1504. The resistors 1506 and 1508 are used to reduce the current through one, or both, of the emitters 1502, 1504 of LED lamp 218' if it is necessary for the current through the emitters to be different, although only one of the resistors could be used to reduce the current through only one of the emitters. An example where it would be desirable to have different currents is an application where the LED lamp 218' is to produce white light from complementary colored emitters. In such a case, the ratio of the current through the emitters may need to be different to accommodate different operating characteristics of each of the emitters and achieve the desired LED white light. The resistors 1506 and 1508 can be manufactured by thick film deposits on the printed circuit board 216, discrete resistors attached to the heat sink, or circuit board 212 if used, which are laser etched to achieve the desired resistance. Additionally, it is envisioned that instead of resistors 1506, 1508, a controlled current source or current sink can be connected to lead 235 to control the relative current through each of the emitters, and thus adjust the color and/or intensity of the light generated by the LED lamp 218'.

In operation, when the driver moves the turn signal actuator 312 (FIG. 3) on the steering wheel column, an intermittent signal appears at the input 207, which signal is either produced by the controller 304 or by the vehicle in a conventional manner. Responsive to the pulses on input 207, circuit 1400, 1500 controls the current through the emitters of LED lamp 218, 218'. The LED lamp 218, 218' emits light during the pulses ON period and do not emit light when the pulse is OFF. The LED lamp 218, 218' is thus synchronized to the vehicle's turn signal, producing a flashing signal having the same duty cycle as the vehicle's primary turn signal lamps. It is envisioned that the controller 304 can control the LED lamp 218, 218' to repeat the brake light responsive to the brake light signal. Additionally, protection against excessive current is provided by the transistors Q1-Q3. In particular, whenever the base current input to transistor Q1 is sufficiently high to cause transistor Q1 to saturate, the resulting small collector current on transistor Q1 will turn transistors Q2 and Q3 off, which turns the LED lamp 218, 218' OFF.

Accordingly, a signal mirror is disclosed herein that can be advantageously employed with a number of different mirror arrangements. Those skilled in the art will recognize that any other electrochromic, dichroic, non-dichroic, single element, or multiple element mirror, whether convex, aspheric, or flat, may be advantageously employed with the high-powered LED signal lamp 218 to implement a signal mirror which is highly effective, small in size, and of light weight, such that a signal mirror may be designed into virtually any mirror housing with minimal impact on the mirror's principle function of providing a reflector. A number of different embodiments of the lamp module 401 will now be described, which may be used with any of the mirrors described above, to implement a signal mirror.

A first alternate lamp module 1600 is disclosed in FIG. 16. Lamp module 1600 includes an LED lamp 1601, substantially similar to the LED lamp 218 in module 401, except that leads 1602-1604 are bent to provide a planar mounting surface at the ends thereof. The surface ends are mounted on rectangular printed circuit board 1605 using any suitable conventional technique, such as wave soldering, hand soldering, or the like. The circuit board is of any suitable conventional construction, and can advantageously be a two-sided circuit board such that the LED lamp is electrically connected to a conductor layer on one side of the circuit board substrate, and circuit 1400 or 1500 is mounted to a conductor layer on the other side of the circuit board substrate. Both conductor layers have conductors etched therein, and it is further envisioned that the traces can be connected by vias (not shown). The LED lamp 1601 is secured to beat sink 220 by any suitable conventional means such as fastener 238, an adhesive, an adhesive tape, or the like. A significant advantage to the surface mount module 1600 is that surface mounting an IC is a less costly and more efficient manufacturing technique for achieving a reliable electrical connection. However, where the depth of the lamp module 1600 is a concern, lamp module 401 (FIG. 4) can be used as it has a lower height, but longer, with the LED lamp leads 234-236 extending transversely to the circuit board 216.

Another alternate lamp module 1700 is disclosed in FIG. 17. Lamp module 1700 is substantially similar to lamp module 401, differing in two respects. A first distinction is that the circuit board 1702 is illustrated to be a rectangular circuit board, as opposed to a triangular circuit board 216. It will be recognized that the circuit boards 216, 1605, and 1702 described herein can be of any shape, and thus the shapes presented are merely illustrative. It is envisioned that the shape of the circuit board will be dictated by the housing in which it is mounted, and further that the shape and size of the circuit board will be selected to accommodate the electrical components of circuits 1400, 1500 in the smallest possible volume where volume is critical. The board can be large in those components and assemblies where a large volume is available. A second distinction is that the heat sink 1704 extends across the entire bottom surface of the LED lamp 218, whereas the heat sink of lamp module 401 extends only along the tab of the heat extraction member. The partial heat sink 220 is necessary when the heat sink is mounted on the lens side of the LED. Because heat sink 1704 extends the entire length of the LED lamp, the large surface area provided by fins 1706 (only some of which are numbered) provides a substantial heat dissipation path for the one or more emitters 404 (FIG. 4) of the LED lamp 218.

Another alternate LED lamp module 1800 is disclosed in FIG. 18. Lamp module 1800 includes the LED lamp 218. The LED lamp module 1800 differs from module 401 in that the LED lamp 218 is plugged into connector 1802. The connector 1802 includes contacts 1803-1805, which electrically connect to, and mechanically engage, the distal ends 1808-1810 of leads 234 through 236. The contacts 1803-1805 are connected to a circuit 1812, having circuit 1400, 1500 thereon, which is connected to wires 1813 of the vehicle wire harness. Additionally, the LED lamp 218 is mounted to an active heat sink 1820, which is illustrated to be a Peltier cooler. The Peltier cooler can be provided by any suitable commercially available Peltier cooler. The Peltier cooler has a hot surface 1822 and cold surface 1824. The cold surface 1824 is positioned in abutting relation with the heat extraction member 400 of the LED lamp 218. The hot surface of the Peltier cooler is positioned away from the LED lamp. The Peltier cooler will preferably be connected to a passive heat sink (not shown), such as passive heat sink 1704, to provide adequate heat dissipation and to insure most effective operation of the cooler.

For maximal reliability and manufacturing/assembly flexibility, the high-power LED lamp may be constructed to optimize its compatibility with solder-less connection mechanisms such as connectors, sockets, headers and other receptacles. The ends of the leads of the high-power LED lamp, in this circumstance, are fabricated with the dimensions of a male pin intended to mate with the female socket of the receptacle. Suitable female sockets are available from such companies as Amp, Molex, Autosplice, and other connector manufacturers, in a wide variety of forms including versions which are pre-soldered to a printed circuit board and others which crimp onto the wires of the wiring harness. An example of a two lead LED lamp connection to a conventional Autosplice receptacle is illustrated in FIG. 19. The LED lamp 1900 is similar to LED lamp 218, but includes only two leads 1901 and 1903. Standoffs 1906 and 1908 of the leads 1901 and 1903 provide a stop to limit the depth of the lead insertion. The plastic connector 1910 includes metal contacts 1922, 1923 that terminate in crimps 1926, 1927, respectively. When the pins 1902, 1904 of the leads 1901, 1903 are inserted into the socket, the contacts bite into the ends of the leads to securely hold the leads 1901, 1903 in connector 1910 in a manner that prevents ready disengagement from the socket due to mechanical vibrations, stress, or the like. The wires 1930, 1931 are part of the vehicle wire harness, held in socket by crimps 1926, 1928. The wires 1930, 1931 and the contacts 1922, 1923 electrically connect the leads 1901, 1903 of the LED lamp 1900, to the electrical circuit 1400, 1500.

The lamp 1900 may simply be plugged into the chosen receptacle, obviating the traditional soldering operation usually needed to connect electrical components to a printed circuit board. This can be very useful in applications where soldering is impractical (such as in simple circuits where no printed circuit board is used) or in commercial enterprises where appropriate automated insertion equipment, such as surface, radial or axial mount equipment is not available. In one such configuration, by way of example, the narrow portion of the pins 1902, 1904 of the leads 1901, 1903 below the standoff 1906, 1908 are fabricated to have a 0.51 mm by 0.51 mm square cross-section for insertion into a standard receptacle from Autosplice, which require this size pin. Another advantage of this configuration in some applications is the dimensional tolerance afforded by this connection method. In a map light or CHMSL, for example, it would be typical for the high-power emitter to acquire its directional alignment and dimensional registration through intimate contact with portions of an assembly such as a housing or the support member. This can usually be established with snap connector features, bosses, flanges or other structures integrated with the housing or support member. This housing, with integrated registration features, may be molded by thermoplastic injection molding, for example, but manufacturing variations and environmental thermal expansion/contraction may alter the nominal dimensions and orientation of the supporting alignment and registration means, resulting in dislocation of the power semiconductor mounted thereon.

Such dislocations might be acceptable in and of themselves, as it is common to design systems that are tolerant of such minor deviations. However, these can present a problem in the most extreme cases, as any such dislocations may be transmitted to the connection point at the leads of the power semiconductor emitter. If this electrical connection is extremely rigid and brittle, as is sometimes the case with solder joints at a PCB, then the electrical connections may ultimately become marginal, or intermittent in response to the dislocations. Due to their inherent flexibility, a pin and socket configuration can avoid this problem in a fashion uniquely applicable to the LED lamp components and assemblies disclosed herein. Due to the unusually high flux emitted by these LED lamps, one or two components may now be used where an array of several LEDs was previously required. Since the number of electrical connections is radically diminished as compared to systems using prior art LED lamps, it is not necessary in every application to utilize mass connection techniques such as soldering to a printed circuit board (PCB). Due to the low connection count, it becomes feasible to use socket connections, where soldered connections were the only practical solution previously. Thus, in some of the embodiments, the LED lamp is disclosed having leads, which can be adapted for use with socket connectors to gain the uniquely applicable interconnect benefits associated with the high-power emissions of the LED lamps advantageously used herein.

Another signal mirror 2000 (FIG. 20) includes a thin transparent element 2008 bonded to a circuit board 2001 cut from commercially available printed circuit board stock. The transparent element 2008 may be the only transparent element of a single element mirror, or the second transparent element of an electrochromic mirror. The thin transparent element 2008 is adhered to layer 2006 of the circuit board 2001, which is a layer of electrically conductive material, and is preferably etched to include a heater element for the mirror. The middle layer 2004 of the circuit board is formed of a substrate material, having good electrical insulation properties, as is well known in the art. The top layer 2002 of the circuit board is another electrically conductive layer. As can be seen in FIG. 20, a hole 2012 is formed in the circuit board 2001 to receive the lens 2015 of LED lamp 2016 and provide a light path through the printed circuit board.

The LED lamp 2016 is preferably surface mounted to the printed circuit board top layer 2002, with the heat extraction member oriented in parallel with the surface of that layer and the mirror. A deviator element 2010 may be positioned between the lens of the LED lamp 2016 and the transparent layer 2008 to redirect the light emitted by LED lamp 2016 at a non-orthogonal angle, such as the approximately 20-50° angle described above. The deviator element 2010 can be provided using a suitable commercially available means such as a deviator film, a light control film such as that commercially available from 3M, a holographic optical element, a holographic diffuser, a diffractive grating, a Fresnel lens, or the like. Each of these elements can be used with the LED lamp 2016 mounted in parallel with the rear surface of the mirror and direct light in a desired direction. A reflector 2017 is positioned in the hole 2012 to increase the intensity of light emitted through element 2010.

The signal mirror 2000 takes advantage of properties of printed circuit board stock to implement a thin mirror. The chip manufacturing industry has developed technologies for providing PC boards and computer disks (CDs) that are characteristically very flat, which is highly desirable for a mirror carrier. A thin mirror using a circuit board as a carrier is disclosed in U.S. patent application Ser. No. 09/270,153, entitled "LIGHT WEIGHT ELECTROCHROMIC MIRROR," filed on Mar. 16, 1999, by John K. Roberts et al., now U.S. Pat. No. 6,195,194, the disclosure of which is incorporated herein by reference. The flatness specifications for PC boards are widely available in the industry and can be obtained from any of the manufacturers. The flatness will vary depending on the thickness and grade/quality of the purchased PC board. The PC board is selected according to the desired stiffness and weight considerations for the application.

The specifications for printed circuit boards are such that each conductor layer 2002, 2006 must provide electrical continuity over its entire surface area. A circuit connecting LED lamp 2016 with other circuitry can thus be etched in the top layer 2006 of the printed circuit board 2001. Those skilled in the art will recognize that the circuits can be cut using a subtractive process, where electrically conductive material is removed from the conductive layer using, for example, chemical or laser etching. Alternatively, the circuit layer 2002 can be added to the non-conductive substrate layer 2004 using an additive process wherein electrically conductive material is coated on the nonconductive substrate 2004. Similarly, the conductor layer 2006 can be etched to provide the heater element traces, or the conductive strips can be added by coating the substrate layer 2004.

The signal mirror 2000 takes advantage of the circuit board conductor layer 2002, which can be a copper layer, for example, to provide a heat sink for the heat extraction member 2018 of the LED lamp 2016. In the illustrated embodiment, the heat extraction member is positioned against an optional spacer 2020, which spacer must be thermally conductive. The spacer is provided to insure a thermal coupling over much of the surface area of the heat extraction member that overlaps with the conductor layer 2002, and the spacer may be any suitable material having a low thermal resistance, and may be a metal spacer, an adhesive, or any other suitable material. The heat extraction member 2018 is bonded to the spacer (if the spacer is provided by other than an adhesive or adhesive tape), which in turn is bonded to the conductor layer 2002. By attaching the LED lamp 2016 using a thermally conductive adhesive and spacer 2020, the thermal coupling to layer 2002 provides an additional, large heat dissipation surface for the LED lamp 2016.

The circuit board 2001 can include conductor traces to which the electrical leads of the LED lamp 2016 can be attached, an additional heat sink to which the heat extraction member 2018, and conductive traces in layer 2006 can provide the heater for clearing the mirror surface of moisture. This circuit board 2001 can also be used for the carrier for the mirror, and because the circuit board structure provides a strong, flat surface, the transparent element can be very thin.

FIG. 21 shows a signal mirror 2101 substantially similar to signal mirror 2000, wherein an LED lamp 2100 is mounted on the back of a circuit board 2001. The LED lamp 2100 differs from the LED lamp 2016 in that the lens 2115 of the LED lamp 2100 is offset relative to the emitter 2013, whereas the emitter 2013 is aligned with the center of the lens 2015 in LED lamp 2016. Because of the lens offset, the peak intensity optical axis of the lamp 2100 is directed at an angle β with respect to the front surface of the transparent element, whereas the peak intensity optical axis 2030 of LED lamp 2016 is directed orthogonal to the transparent element 2008. Additionally, an opaque coating 2110 can be applied to a portion of the window region of the mirror to provide a light baffle blocking the transmission of direct light from the LED lamp 218 toward the driver. The angle β can be 0° to 70°, and may advantageously be 20° to 50° and most preferably is between 30° to 40°.

In either signal mirror 2000 or 2101, although not shown, it will be recognized that the circuit 1400, 1500 can be mounted on the conductor layer 2002, and electrically connected by conductors (not shown) etched in layer 2002 to LED lamp 2016, 2100. Although not shown in FIG. 21, the offset lens 2115 of LED lamp 2100 may be used in combination with the deviator element 2010 of FIG. 20.

An alternative signal mirror 2200 including a bezel mounted LED lamp 218 is shown in FIG. 22. The signal mirror 2200 includes a bezel 2202, a mirror 2204, and a carrier 2206. The mirror 2200 can be any type of mirror, including electrochromic, dichroic, single element, multiple element, flat, convex, and/or aspheric. The carrier is of any suitable construction, such as molded of an organic polymer, stamped from a metal, or the like. The bezel may be molded from an organic polymer, stamped from metal, or of any other suitable known manufacture, and the bezel and carrier may be of the same or different material. The bezel includes an aperture 2208, which is illustrated located in the lower left corner of the mirror, but may alternately be positioned at any location on the bezel, such as the bottom center, bottom left corner, top left corner, top center, top right corner, or any location therebetween. A lens 2210, which can be clear or colored, and of any suitable construction such as molded from an organic polymer is disposed within aperture 2208. It is envisioned that the lens will be molded of a red transparent plastic, such as an acrylic or a polycarbonate, and that a red-orange LED lamp will be mounted so as to direct light outwardly therethrough. The lens 2210 is attached to the opening 2208 in bezel 2202 using a fastener, an adhesive, an adhesive tape, or the like. It will be recognized that the lens will be a filter if it is colored.

The lamp module 2220 positioned behind the lens includes an LED lamp 218, with the leads bent at a right angle for insertion into openings 2225 in a circuit board 2222. The heat extraction member 400 of the LED lamp 218 is mounted to a passive heat sink 2224. In the illustrated embodiment, the LED lamp module 2220 is mounted adjacent to mirror 2204 in a void thereof. The LED lamp 218 can be mounted in parallel with the lens, with a deviator element, such as deviator 2010, positioned between the lamp and the lens, or the lens can be a Fresnel lens, which directs light away from the driver and into viewing area C. The LED lamp module 2220 is very compact, is resistant to damage from vibrations, and can be mounted in the bezel, but generates enough light to produce a signal of sufficient intensity to be readily visible in both daylight and nighttime ambient light conditions. The module 2220 can be attached to carrier 2206 in region 2240 using an adhesive, a fastener such as tape or snap connector, or the like. The snap connector can be integrally molded in the bezel, and extend outwardly therefrom. The snap connector will snap over the lamp 218 to hold the module 2220 on the bezel. Alternatively, the region 2240 can include an integrally molded socket, and in particular a recess shaped to receive the lamp 218 and heat sink 2224, and including female connectors to mate with the leads 234-236, such that the circuit board 2222 can be omitted. The heat sink 2224 can be active or passive. Additionally, the bezel mounted LED lamp 218 can take advantage of the air flowing around the perimeter of the mirror to increase heat dissipation. This can, for example, be accomplished by positioning the heat extraction member 400 and/or heat sink 2224 in juxtaposition with the periphery edge 2232 of the bezel, which effect can be enhanced by making the bezel region adjacent the heat sink such that it has a low thermal conductivity. The low thermal conductivity can be achieved by having thermally conductive material embedded in the bezel 2202 adjacent the heat sink. The LED lamp module, including a heat extraction member coupled to a heat sink, thus provides a small lamp that will fit into a bezel, and capable of producing a bright light, and doing so in a package that can be expected to have a long life even when subject to the thermal and mechanical shocks of the type experienced in door mounted mirrors, and more particularly, around the perimeter of such a mirror.

Signal mirror 2300 (FIGS. 23-25) includes a bezel 2301 having a light pipe on one end thereof. Unlike the bezel mounting arrangement of FIG. 22, wherein the lamp 218 is mounted within the bezel to provide light directly, which may in some circumstances reduce the size of the reflective surface of the mirror, the signal mirror 2300 has an LED lamp 218 positioned behind the mirror 222 and uses a light pipe 2302 to emit the light through a surface 2304 of bezel 2301 on the front of the mirror. The LED lamp 218 inputs light at one end of a light pipe 2302, which focuses the light on an end 2304 visible from viewing area C. In this arrangement, the LED lamp 218 illuminates the bezel itself and the bezel can be very small as it need not accommodate the lamp in the perimeter thereof.

The light pipe 2302 may be of any suitable construction, such as molded from an acrylic, a polycarbonate, or the like. As illustrated in FIG. 24, the light pipe includes an integrally formed rib 2309, which extends the length of the light pipe and grips the mirror surface 327 in a friction fit. The high power LED lamp 218 is mounted to an end of the light pipe with the lens 214 directed into the light pipe. The heat sink 1704 is mounted to the back of the LED lamp 218. The LED lamp 218 electrical leads can be plugged into a connector 1802 (FIG. 18) or a receptacle 1910 (FIG. 19), which are coupled to a circuit such as circuit 1400, 1500. Such a circuit may be mounted on a circuit board that is preferably mounted internally of the connector/socket. Alternatively, the socket/connector may be coupled to an external circuit board. The mirror 222 may be aspheric, convex, flat, electrochromic, dichroic, single element reflector, or the like, and the light pipe 2302, like the bezel lamp 2220 of FIG. 22, is compatible with any type of mirror commonly used with vehicles.

The bezel arms 2312, 2314 extend substantially transverse to a bezel shoulder 2318, such that the bezel arms and the bezel shoulder provide a substantially U-shaped integral member. The bezel arms 2312, 2314 and shoulder 2318 are preferably integrally molded from an organic polymer, although they can be of any suitable conventional manufacture, it being preferable that the bezel be manufactured of a resilient material. The distal end of the top and bottom arms 2312, 2314 of the U-shaped member each includes a projecting finger 2313, 2315 to be inserted into a respective complementary bore 2319, 2321 in an opposite end of the light pipe.

To assemble the bezel 2301 to the light pipe 2302, the light pipe 2302, having the LED lamp 218 and the heat sink 1704 assembled to the light pipe 2302, is slid onto the end of the mirror 222 such that the mirror is lightly squeezed between the back of the light pipe 2302 and the rib 2309. The light pipe 2302 can be secured to an end of the mirror using an adhesive, a connector, the friction fit, or the like. The bezel top arm 2312 and bottom arm 2314 are attached to the light pipe by inserting the fingers 2313, 2315 into bores 2319, 2321. The top arm and bottom can be secured to the light pipe 2302 using an adhesive, a fastener such as tape or a mechanical connector, or the like. The bezel arms 2312, 2314, the shoulder 2318, and the light pipe 2302 form the bezel 2301, which circumscribes the mirror 222. The bezel 2301 and mirror 222 can be secured to the carrier 2316 using an adhesive.

With reference to FIGS. 26-28, a mirror 2600 includes a keyhole illuminator 2602, and an optional LED lamp 2604. The keyhole illuminator includes a high power LED lamp 2606 that produces light to illuminate the door handle 2702 and the keyhole 2704, or alternatively produces light directed toward the ground to effect a puddle lamp. The keyhole illuminator 2602 includes high power LED lamp 2606 positioned behind a window 2610. The LED lamp 2606 may include one or multiple emitters (not shown) under an encapsulant lens. The LED lamp preferably produces white light, and thus includes one or more phosphor emitters, binary complementary colored emitters, or red-green-blue emitters, which are energized so as to produce white light.

With reference to FIG. 28, the lens of LED 2608 of the LED lamp 2604 is preferably of a relatively small diameter to produce a focused light that can be targeted on an area to be illuminated. Alternatively, if the lamp is used to produce puddle light illumination, the lens will have a larger diameter producing a significantly less focused light. The keyhole illuminator may turn ON responsive to a proximity detector, a remote keyless entry, manual actuation of the door handle, turning the vehicle off, or the like, and it can turn OFF automatically after a predetermined time period has elapsed.

The keyhole illuminator is preferably provided with a reflector 2800 to concentrate the light produced by LED lamp 2606 on the side of the door around the door handle 2702 and the keyhole 2704. The reflector may be implemented using any suitable conventional construction, such as a conventional flashlight reflector construction, or the inside surface of the reflector can be provided by applying a highly reflective coating, such as chrome, to the inside surface of a rigid body, such as a molded organic polymer body, or of any other suitable construction. The reflector is held against the LED lamp 2606 by any suitable means, such as using an adhesive, a fastener, snap-fit connection, compression fit between the mirror 2601 and the LED lamp 2606, or the like. The reflector 2800 preferably circumscribes the lens 214.

The optional LED lamp 2608, if the mirror is to be a signal mirror, can be implemented as described above with respect to FIGS. 2-15. The LED lamps 2608, 2606 are small in size, such that two lamps can be accommodated between the mirror 2601 and the mirror housing body 2603. Each of the LED lamps preferably includes a heat extraction member 2814 and 2804 to increase the heat dissipation from the LED and thus increase the current capacity, and output intensity, of the LED lamps.

Another multiple lamp signal mirror 2900 is disclosed in FIGS. 29*a*-29*d*. The illustrated signal mirror 2900 includes a mirror assembly 2902, having a lamp module 401 positioned to emit light through transparent element 2906 via window 2910 in reflector surface 2908. The LED lamp 218 is connected to circuit board 216 (not shown) and includes heat sink 220. The LED lamp 218 is preferably of the type emitting red-orange light. It is envisioned that the LED lamp 218 can be attached to the carrier 2911 using snap connectors (not shown) integrally formed in the carrier 2911 during the molding thereof, an adhesive, adhesive tape, mechanical fastener such as a screw or clip, or the like. The mirror assembly 2902 including carrier 2911, mirror 2906, and LED lamp 218, is carried on the motor 208 (not shown), which is mounted to support bracket 204, and mounted within mirror body housing 2915 as described above with respect to signal mirror 100.

The mirror body housing 2915 is molded from a clear polycarbonate, or other suitable transparent material. The inside surface of the mirror has a coating 2931, which is, for example, an opaque paint that matches the exterior color of vehicle A. Those skilled in the art will recognize that this is a significantly different approach than commonly used to manufacture housings for vehicles. Typically, a housing is painted on the exterior surface to match the vehicle body color. After the paint has dried, a clear coat is applied. A significant advantage to painting the interior surface of the mirror body housing is that paint chipping or scratching will not occur when the paint is on the interior surface. The prior art is subject to chipping or scratching when flying debris strikes the surface at high velocity. Although such an occurrence may result in some minor surface damage to the mirror body housing, the surface damage can be smoothed out. An additional advantage where the mirror includes lamps to project light through the housing, windows, such as windows 2930, 2932, 2934, and 2936 need only be provided in the paint coating. For example, the windows can be formed by applying masking tape to the window regions 2930, 2932, 2934, and 2936 prior to applying the paint coating to the inside surface of the mirror housing, and after applying the paint, removing the tape leaving the window opening. The LED lamps 2920, 2922, 2924, and 2926 can then be supported on the mirror body housing adjacent the window, which will transmit light out through the transparent body housing.

The mirror body housing 2915 can advantageously be formed including one, or more, integral lens structures. For example, lenses 2933, 2935, and 2937 can be formed integrally with the transparent housing during molding of the housing, in the locations where it is desired to mount LED lamps, or alternatively, the lenses can be cut into the mirror body housing 2915 using a conventional means, such as laser etching after the housing is formed. The lenses will be described in greater detail herein below with respect to the lamps with which they are used.

An LED lamp 2920 is mounted adjacent the inside surface of mirror housing 2915 at window 2930, which is aligned with lens 2933. An LED lamp 2922 is mounted in the mirror housing body 2915 adjacent window 2932, which is aligned with lens 2935. The LED lamps 2920 and 2922 are preferably attached to the inside mirror housing using respective mounting brackets or sockets 2940 and 2944. Each of the LED lamps 2920 and 2922 can be implemented using a respective lamp module 1800, without the Peltier cooler 1820 (FIG. 18). Accordingly, each of the LED lamps 2920, 2922 includes a heat extraction member 400 (not shown) mounted directly against back wall 2942, 2945 of bracket/socket 2940, 2944, respectively. Additionally, each of the LED lamps 2920, 2922 is connected to a respective connector 1802 (FIG. 18). The respective conductors 1813 for each of the sockets 1802 associated with each of the LED lamps 2920, 2922 are connected either to the controller 304 (FIG. 3) or directly to the turn signal control for the vehicle. The circuit 1400, 1500 for each of the LED lamps 2920, 2922 is mounted in its respective connector 1802. The LED lamps 218, 2920, and 2922 are all thus connected to receive a common control signal.

In operation, the LED lamps 218, 2920, 2922 provide a turn signal repeater. The peak intensity optical axes of the three signal lamps are intentionally at substantially different angles. Substantial angles are at least 5° apart. By providing such a distribution of light, the light source has a higher visibility over a wider viewing angle than can be achieved by a single lamp. Additionally, by spacing the lamps and orienting them at different angles, in combination with using the LED having high power capabilities, from a distance the LEDs will appear to be a single light. The diffusing lenses 2933 and 2935 increase the viewing angle, and because the LED lamps 2920 and 2922 produce very bright light, this light will be visible even in low ambient light conditions.

Figure 29D:
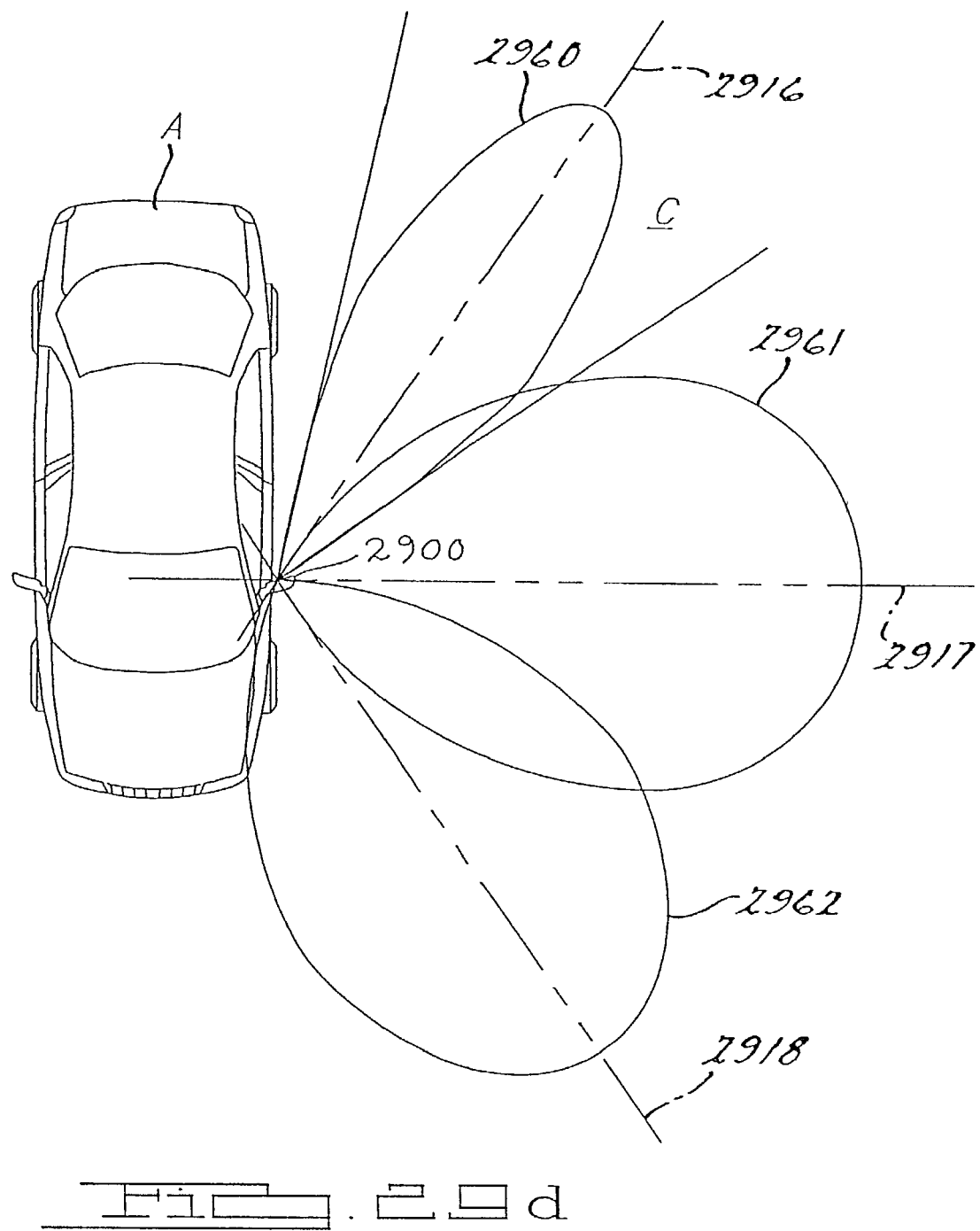
FIG. 29d is an iso-candela plot of the mirror according to FIGS. 29a-29c.

More particularly, FIG. 29d shows an iso-candela plot for the LED lamps 218, 2920, and 2922 relative to a vehicle A. As can be seen therein, the LED lamp 218 produces light intensity distribution 2960 around peak intensity optical axis 2916, which is readily visible within viewing angle C. The LED lamp 2920 produces light that is dispersed by lens 2933 resulting in a broader intensity distribution 2961 around peak intensity optical axis 2917. The LED lamp 2922 similarly produces light that is dispersed by lens 2935 resulting in a light intensity distribution 2962 around peak intensity optical axis 2918. In these iso-candela plots, the line 2960 represents points at which the intensity of light emitted by LED lamp 218 are equal. Similarly, the line 2961 represents points at which the intensity of light emitted by LED lamp 2920 is equal. The line 2962 represents points at which the intensity of the light emitted by LED lamp 2922 is equal. It will be recognized that the iso-candela plot for the combined LED lamps would be different as the light from the lamps would be added. Nevertheless, as can be seen from the distribution, LED lamps 218, 2920, and 2922 produce a light distribution that is visible from 180° around the mirror. This distribution can be achieved without LED lamp 2922 using slightly different optics or moving the LED lamp 2922 toward the back of the mirror body housing 2915. Additionally, if desired, the LED lamp 218 can be a low power LED lamp or an array of LED lamps that emit light through a plurality of openings or a dichroic mirror. Additionally, more than two LEDs can be used on the mirror housing body. However, the high power LED having a heat extraction member disclosed in U.S. Pat. No. 6,335,548 enables a single LED on the mirror body housing to be used with a lamp in the mirror to provide a signal repeater visible from a wide angle array, meeting the legal requirements for signal repeaters in countries requiring a wide viewing angle.

The LED lamp 2924 is mounted on the front of the mirror body housing 2915, and faces forwardly of the vehicle to produce high power infrared (IR) light for a communication system or a camera system. The lamp is positioned to emit light through the front window 2934 of mirror housing 2915. The IR LED lamp 2924 can produce IR light usable by an onboard camera during low ambient light conditions, and the strong IR emissions will increase the range of the camera. Another advantageous use is in IR transceiver applications such as IR communication systems, wherein the intensity of the IR radiation will directly impact communication signal quality, and thus the reliability of the communication link. An exemplary vehicle application using the high power LED where reliable communication signal quality is important is the drive-through tollbooth wherein a toll payment is made without stopping. Using a high power LED lamp increases the range of the IR link and makes communication more reliable, increasing the amount of time that the vehicle can be in communication with the toll collecting equipment and significantly decreasing the chances that toll collection does not occur.

The LED lamp 2926 is mounted flush on window 2936 in the bottom surface of the mirror body housing 2915. The LED lamp 2926 is a puddle lamp producing light directed downwardly to illuminate an area below the mirror, and preferably adjacent the door of vehicle A. This LED lamp is preferably a high power, white light LED, and most advantageously an LED lamp having a heat extraction member positioned against a heat sink 2950. The LED lamp 2926 abuts with the inside surface of housing 2915 aligned with the lens 2937. The lens 2937 is a large radius lens producing a wide illumination area. The LED may be mounted to the inside surface of the mirror housing body using a transparent adhesive.

Each of the lamps 2920, 2922, 2924 and 2926 is mounted to a bracket 2940, 2944, 2946, 2948 that is in turn mounted to the inside of mirror body housing 2915. The mounting bracket or sockets 2940, 2944, 2946, 2948 are attached to the inside surface of the mirror housing body using an adhesive, mechanical fastener such as a snap connector integrally molded with the mounting bracket or the mirror body housing 2915, or the like. The mounting bracket can be molded from an organic polymer, stamped from a metal or metal alloy, or manufactured by any other suitable means. In the illustrated embodiment, the back walls 2942 and 2945 are thermally conductive, but not electrically conductive. It is envisioned that where the brackets are molded from a dielectric material, a thermally conductive material can be interspersed in the nonconductive material so as to provide a thermal path therethrough. For example, the plastic bracket can be impregnated with metal fragments, such as pieces of copper. The bracket, or socket, 2948 can include a hole through which a heat sink 2950 protrudes. The heat sink is preferably implemented using a heat sink 1704 (FIG. 17).

The bracket/sockets 2940, 2944, 2946 and 2948 provide an enclosure that seals the LED modules against moisture, dirt, and the like. Additionally, the bracket/sockets can be opaque to prevent ambient light from passing from the inside surface through the windows 2930, 2932, 2934 and 2936 such that it is visible from the exterior of the mirror. The bracket/sockets are mounted to the interior surface of the mirror housing using an adhesive, adhesive tape, a fastener, or any other suitable means.

In operation, the LED lamps 218, 2920, and 2922 for a turn signal repeater that reproduce a flashing light in signal with the primary turn signal on the vehicle. The turn signal repeater can optionally be illuminated with a steady light to repeat a brake light on the vehicle if desired. The LED lamp 2924 can be connected to an IR communication system associated with vehicle A to provide a high power IR transmitter. The heat extraction member and the heat sink enable the IR transmitter to produce a very strong communication signal. Finally, the puddle light in the housing can be used in place of, or in addition to the puddle LED lamp 201 (FIG. 2). The puddle lamp thus turns ON responsive to a proximity detector, a remote keyless entry signal, manual actuation of the door handle, turning the vehicle off, or the like, and it can turn OFF automatically after a predetermined time period has elapsed.

Figure 30:
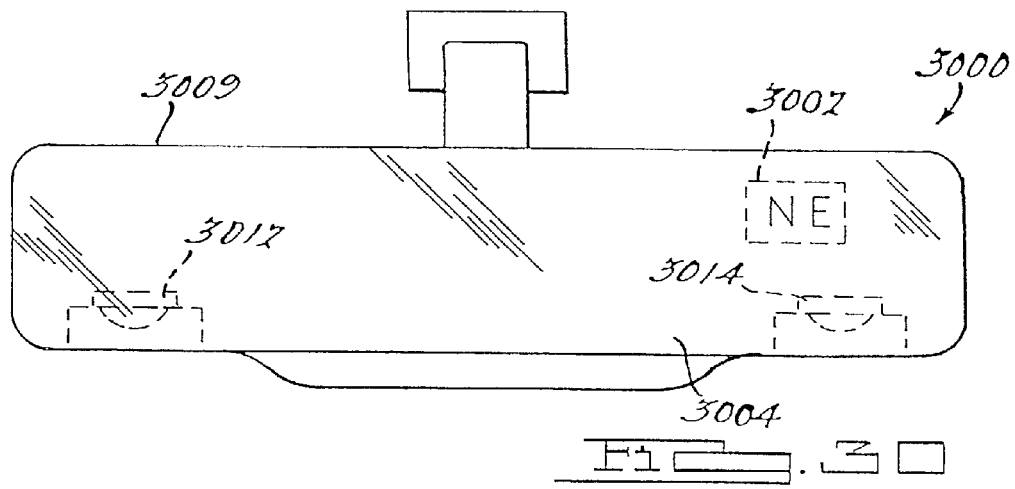
FIG. 30 is a rear elevation view of an interior rearview mirror illustrating another embodiment of a signal mirror.
Figure 31:
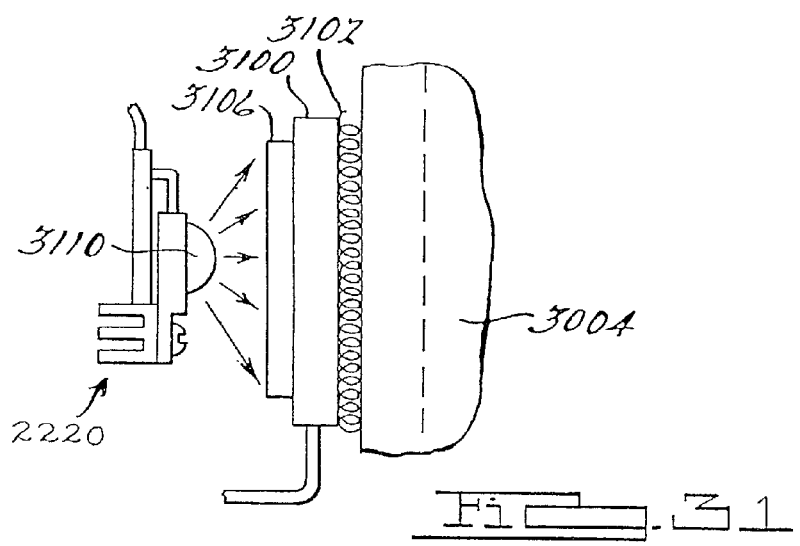
FIG. 31 is a side elevation view schematically illustrating a back lit panel in the mirror according to FIG. 30.

An interior signal mirror 3000 is disclosed in FIGS. 30 and 31. The interior signal mirror 3000 is of the type producing compass heading information in window 3002 of an electrochromic mirror 3004. For example, the display 3002 may generate signals indicating whether the vehicle is heading N, S, E or W, or combinations thereof such as the illustrated NE, which is northeast. The electrochromic mirror can be implemented using any suitable electrochromic mirror. The images on display 3002 may be generated by a backlit liquid crystal display (LCD) 3100 (FIG. 31), which is, for example, a reverse mode addressable LCD. The LCD is controlled to generate images by acting as a shutter to selectively block the passage of light therethrough. The backlighting is thus used to project a bright light in those areas where the LCD does not attenuate light. The LCD operates in this manner to generate graphic images, alphanumeric images, and even pictorial or video images.

Figure 32:
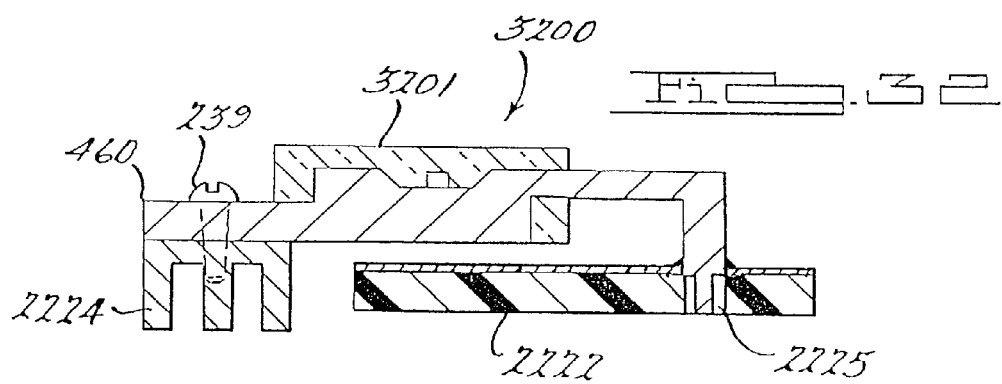
FIG. 32 is a cross-sectional view taken along the center of the lamp module according to FIG. 31 but having a flat lens surface.

The LCD is mounted to the back surface of the electrochromic mirror element 3004 using a transparent optical coupling medium 3102. In particular, the optical coupling medium is a clear pressure sensitive adhesive (PSA), such as that commercially available adhesive number 4910 from 3M, ultraviolet (UV) cure silicone or epoxy, or thermoplastic PVB laminate having a refractive index of approximately 1.5, which is substantially matched to the refractive index of the third surface transparent member 3004. A transmissive diffuser 3106 is optionally mounted behind the LCD to diffuse the light produced by high power LED lamp 2220. This permits positioning of the LED lamp 2220 close to the LCD panel 3100, which is necessary where the mirror 3000 does not have much depth behind the LCD panel 3100. The LED lamp 2220 can have a lens 3110 with a large radius. Alternatively, a flat lens LED lamp 3200 (FIG. 32), which will produce scattered light due to the wide beam resulting from flat surface 3201, can be used to illuminate the LCD. As mentioned above, it is envisioned that the lens will have a very large diameter, such that the lens provides some focusing of the radiation emitted thereby, but still disperses the light over the entire area of the LCD panel 3100. Combining such relatively unfocused light with a mild diffuser 3106 will insure that the entire area of the LCD panel is illuminated and that the image produced will be bright and easily viewable even through an electrochromic mirror including a transflective window.

The mirror 3000 can advantageously include map lamps 3012 and 3014 located on the bottom of the mirror to illuminate the front seat of the vehicle A. The map lamps are advantageously implemented using a high power LED having a heat sink which can be mounted in a vary small volume inside the mirror housing 3009. In particular, the map lamp 3014 can be implemented using a non-prismatic optical assembly according to U.S. patent application Ser. No. 09/109,527, entitled "OPTICAL ASSEMBLY FOR SEMICONDUCTOR LIGHTING DEVICE ILLUMINATOR," filed on Jul. 2, 1998, by John K. Roberts et al., now abandoned, the disclosure of which is incorporated herein by reference. Map lamp 3012 can be implemented using the prismatic optical assembly disclosed in U.S. patent application Ser. No. 09/109,527. Most preferably, the optical assemblies are modified to accommodate to LED lamps with heat extraction members as described below with respect to FIGS. 41 and 42.

Figure 33:
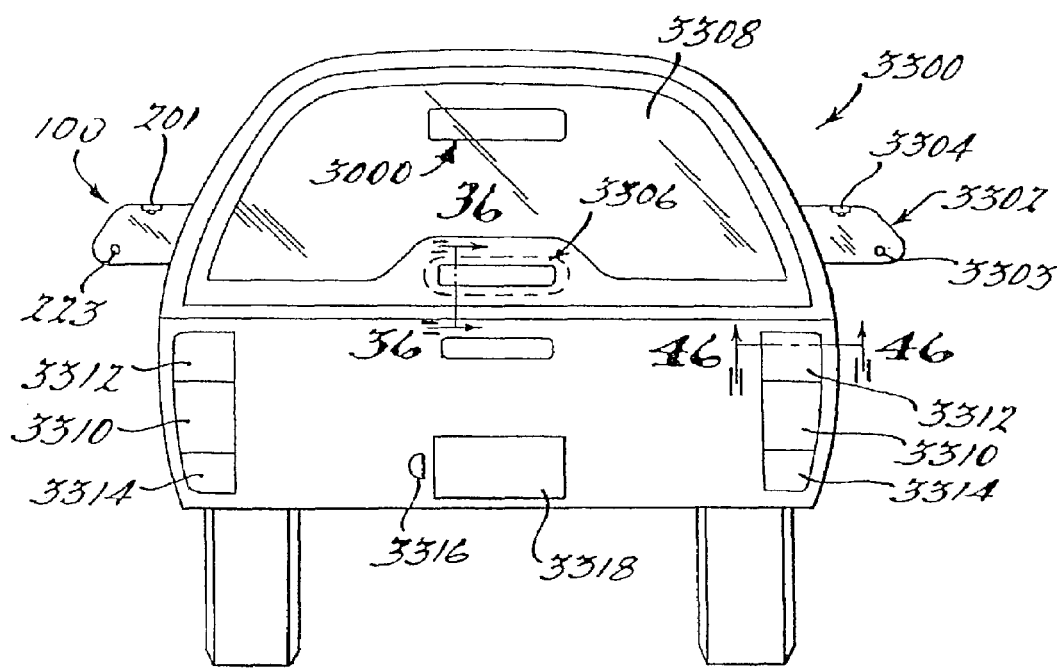
FIG. 33 is a rear elevation view of a vehicle.
Figure 34:
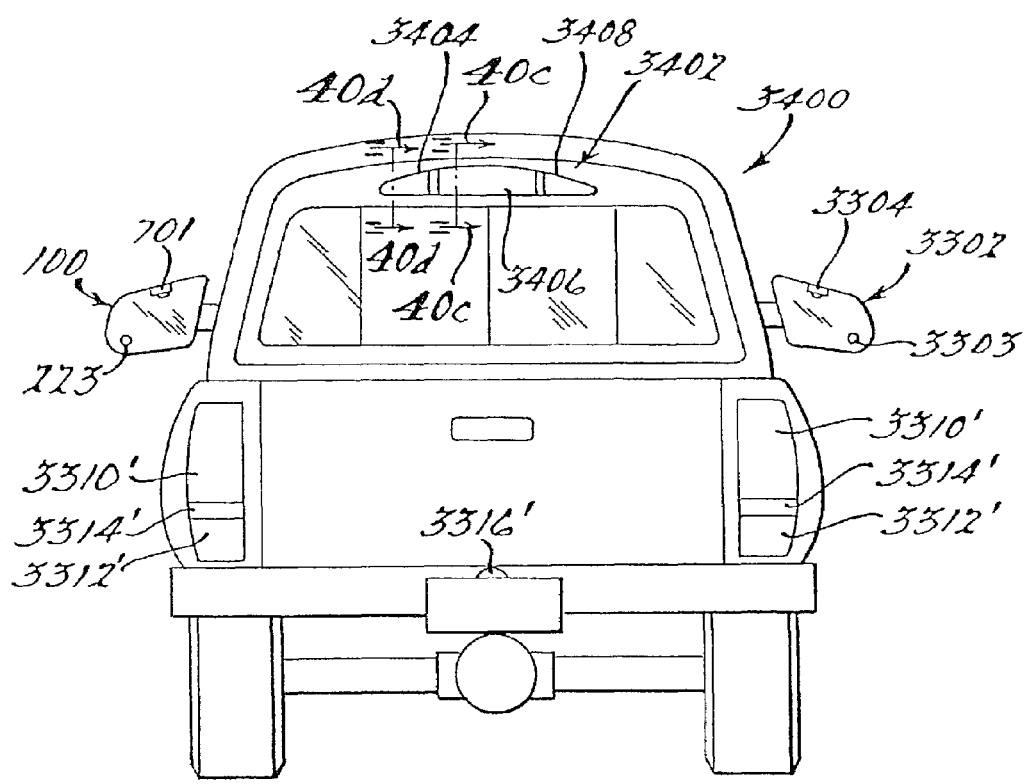
FIG. 34 is a rear elevation view of a vehicle.

Some additional components and assemblies for vehicles will now be described with respect to a vehicle 3300 illustrated in FIG. 33 and a vehicle 3400, illustrated in FIG. 34. The vehicles include a large number of lamps, any of which can advantageously employ an LED lamp having a heat sink to produce a brighter light than can be produced with conventional LEDs. In particular, the vehicle 3300 includes a driver side signal mirror 100 and a passenger side signal mirror 3302. The driver side signal mirror 100 is described in detail, in various embodiments, herein above, and includes a puddle lamp 201 and window 223 through which an LED lamp emits light. The passenger side signal mirror 3302 can be implemented using a conventional passenger side mirror, such as an aspheric mirror, and additionally includes a signal lamp window 3303 for passage of emissions from an LED lamp and a puddle light 3304. The LED lamps and window 3303 of signal mirror 3302 can be identical to LED lamp 218, 201 and window 223 of signal mirror 100. A CHMSL 3306 is illustrated located on the rear of the vehicle mounted adjacent the rear window, although it could be located to emit light through the rear window 3308, or on the trunk or rear fin in the case of a car. It will be recognized that the CHMSL using the heat sink LED lamps is uniquely able to produce from only a few LED lamps a bright light having a desired light pattern even through privacy glass of the types currently used in vehicles, which glass detrimentally attenuates the light from less powerful lamps. A rearview mirror 3000 is positioned inside the vehicle and mounted in a conventional manner such as being affixed to the vehicle windshield or the headliner. The vehicle also includes tail lights/stop lamps 3310, turn signal lamps 3312, and back up lights 3314. A license plate illuminator 3316 is positioned on the rear hatch adjacent the license plate 3318. A vehicle 3400 includes signal mirrors 100, 3302, brake lights 3310', turn signals 3312', back up lights 3314', and a CHMSL 3406. The vehicle also includes cargo lights 3404 and 3408 to illuminate the bed of the vehicle (the illustrated vehicle 3400 being a pick up truck), and as illustrated, the CHMSL 3406 and cargo lights are integrated into a lamp assembly 3402.

More particularly, as shown in FIG. 15, the CHMSL 3306 includes housing 3500. The housing is illustrated as an elongated box, but can be configured in any shape desired by the vehicle designer. The housing 3500 can be of any suitable conventional manufacture, such as molded of an organic polymer. The LED lamps 3502-3505 are mounted on a printed circuit board 3506 that is mounted on housing 3500 using a mechanical fastener, an adhesive, or any other suitable mechanism. An optional member 3508 is illustrated as a rectangular substantially flat opaque shroud shaped to extend over the entire opening of the housing except for the lens portion of the LED lamps 3502-3505. Member 3508 may, for example, be a molded black plastic piece, a paper product, or optionally a reflector of a manufacture similar to that used to manufacture a flash light reflector positioned around the flash light lamp. If the member 3508 is a reflector, it will be recognized that member will be shaped so as to reflect light from the LED lamps 3502-3505 forwardly through a lens 3509. Lens 3509 is positioned on the housing and extends over the opening therein to operate with the LED lamps to create a desired light pattern for the CHMSL as described in greater detail hereinbelow. The lens can be manufactured from clear or colored material and may be, for example, a red transparent acrylic or polycarbonate.

With continued reference to FIG. 35, the LED lamps 3502-3505 are preferably high power LED lamps of the type including a heat sink. Each of the LED lamps 3502-3505 can advantageously have one or more red-orange emitters (e.g., 3604 in FIG. 36) on a heat extraction member 3510-3513. The emitters for each LED lamp are positioned to radiate light through a lens 3514-3517. The lens has a radius of curvature that produces a moderately focused light beam. The heat extraction member 3510-3513 of each LED lamp is positioned on a respective heat sink 3520-3523. The heat sinks can be etched out of a conductive layer of the circuit board 3506 using conventional circuit etching techniques, particularly where the circuit board has conductive layers on both sides thereof, or the heat sinks can be formed by coating the circuit board substrate to form a thermally conductive plate on the exterior surface of the dielectric substrate. The electrical leads 3525-3527 (only numbered for one of the LED lamps to reduce clutter in the drawing) of the LED lamps 3502-3505 are bent to extend through vias in the circuit board 3506, and are electrically connected to circuitry surface mounted to the back of the circuit board 3506. The leads 3525-3527 are electrically coupled to the circuit components by circuit traces etched in the conductive layer on the back of the circuit board by conventional means.

The lens 3509 is preferably a large radius cylindrical or aspheric surface. The lens can be colored or clear.

To assemble the CHMSL 3306, the circuitry 3612 (FIG. 36) and the LED lamps 3502-3505 are mounted on opposite sides of board 3506. In particular, the exposed surface of the heat extraction member on the underside of each of the LED lamps 3502-3505 is in juxtaposition with a respective heat sink 3520-3523 on the printed circuit board, and the leads 3525-3527 for each lamp are soldered onto the board. The circuit board is snapped into the connectors 3600, 3602, two of which are shown, but it will be recognized that more than two connectors can be provided, the actual number depending on the rigidity and size of the board. The shroud 3508 is preferably resilient, such that it can be bent slightly and inserted between projecting tabs 3614 and 3616 and when released is held by the tabs in the housing. A respective opening 3536-3539 is aligned with each lens 3514-3517 to pass the light produced by the LEDs. The optional lens 3509 is mounted to the housing 3500 using a mechanical fastener, a snap connection, an adhesive, or the like. The lens closes the housing, providing some environmental protection against bugs and dirt.

The CHMSL requirements for candelas emitted at different angles is represented by FIG. 37. The center, C, is at 0°, 0° on the chart, and represents the candelas emitted straight out from the center of the CHMSL. The center cross represents the candelas emitted 5° upwardly and 5° downwardly of center, and 5° to the left and 5° to the right of center. The U-shaped area to the left includes the points 5° left and 5° down, 10° left and 5° off center, 10° left, 10° left and 5° up, and 5° left and 5° up. The U-shaped area to the right of the center cross includes the right hand points corresponding to the left-hand points. The ribbon across the top includes points 10° upwardly from center at 5° intervals from 10° left to 10° right. The number at each axis of the chart represents the required candelas emitted in each direction, and the actual emission must be at least 60 percent of the number given for each point. Thus, the emissions in a direction straight out from the center of the CHMSL must be at least 15 candelas. An additional requirement is that the sum of area 1 must be at least 125 cd, the sum of points within area 2 must be greater than 98 cd, the sum of points in area 3 must be at least 98 cd, and the sum of points within area 4 must be at least 32 cd. An additional requirement is that the minimum area of the CHMSL must be at least 4.5 in.$^2$. A third requirement is that the total output is no more than 130 cd at an angle greater than 0.25° from any of the measuring points in the field extending from 10° up to 5° down, and 10° left to 10° right. Maximums are measured within 60 seconds of an "ON" event within a temperature range from 18° of 38° C. Minimums are measured at thermal equilibrium or 30 mins, whichever occurs first, with ambient temperature within a temperature range from 18° to 38° C.

Figure 38:
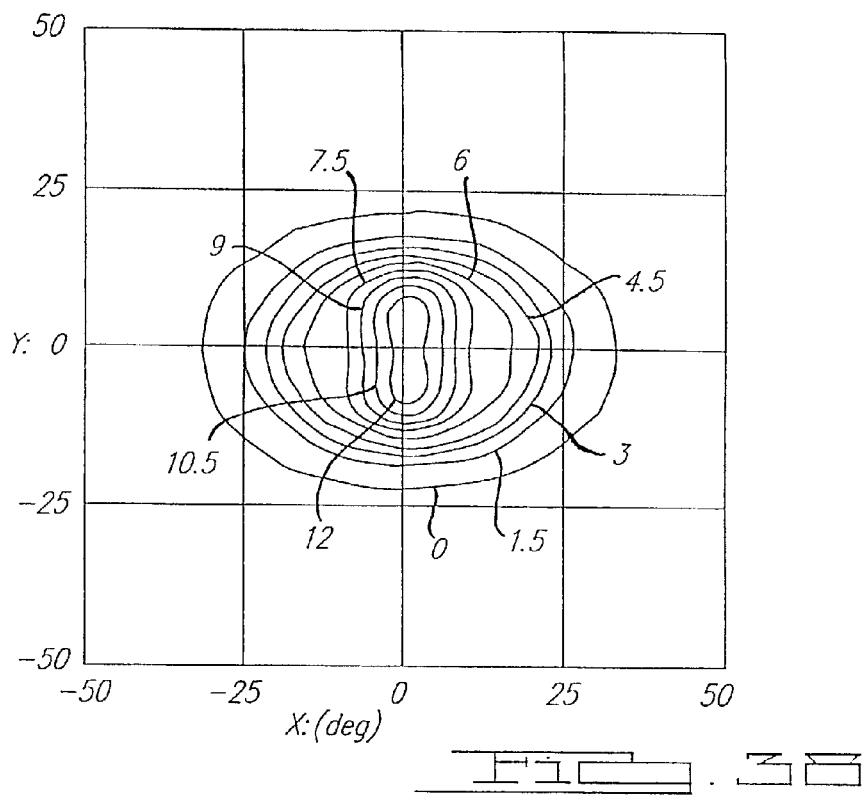
FIG. 38 is a rectangular iso-candela plot of a red-orange chip LED lamp including a heat extraction member.
Figure 39:
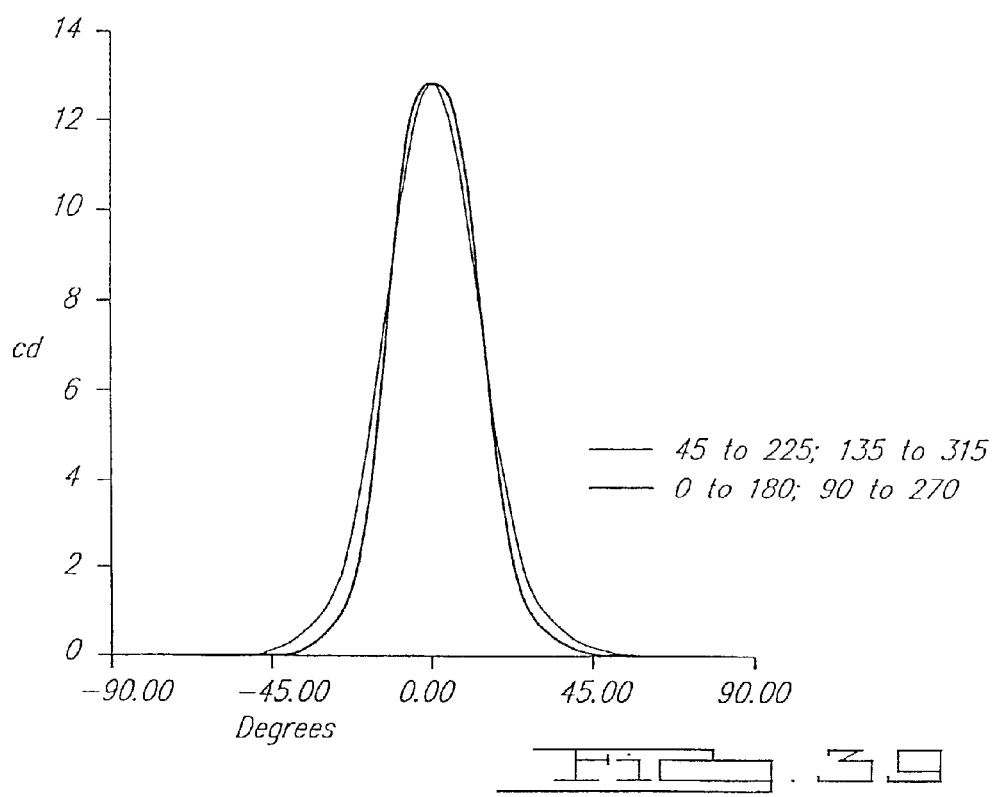
FIG. 39 is a rectangular candela distribution plot of the LED lamp according to FIG. 38.

A iso-candela emission plot using a dual red-orange chip LED lamp implemented according to U.S. Pat. No. 6,335,548, which is incorporated herein by reference, is set forth in FIG. 38. In particular, the lens has a radius of 2.5 mm, the center 0.4 mm below the top of the body curve, the aperture is 4.9356 mm at the top of the body cube, the body cube is 3.8 mm high, and the distance from the top of the chip to the base of the lens is 2.77 mm. The illumination profile of this LED lamp is illustrated in FIG. 39. As can be seen from FIGS. 38 and 39, the focused output is directional. Having an intensity of approximately 13 cd at a viewing angle of 0° and falling off to 0 cd at angles over 45°. The intensity is approximately 8 cd at an angle of 10° to the left or right. The intensity is approximately 11 cd at an angle of approximately 10° up. Because the output of the LED lamps will be additive, it can be seen that a pair of such LEDs can be used to produce the required CHMSL signal intensity. The LED lamp was mounted on a circuit board, with the top layer of the circuit board providing the heat sink. Providing four LEDs thus enables redundancy and permits a significant amount of flexibility in the CHMSL implementation. In particular, the power supply to the LED can be reduced, single chip LEDs can be used instead of double chip LEDs, and the CHMSL having only four LED lamps can be positioned behind dark privacy glass and still produce the required light intensity.

With reference to FIG. 40*a*, the CHMSL and cargo lamp assembly 3402 (FIG. 34) includes circuit board 4000 in housing 4002. The LED lamps 4004 and 4005 provide the illumination for the left side cargo lamp 3404. The LED lamps 4006-4009 provide the illumination for the CHMSL 3406. The LED lamps 4010 and 4011 provide the illumination for the right side cargo lamp 3408. Each of the LEDs can be implemented using an LED lamp having a heat extraction member. The LED lamps are mounted in the same manner as described above with respect to CHMSL 3306 (FIG. 35), each of the LED lamps having a heat extraction member positioned on a heat sink 4020-4027 located on a surface of the printed circuit board. The LED lamps 4004, 4005, 4010, and 4011 preferably direct light downwardly toward the bed of vehicle 3400 (FIG. 34), whereas the CHMSL LED lamps emit light as described above with respect to FIG. 37. It is envisioned that this downwardly directed illumination will be provided using optical means where the cargo light LED lamps 4004, 4005, 4010 and 4011 are mounted in parallel, such as on a common circuit board with the CHMSL lamps 4006-4009. An example of an optical assembly that can be used will be described with respect to FIGS. 41 and 42.

Another mounting arrangement that can be used for LED lamps 4004-4011 and LED lamps 3502-3505 is disclosed in FIG. 40*b* and will be described with respect to LED lamp 4004, although the other LED lamps can be mounted in the same manner. This arrangement includes: a heat sink plate 4030; an electrical insulator layer 4032; circuit board 4001' having a dielectric substrate layer 4036 and a conductor layer 4034; and a thermally conductive, electrically nonconductive layer 4038. The circuit board 4001' in this arrangement includes a hole cut at the mounting position for each of the LED lamps 4004-4011. Each of the holes is preferably larger than the heat extraction member 4040 of each of the LED lamps. Each of the LED lamps is mounted to the circuit board on an electronically non-conductive side thereof, with the leads bent 90° for insertion into vias in the circuit board. The leads are electrically connected to conductors in the conductor layer 4034 of the PCB 4000', which conductor layer is formed by etching a conductor layer or application of conductive ink, or application of a conductive coating, or the like. A layer 4038 of resilient, thermally conductive, electrically nonconductive material is inserted into the opening under the LED lamp. The layer 4038 can be provided using a preformed thermal coupler such as a silicon based, cut resistant material commercially available from Bergquist, and identified as Silipad 600. Two sides of the material can have an adhesive applied thereto, such that it sticks to the LED lamp and the circuit board. Additionally, a nylon screw (not shown) can be inserted through the heat extraction member and the board, and tightened using a bolt (not shown). Where the board is 0.062 inch thick and the Silipad is 0.009 inch thick, the bolt and screw can be used to squeeze the LED lamp, the layer 4038, and the plate into engagement. The thermally conductive material can include a thermally conductive adhesive coating to bond the layer to the heat extraction member 4040.

An electrical insulator layer 4032 is coated on the heat sink plate 4030, at least in those regions of the heat extraction member that would otherwise contact the circuit board conductive layer 4034. The insulating coating can be any suitable dielectric, and may be, for example, porcelain, powder, a suitable polymeric adhesive, or the like. Although the hole in the board, and the heat extraction member, are preferably larger than the heat extraction member 4040, to provide the maximum amount of heat transfer through the board to the plate 4030 so they can be made smaller. A smaller opening could be provided to permit mounting of the LED lamp extraction member to the surface of the circuit board, for example.

Another alternative mounting arrangement for the LED lamps 4004-4011 and LED lamps 3502-3505 is illustrated in FIGS. 40*c* and 40*d*. This alternate mounting arrangement is described with reference to the CHMSL and cargo lamp assembly 3402. It will be recognized that the arrangement of FIG. 40*c* is applicable to the CHMSL lamps 3502-3505 and 4006-4007, whereas the arrangement of FIG. 40*d* effects the downwardly projecting illumination desired for LED lamps 4004, 4005, 4010, and 4011. In this alternative mounting arrangement, the circuit board 4060 is mounted in housing 4002 generally orthogonal to the CHMSL LED lamps 4006-4009. The leads 4041, 4041', 4043, 4043', 4045, and 4045' (FIG. 40*a*) (numbered only for lamp 4004 and 4006 to improve drawing readability) of the LED lamps 4004-4011 can thus be inserted into the boards using conventional automated radial insertion equipment. As illustrated in FIG. 40*c*, the LED lamps 4006-4009 are mounted to a heat sink 4070 using suitable adhesive, such as a thermally conductive adhesive. The heat sink is supported on housing 4002 by legs 4072, 4074. The legs are attached to housing 4002 by feet 4076, 4078, which may be mounted using any suitable conventional means such as a fastener, an adhesive, or the like. The heat sink is of any suitable construction providing a thermally conductive planar member, such as stamped from a metal, and may be copper, aluminum, an aluminum alloy, or the like.

The cargo light LED lamps 4004, 4005, 4010, and 4011 are mounted at a downwardly directed angle as illustrated in FIG. 40*d*. The downwardly directed angle is provided by bending the leads 4041, 4043, 4045 such that the LED lamps can be focused on the bed of the vehicle 3400. The LED lamps 4004, 4005, 4010, 4011 include a heat sink 4080 mounted directly thereto, and are supported on a reflector 4082 used to focus light on the desired illumination region of the bed of vehicle 3400. The reflector can be of any suitable construction, such as a molded organic polymer having a chrome coating, or a conventional construction such as those used to make flashlight reflectors. As can be seen, the LED lamp and the reflector are directed downwardly. The reflector can be mounted to the LED lamp encapsulant, the housing 4002, and/or the lens 3509', and such mountings can be made using an adhesive, an adhesive tape, a mechanical connector, or the like.

The lens 3509' is implemented using a large radius, cylindrical or aspheric, member transparent at the wavelength of interest, and may be a clear transparent element across its entire length if the LED lamps 4006-4009 include red-orange or red elements. For example, the element may be molded of a clear polymer material, such as an acrylic, and can include a diffusing surface on the exterior side of the element. An advantage to using a clear element with red LEDs is that the brake lamp area will be clear when it is not illuminated by the LEDs and red when it is illuminated, thus providing a significant contrast between the illuminated and not illuminated states. A disadvantage to the clear element is that some observers expect the brake light to be red when it is not illuminated. Accordingly, the lens can be clear in the cargo lamp 3404, 3408 areas and red in the CHMSL 3406 area.

An optical assembly 4100 is illustrated in FIGS. 41 and 42 that can be used to produce downwardly directed cargo lamps from the LED lamps 4004, 4005, 4010, 4011 of FIG. 40, or the map lights 3012, 3014 of FIG. 30. The optical assembly 4100 is used with a high power LED lamp 4102. The optical assembly is described in U.S. patent application Ser. No. 09/109,527, although it is modified herein to accommodate the high power LED lamp including a heat extraction member. The LED lamp 4102 includes an emitter 4104 mounted on a top planar surface of heat extraction member 4106. The heat extraction member 4106 is mounted flat on circuit board 4110. The heat extraction member 4106 is juxtaposed with the heat sink layer 4112 on the substrate 4114 of the circuit board 4110. The emitter 4104 is covered by a transparent encapsulant 4108, which is preferably cylindrical to be accommodated within the TIR 4117, 4200. In particular, the optical assembly includes a collimator lens 4116, a TIR lens 4117 and a prism 4118. The collimator lens and TIR lens direct the light radiated from emitter 4104 forward, and the prism redirects the light at the desired angle. The exit surface 4130 of the optical assembly is preferably a diffuser. The emitter 4104 can be a phosphor LED chip which produces white light, an LED using red, green, and blue elements, or a binary complementary LED.

It will be recognized that the optical assembly 4100, including the prism 4118, will be used for map light 3014, whereas the prism is omitted for map lamp 3012. Additionally, the map lamps 3012, 3014 can each be implemented using a single LED lamp, such that only half of the optical assembly 4100 would be provided, or two or more LED lamps.

Figure 43:
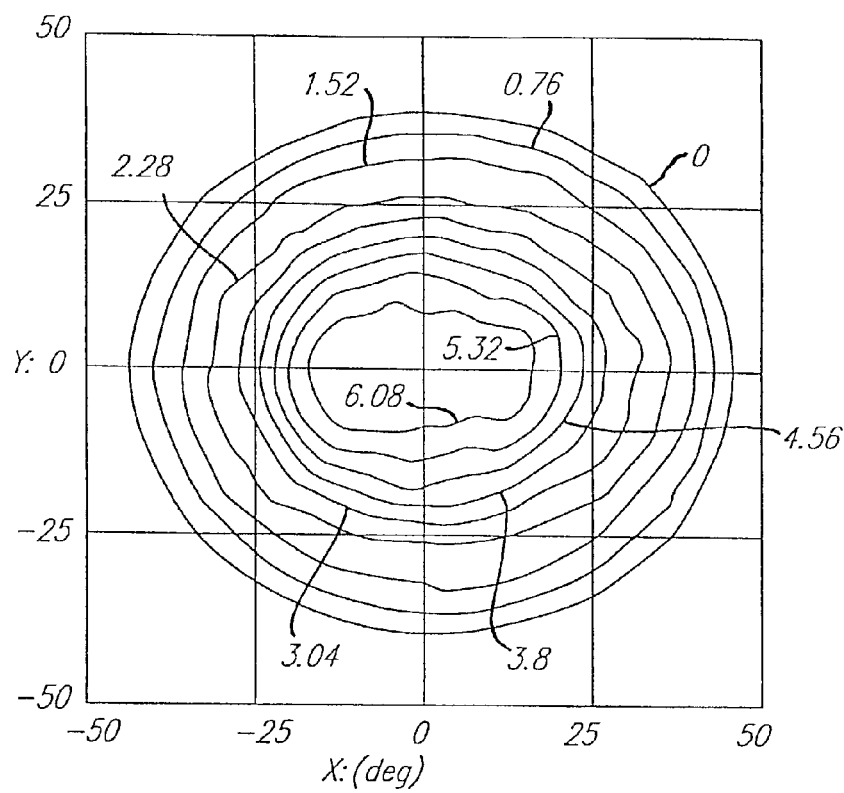
FIG. 43 is a rectangular iso-candela plot of a white light binary-complementary LED lamp including a heat extraction member.
Figure 44:
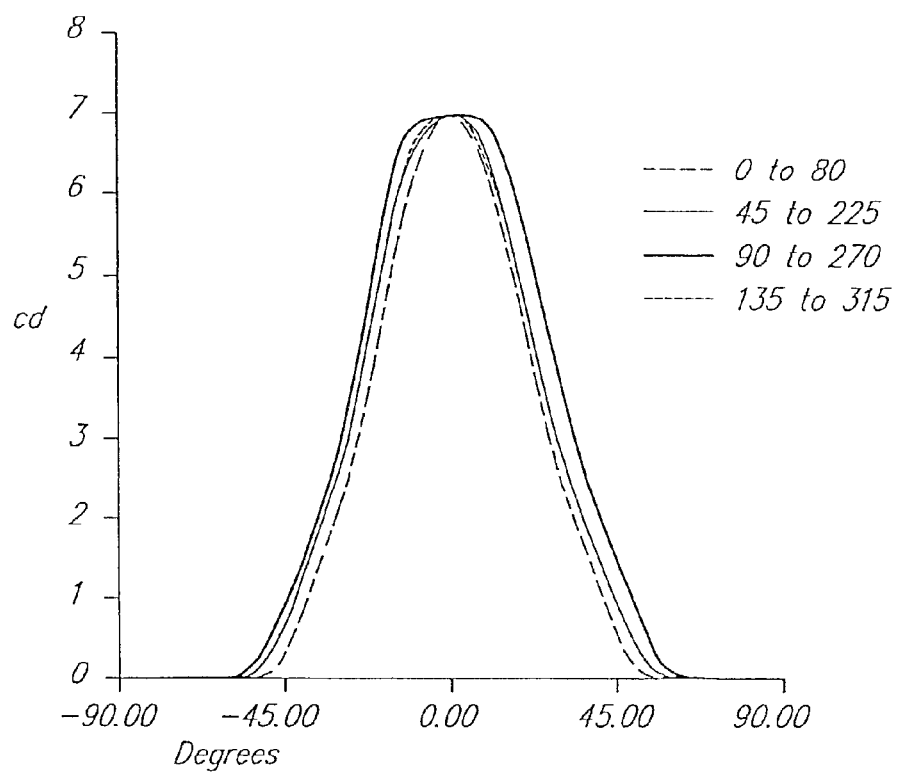
FIG. 44 is a rectangular candela distribution plot of the LED lamp according to FIG. 43.

The radiation pattern for a binary complementary white light lamp is disclosed in FIGS. 43 and 44. This LED lamp is according to the LED lamps in U.S. Pat. No. 6,335,548 incorporated herein by reference, and has a 4.25 mm lens radius. The LED lamp is mounted on a circuit board layer heat sink. It can be seen that two LED lamps so mounted produce the required illumination.

Figure 45:
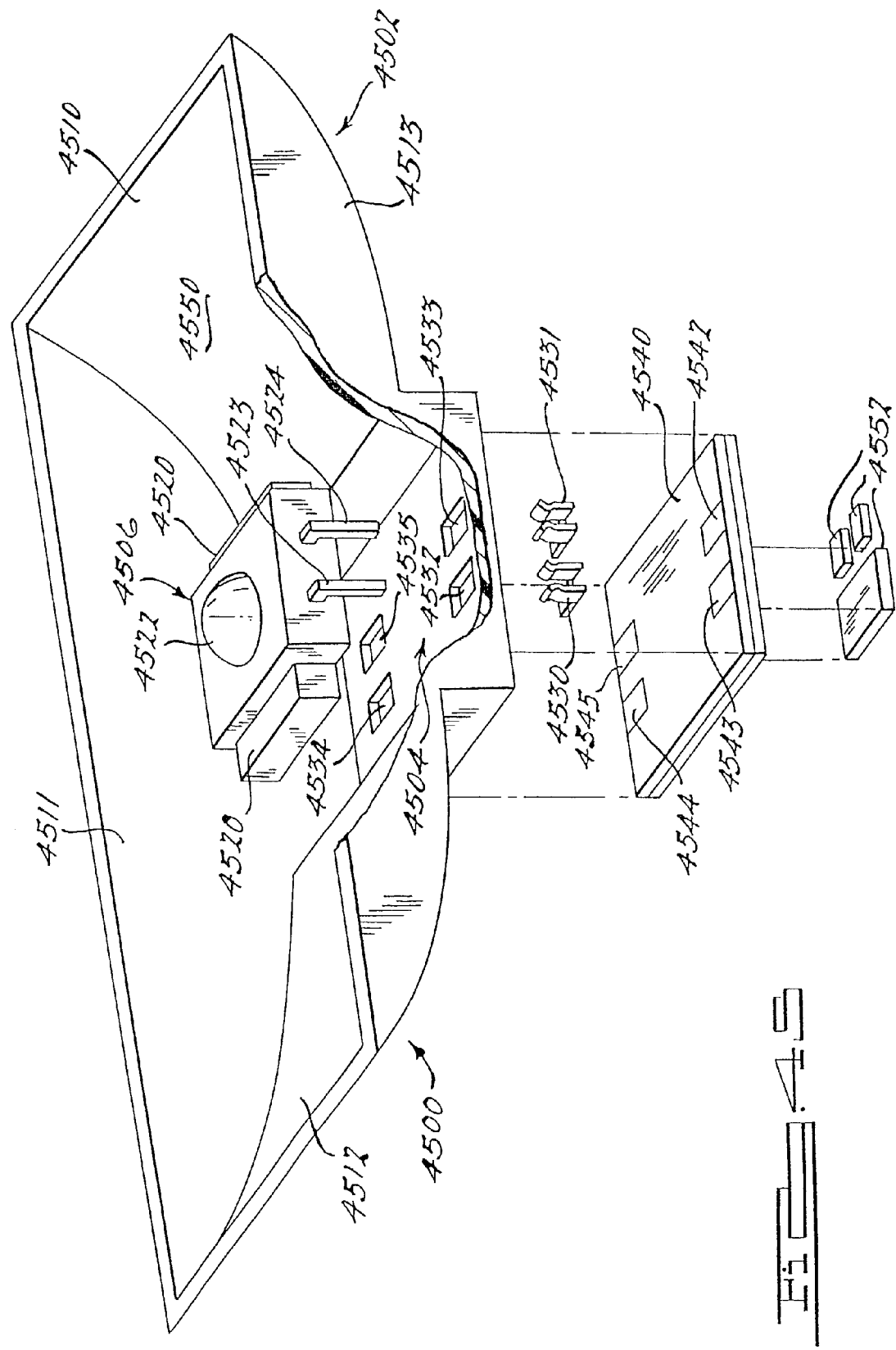
FIG. 45 is an exploded perspective view of a lamp assembly included an integral socket that can be used to implement the illuminators and indicator lamps in the vehicles according to FIGS. 33 and 34.

A lamp assembly 4500 that can be used to implement a dome light, a brake light, a turn signal, a license plate illuminator, or any other vehicle light module is disclosed in FIGS. 45-47. The lamp assembly includes a housing 4502 having an integral socket 4504 for receipt of a lamp 4506. The side walls 4510-4513 circumscribe the socket and extend upwardly to define a rectangular opening. The LED lamp 4506 may be implemented using any suitable high power LED, and is preferably implemented using a high power LED lamp having an integral heat extraction member, and may be implemented in accordance with U.S. Pat. No. 6,335,548. The LED lamp includes a heat extraction member 4520, an emitter 4602 (FIG. 46) carried on the heat extraction member, and an encapsulant 4522 covering the emitter. Electrical leads 4523, 4524 extend outwardly from the encapsulant and are bent downwardly for connection to contacts 4530, 4531. The socket 4504 includes openings 4532-4535 for each of the four leads on the LED lamp (only two of which are visible) and respective contacts (only two of which are shown) to pass through. The contacts 4530-4531 are mounted on a circuit board 4540, which may, for example, include contact pads 4542-4545 to which the contacts 4530, 4531 are connected. The circuit components 4552 are connected to the circuit board on a lower surface, and in particular can be surface mounted according to conventional techniques. When fully assembled, the contacts 4530, 4531 hold the LED lamp 4506 within the socket as shown in FIG. 47.

A reflective coating 4550 is applied to the inner surface of side walls 4510-4513. A diffusing lens 4604 is provided. The lens can be manufactured according to known, conventional techniques, and may be molded, for example, of a transparent acrylic.

Those skilled in the art will recognize that the shape of the housing 4502 can be altered to provide the appropriate size for the application. Additionally, for an application such as a license plate, the reflector and lens can be small and shaped to have low profile. License plate illuminators are shaped so as to direct light onto the plate while blocking light from being directly radiated outwardly from the back of the vehicle. It will be further recognized that the lamp may be assembled to include more than one socket, or the socket can have room to receive more than one lamp. In either manner, more than one lamp can be accommodated within the housing whereby more light may be produced.

A step down circuit is disclosed in FIG. 48. The step down circuit provides a regulated current to the LED lamps of the CHMSL, puddle lamp, map light, license plate illuminator, back-up light, turn signal lamp, brake lamp, or any other lamp in the vehicle. The circuit is described in U.S. patent application Ser. No. 09/426,794 entitled "POWER SUPPLY FOR ELECTROCHROMIC MIRRORS IN HIGH VOLTAGE AUTOMOTIVE POWER SYSTEMS" and filed on Oct. 22, 1999, by Robert R. Turnbull, now U.S. Pat. No. 6,262,831, the disclosure of which is incorporated by reference herein. The circuit 4800 preferably only differs from the circuit of the other application by the inclusion of shunt transistors Q5 and Q6, and the value of capacitor C5. In particular, the transistors Q5 and Q6 are connected in parallel with respective emitters D7 and D8. These emitters can be, for example, binary complementary LED chips selected to produce white light. Alternatively, they could be selected to provide other colors, or they can be two chips that produce the same color. The controller generates control signals input to shunt transistors Q5 and Q6 to dynamically adjust the output thereof. By selecting a small enough capacitor value for the output capacitor C5, the shunt transistors can be used to turn the LED lamp 218' OFF. Additionally, the shunt transistors Q5 and Q6 can be used to adjust the current in each of the emitters, by diverting current in a parallel bypass path through the transistors. Additionally, one or both of the transistors Q5 and Q6 can be turned OFF such that the full current flows through the respective LED emitter connected in parallel therewith. The controller can thus control the current through the transistor switches and the LED lamps. This is advantageous where it may be desirable to flash the LEDs responsive to a control signal generated by controller 304 in FIG. 3, instead of the vehicle turn signal control, in an application such as a signal mirror turn signal repeater. Additionally, the light output of the LED lamp used for an illuminator may be controlled to a desired intensity, either responsive to a manual control by a user or an "opera" effect wherein the lights automatically gradually fade out when the lights are turned off. Another application where the independent LED emitter control is desirable is where it is necessary to change the color of the LED lamp. Where two or more different colored LED chips are used in a single LED lamp, the current input to each of the LED lamps can be independently varied to change the color emitted by the LED lamp. In these and other applications, the independent current control can be provided for a series connected emitter.

Although the circuit 4800 disclosed is for series connected emitters, those skilled in the art will recognize that the circuit can be modified to accommodate common cathode LED lamps as well. For common cathode emitters, the transistors Q5 and Q6 would be connected in series with the respective emitters as opposed to the parallel connection shown.

While the invention has been described in detail herein in accordance with certain embodiments thereof, many modifications and changes may be effected by those skilled in the art without departing from the spirit of the invention. For example, the high power LED lamp including a heat extraction member can be employed in mirror structures such as U.S. Pat. Nos. 5,497,306; 5,361,190; and 5,788,357, the disclosures of which are incorporated herein by reference, to significantly improve the performance thereof. Accordingly, it is our intent to be limited only by the scope of the appending claims and not by way of details and instrumentalities describing the embodiments shown herein.

The invention claimed is:

1. A mirror assembly, comprising:
   a mirror including a reflective surface; and
   a lamp positioned adjacent the mirror, said lamp including an emitter and a lens, the lens having a peak intensity optical axis offset from the center of the emitter whereby light produced by the emitter is emitted from the lens at an angle that is a function of the offset.

2. A signal mirror, comprising:
a transparent housing defining an interior volume;
at least one lamp carried within the interior volume of the housing to project light through the transparent housing; and
a mirror positioned within the housing.

3. The signal mirror as defined in claim 2, further including a coating applied to at least a portion of the interior surface of the transparent housing, the at least one lamp positioned adjacent a region of the interior surface which is transparent after the coating is applied.

4. The signal mirror as defined in claim 2, wherein the coating is opaque, and wherein regions of the interior surface are not coated.

5. The signal mirror as defined in claim 2, wherein the transparent housing comprises an integral lens in a region adjacent to the lamp such that the lamp emits light through the lens.

6. The signal mirror as defined in claim 5, wherein the lens comprises an element selected from the group consisting of a TIR and a prism.

7. The signal mirror as defined in claim 2, wherein the at least one lamp is configured as either a turn signal, a puddle light or a keyhole illuminator.

8. The signal mirror as defined in claim 2, comprising a first and second lamp, wherein said first lamp is configured to be a turn signal and said second lamp is configured to be either a puddle light or a keyhole illuminator.

9. The signal mirror as defined in claim 2, comprising a first lamp configured to be a turn signal, a second lamp configured to be a puddle light and third lamp configured to be a keyhole illuminator.

10. A vehicle lamp assembly, comprising:
a housing; and
at least one LED lamp carried in the housing, the at least one LED lamp comprising at least one LED chip in thermal communication with a heat extraction member, wherein said heat extraction member comprises a lower thermal resistance than a thermal resistance of LED lamp electrical connections, wherein said at least one LED lamp is capable of operating continuously at greater than approximately 100 mW.

11. A vehicle lamp assembly as defined in claim 10, wherein the LED lamp is a high power lamp.

12. A vehicle lamp assembly as defined in claim 10, wherein the housing is configured as a housing for either a CHMSL, a dome light, a turn signal, a puddle light, a keyhole illuminator, a license plate illuminator, a brake light, a backup light, or a door handle illuminator.

13. A vehicle lamp assembly as defined in claim 10, wherein said at least one LED lamp is mounted in a circuit board.

14. A vehicle lamp assembly as defined in claim 10, wherein said housing is configured to be mounted to a vehicle.

15. A vehicle lamp assembly as defined in claim 14, wherein said housing is configured as either a housing for a puddle light, a keyhole illuminator or a turn signal.

16. A vehicle lamp assembly as defined in claim 15, wherein said at least one LED lamp is mounted in a circuit board.

17. A vehicle lamp assembly as defined in claim 15, further comprising a lens positioned proximate said at least one LED lamp.

18. A vehicle lamp assembly as defined in claim 14, wherein said housing is configured as a housing for a turn signal light and either a puddle light or a keyhole illuminator.

19. A vehicle lamp assembly as defined in claim 18, wherein said at least one LED lamp is mounted in a circuit board.

20. A vehicle lamp assembly as defined in claim 14, wherein said housing is configured as a housing for a turn signal light, a puddle light and a keyhole illuminator.

21. A vehicle lamp assembly as defined in claim 20, further comprising a vehicle mount, wherein said turn signal light, puddle light and keyhole illuminator are positioned on the bottom of said housing and said turn signal light is positioned farthest away from said mount, said keyhole illuminator is positioned closest to said mount and said puddle light is positioned between said turn signal light and said keyhole illuminator.

22. A vehicle lamp assembly as defined in claim 10, wherein the housing includes a first housing portion and a second housing portion, and wherein at least one first LED lamp having a heat extraction member is carried in the first housing portion and at least one second LED lamp having a heat extraction member is positioned in the second housing portion.

23. A vehicle lamp assembly as defined in claim 22, wherein the at least one first LED lamp produces red light and the at least one second LED produces white light.

24. A vehicle lamp assembly as defined in claim 23, wherein the at least one second LED lamp comprises a phosphor white LED chip.

25. A vehicle lamp assembly as defined in claim 10, wherein said at least one LED lamp comprises binary complementary emitters.

26. A vehicle lamp assembly as defined in claim 10, further comprising a reflector positioned in the housing, the LED lamp is positioned behind the reflector.

27. A vehicle lamp assembly as defined in claim 10, further comprising a thermally conductive coating on an inside surface of said housing, said heat extraction member is thermally coupled to said thermally conductive coating.

28. A vehicle lamp assembly as defined in claim 27, further comprising a lens associated with said at least one LED lamp.

29. A vehicle lamp assembly as defined in claim 28, wherein the lens is either a diffractive lens, a refractive lens, a fresnel lens, or a pillow lens.

30. A vehicle lamp assembly as defined in claim 10, further comprising a TIR surface positioned adjacent said at least one LED lamp.

31. A vehicle lamp assembly as defined in claim 10, further comprising a diffuser.

32. A vehicle lamp assembly as defined in claim 28, wherein said lens is a spectral filter.

33. A vehicle lamp assembly as defined in claim 28, wherein the lens is red.

34. A vehicle lamp assembly as defined in claim 10, further comprising a heat sink in the housing, said heat extraction member is positioned on said heat sink.

35. A vehicle lamp assembly as defined in claim 34, wherein said heat sink is either passive, discrete, active or integral with the housing.

36. A vehicle lamp assembly as defined in claim 35, wherein said heat sink is active and is either Peltier cooler or a phase change heat sink.

37. A vehicle lamp assembly as defined in claim 10, wherein said at least one LED lamp is mounted in a receptacle.

38. A vehicle lamp assembly as defined in claim 37, wherein said receptacle is attached to a cable.

39. A vehicle lamp assembly as defined in claim 37, wherein said receptacle is integral with the housing.

40. A vehicle lamp assembly as defined in claim 10, wherein said at least one LED lamp is mounted in a circuit board.

41. A vehicle lamp assembly as defined in claim 10, wherein said at least one LED lamp is soldered in a printed circuit board.

42. A vehicle lamp assembly as defined in claim 37, wherein said receptacle is mounted on a circuit board.

43. A vehicle lamp assembly as defined in claim 37, wherein said receptacle is soldered on a circuit board.

44. A vehicle lamp assembly as defined in claim 10, wherein said at least one LED lamp is capable of producing light having a luminous intensity of 12 candelas from a single LED lamp.

45. A signal mirror, comprising:
 a mirror;
 at least one first high power LED lamp, at least one second high power LED lamp and at least one third high power LED lamp;
 each high power LED lamp including a heat extraction member, at least one emitter carried on the heat extraction member, and two or more electrical leads having a thermal resistance higher than the heat extraction member electrically coupled to the emitter, and wherein each LED lamp is positioned adjacent the mirror to produce visible light; and
 said at least one first high power LED lamp being configured as a turn signal, said at least one second high power LED lamp being configured as a puddle light and said at least one third high power LED lamp being configured as a keyhole illuminator.

46. A signal mirror as defined in claim 45, further comprising a housing with a vehicle mount, wherein said turn signal light is positioned farthest away from said mount, said keyhole illuminator is positioned closest to said mount and said puddle light is positioned between said turn signal light and said keyhole illuminator.

47. A signal mirror as defined in claim 45, wherein each high power LED is capable of producing light having a luminous intensity of 12 candelas from a single LED lamp.

48. A signal mirror as defined in claim 45, wherein each high power LED lamp is positioned behind the mirror to project light through a reflective surface of said mirror.

49. A signal mirror as defined in claim 45, wherein each high power LED lamp is capable of operating continuously at greater than approximately 100 mW.

50. An apparatus, comprising:
 at least one lamp comprising a heat extraction member, said heat extraction member comprising a lower thermal resistance than lamp electrical connections; and
 a mounting plate in contact with said heat extraction member, wherein said
 mounting plate is a passive heat sink.

51. An apparatus as in claim 50, wherein said heat extraction member is in thermal communication with said mounting plate.

52. An apparatus as in claim 50, further comprising a rearview mirror housing.

53. An apparatus as in claim 50, wherein said lamp is an LED.

\* \* \* \* \*